United States Patent
Onishi et al.

(10) Patent No.: US 6,935,232 B2
(45) Date of Patent: Aug. 30, 2005

(54) SOLDER PASTE PRINTING APPARATUS AND PRINTING METHOD

(75) Inventors: Hiroaki Onishi, Yamanashi (JP); Toshinori Mimura, Sakai (JP); Naoichi Chikahisa, Kofu (JP); Ken Takahashi, Yamanashi (JP); Toshiyuki Murakami, Yamanashi (JP); Hitoshi Nakahira, Yamanashi (JP); Sadayuki Nagashima, Kofu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 146 days.

(21) Appl. No.: 10/641,082

(22) Filed: Aug. 15, 2003

(65) Prior Publication Data

US 2004/0108368 A1 Jun. 10, 2004

Related U.S. Application Data

(62) Division of application No. 10/031,852, filed as application No. PCT/JP00/04937 on Jul. 25, 2000.

(30) Foreign Application Priority Data

| Jul. 26, 1999 | (JP) | 11-211330 |
| Sep. 6, 1999 | (JP) | 11-252148 |
| Nov. 5, 1999 | (JP) | 11-315384 |
| Dec. 7, 1999 | (JP) | 11-347714 |
| Jul. 21, 2000 | (JP) | 2000-220873 |

(51) Int. Cl.$^7$ .......................... B05C 17/06; B05C 17/08; B41L 13/00; B41M 1/12
(52) U.S. Cl. ....................... 101/126; 101/129
(58) Field of Search ............... 101/126, 129, 101/123, 485, DIG. 36, 486; 33/614, 619, 620, 621; 228/248.1, 22, 41

(56) References Cited

U.S. PATENT DOCUMENTS

| 3,620,230 | A | | 11/1971 | Foret | |
| 4,887,623 | A | | 12/1989 | Sugiyama et al. | |
| 5,197,384 | A | | 3/1993 | Yawata et al. | |
| 5,485,781 | A | | 1/1996 | Rovaris | |
| 5,623,872 | A | * | 4/1997 | Tomomatsu | 101/126 |
| 5,730,051 | A | * | 3/1998 | Takahashi et al. | 101/126 |
| 5,976,269 | A | | 11/1999 | Hamasaki et al. | |
| 5,988,060 | A | * | 11/1999 | Asai et al. | 101/123 |
| 6,036,787 | A | | 3/2000 | Bennett et al. | |
| 6,131,511 | A | * | 10/2000 | Wachi et al. | 101/129 |
| 6,237,490 | B1 | * | 5/2001 | Takahashi et al. | 101/129 |
| 6,568,321 | B2 | * | 5/2003 | Sakamoto | 101/126 |
| 6,626,106 | B2 | | 9/2003 | Peckham et al. | |
| 6,634,290 | B1 | * | 10/2003 | Shimizu et al. | 101/129 |

FOREIGN PATENT DOCUMENTS

| EP | 0 838 979 | 4/1998 |
| JP | 7-237290 | 9/1995 |
| JP | 7-329276 | 12/1995 |
| JP | 10-24551 | 1/1998 |
| JP | 10-44370 | 2/1998 |
| JP | 10-193577 | 7/1998 |
| JP | 2850150 | 11/1998 |
| JP | 11-320823 | 11/1999 |

* cited by examiner

Primary Examiner—Ren Yan
Assistant Examiner—Leo T. Hinze
(74) Attorney, Agent, or Firm—Wenderoth, Lind & Ponack, L.L.P.

(57) ABSTRACT

When solder paste passes through a first gap located between a pressurizing member and a printing mask during solder paste printing, a pressure directed toward the printing mask is applied from the pressurizing member to the solder paste.

9 Claims, 71 Drawing Sheets

Fig. 30

| ITEM | MATERIAL | VISCOSITY(Pa·s) MANUFACTURER INSPECTION CERTIFICATE | SOLDER SCRAPING STATE ON MASK / SOLDER ROLLING STATE / FILLING (PRINT) STATE — PRINTING SPEED V (mm/sec) | | | | | | |
|---|---|---|---|---|---|---|---|---|---|
| | | | 40 | 100 | 150 | 200 | 250 | 300 | |
| MOST SHIPPED PRODUCT | A | 178 | ○○○ | ○○○ | ○○○ | ○○○ | ○○○△ | ○○○△ | |
| FINE-PITCH-READY | B | 256 | ○○○ | ○○○ | ○○○ | ○○△ | ○○△× | ○△× | |
| HIGH-SPEED PRINTING | C | 292 | ○○○ | ○○△ | ○○× | ○○× | ○○× | ○○× | |
| HIGH-SPEED PRINTING | D | 290 | ○○○ | ○○△ | ○○△ | ○○× | ○○× | ○○× | |
| LEAD FREE | E | 200 | ○○○ | ○○○ | ○○○ | ○○△ | ○○△ | ○○△ | |
| MOST SHIPPED PRODUCT FINE-PITCH-READY | F | 215 | ○○○ | ○○○ | ○○○ | ○○○ | ○○○ | ○○△ | |
| FINE-PITCH-READY | G | 212 | ○○○ | ○○△× | ○○△× | ○×× | ○×× | ○×× | |
| HIGH-SPEED PRINTING | H | 161 | ○○○ | ○○○ | ○○○ | ○○△ | ○○△ | ○○△ | |
| LEAD FREE | I | 221 | ○○○ | ○○○ | ○○○ | ○○△ | ○△× | ○△× | |

Fig.31

| ITEM | MATERIAL | VISCOSITY/Pa·s MANUFACTURER INSPECTION CERTIFICATE | SOLDER SCRAPING STATE ON MASK | | SOLDER ROLLING STATE | | | FILLING (PRINT) STATE | |
|---|---|---|---|---|---|---|---|---|---|
| | | | \multicolumn{7}{c}{PRINTING SPEED V (mm/sec)} |
| | | | 40 | 100 | 150 | 200 | 250 | 300 |
| MOST SHIPPED PRODUCT | A | 178 | ○○○ | ○○○ | ○○○ | ○○○ | ○○○ | ○○○ |
| FINE-PITCH-READY | B | 256 | ○○○ | ○○○ | ○○○ | ○○○ | ○○○ | △△△ |
| HIGH-SPEED PRINTING | C | 292 | ○○○ | ○○○ | ○○○ | ○○○ | ○△× | ×× |
| HIGH-SPEED PRINTING | D | 290 | ○○○ | ○○○ | ○○○ | ○○○ | ×○× | ×○× |
| LEAD FREE | E | 200 | ○○○ | ○○○ | ○○○ | ○△○ | ○○○ | ○○○ |
| MOST SHIPPED PRODUCT FINE-PITCH-READY | F | 215 | ○○○ | ○○○ | ○○○ | ○○○ | ○○○ | ○○○ |
| FINE-PITCH-READY | G | 212 | ○○○ | ○○○ | ○○○ | ○△○ | ○△○ | ×× |
| HIGH-SPEED PRINTING | H | 161 | ○○○ | ○○○ | ○○○ | ○○○ | ○○○ | ○○○ |
| LEAD FREE | I | 221 | ○○○ | ○○○ | ○○○ | ○○○ | ○○○ | △△ |

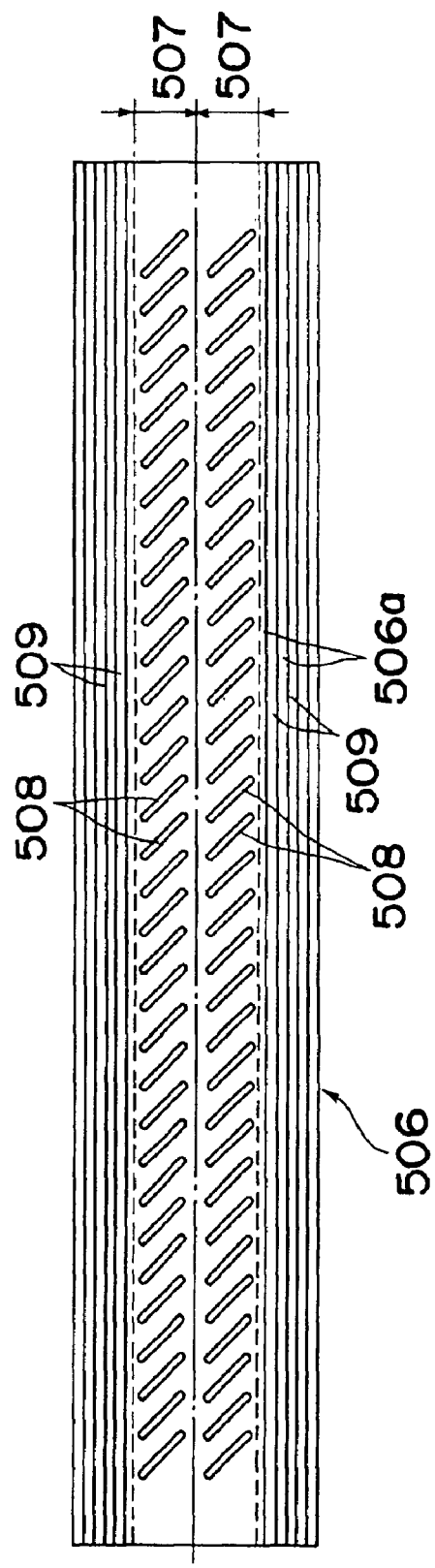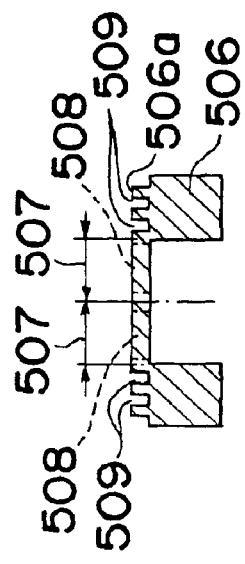

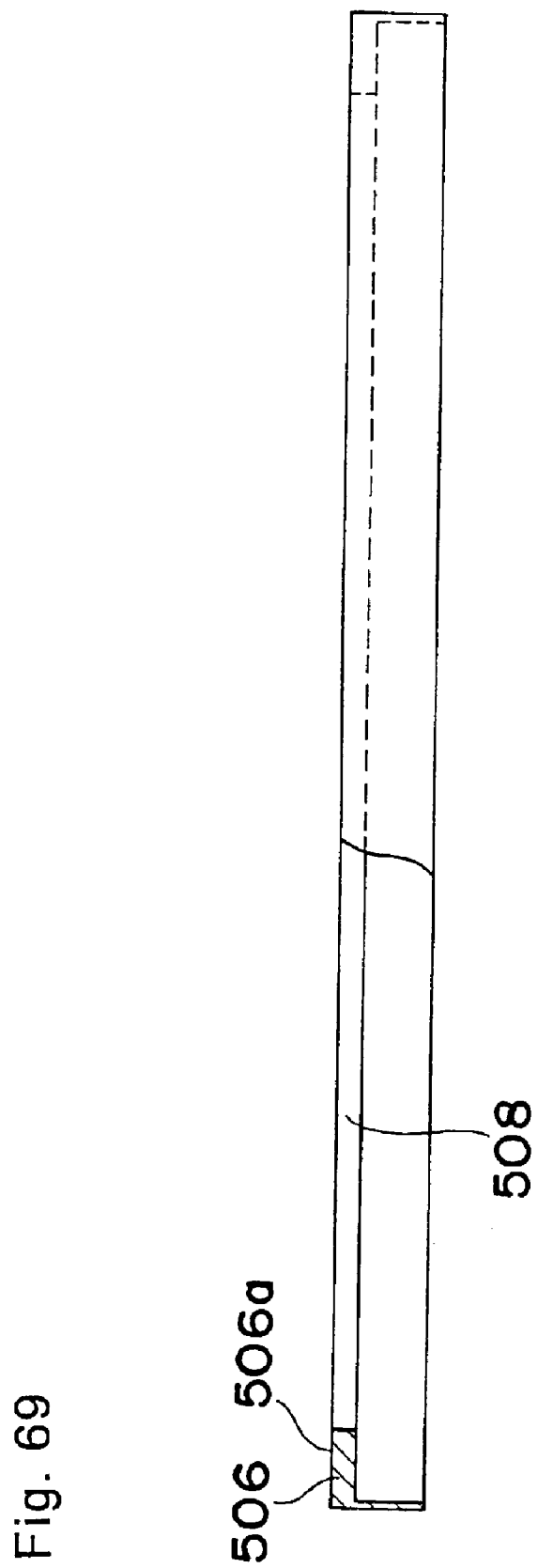

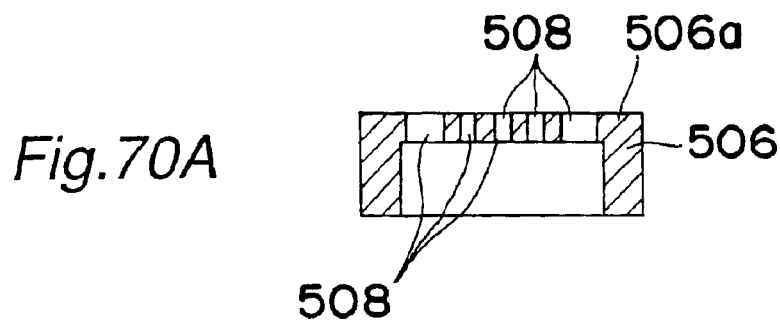
Fig.70A
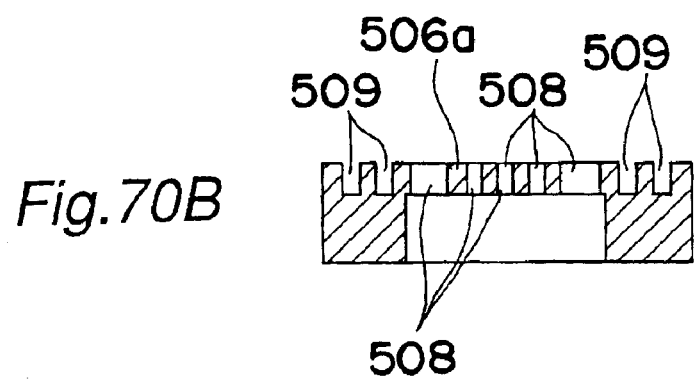
Fig.70B
Fig.71
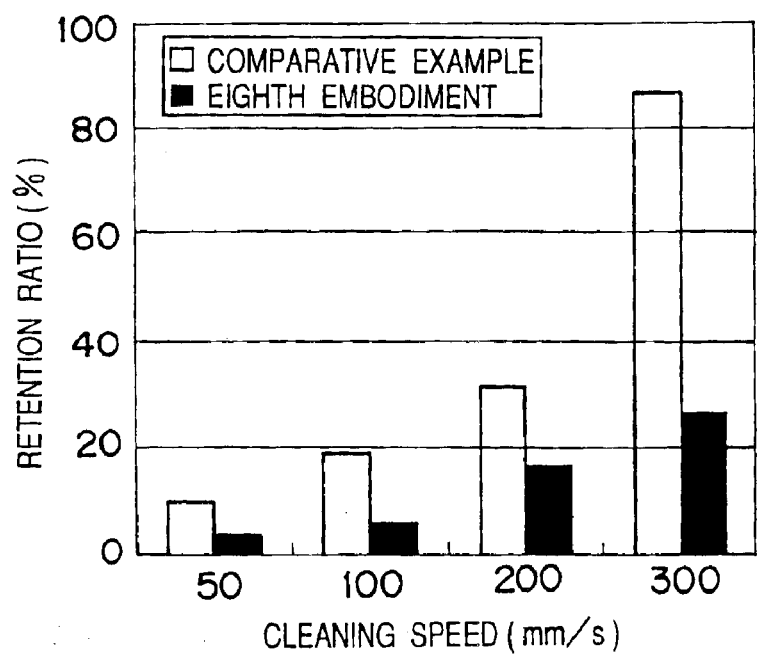

SOLDER PASTE PRINTING APPARATUS AND PRINTING METHOD

This is a Divisional Application of U.S. application Ser. No. 10/031,852, filed Jan. 24, 2002, which is the National Stage of International Application No. PCT/JP00/04937, filed Jul. 25, 2000.

TECHNICAL FIELD

The present invention relates to a solder paste printing apparatus and printing method for printing a solder paste on a surface of a circuit-forming body, for example, a circuit board, which is an object to be printed.

BACKGROUND ART

Conventionally, a solder paste has mainly been used when soldering an electronic component such as a chip component on a printed board in manufacturing an electronic circuit board, and a solder paste printing apparatus is used for printing this solder paste in the desired pattern. As one example of the squeegee head mounted on a conventional solder paste printing apparatus, a construction as shown in FIG. 13 can be enumerated.

Normally, during a printing operation, a squeegee head 102 reciprocates from the left to the right and from the right to the left in FIG. 13 every printed board 5. In this case, a rightward direction printing squeegee 101a is used for the rightward direction printing from the left to the right, and a leftward direction printing squeegee 101b is used for the opposite leftward direction printing.

The solder paste printing operation on the printed board 5 by the conventional solder paste printing apparatus 100 will be described with reference to FIG. 13 through FIG. 15.

In FIG. 13 through FIG. 15, reference numeral 3 denotes a printing mask through which openings 4 of the desired pattern are formed, 5 a printed board, 6 a land on which a solder paste 7 is to be printed, and 8 a solder resist. The desired pattern of the printing mask 3 means a pattern on which the openings 4 are formed in correspondence with the lands 6 on the printed board 5.

First of all, when performing the rightward direction printing, the printed board 5 is positioned when the printing mask 3 in layers so that the openings 4 and the lands 6 are aligned in position with each other, and thereafter, the rightward direction printing squeegee 101a is moved down in a state in which the leftward direction printing squeegee 101b is moved up, then bringing a squeegee edge portion 103 in contact with a surface 3a of the printing mask 3 with an appropriate pressure applied.

In this state, by linearly moving the rightward direction printing squeegee 101a in the rightward direction, the solder paste 7 preparatorily provided on the surface 3a of the printing mask 3 is gradually filled into the openings 4 of the printing mask 3. The printing operation is ended by moving the rightward direction printing squeegee 110a to the right end of the printing mask 3 and thereafter separating the printed board 5 from the printing mask 3.

When performing the leftward direction printing, similarly to the rightward direction printing, the printed board 5 is positioned under the printing mask 3 in layers, and thereafter, the leftward direction printing squeegee 101b is moved down with the rightward direction printing squeegee 101a oppositely moved up this time, then bringing the squeegee edge portion 103 in contact. The subsequent operation is similar to that of the rightward direction printing described hereinabove.

Thus, by alternately repeating these operations every printed board 5, the solder paste 7 is continuously printed on the lands 6 of each printed board 5 via the printing mask 3 as shown in FIG. 16.

According to the printing using the conventional solder paste printing apparatus 100, the printing squeegee 110a or the printing squeegee 101b is moved in the state in which the squeegee edge portion 103 of the printing squeegee 101a or the printing squeegee 101b is brought in contact with the surface 3a of the printing mask 3 with the appropriate pressure applied. As is apparent from the above, the conventional printing squeegees 101a and 101b perform the two operations of a scraping operation for scraping the solder paste 7 off the surface 3a of the printing mask 3 and a filling operation for filling the solder paste 7 into the openings 4 of the printing mask 3 by the squeegees of one type. This will be described with reference to FIG. 14 and FIG. 15.

FIG. 14 and FIG. 15 are enlarged views of a printing squeegee 110a and others for the rightward direction printing. First, as shown in FIG. 14, if the rightward direction printing squeegee 101a is moved down and linearly moved in the rightward direction so that the edge portion 103 comes in contact with the surface 3a of the printing mask 3, then the rightward direction printing squeegee 101a reaches the solder paste 7 supplied to the surface 3a of the printing mask 3 and moves while scraping off the paste.

By this scraping operation, the solder paste 7 flows with a rotational motion called the rolling as indicated by arrow I in FIG. 15. At this time, a fluid pressure is generated inside the solder paste 7.

When the rightward direction printing squeegee 111a moves further to the right in the above-mentioned state and reaches the openings 4 of the printing mask 3, the solder paste 7 is pushed into the openings 4 by the above-mentioned fluid pressure, and the so-called filling of the solder paste 7 is achieved. Hereinafter, the pressure by which the solder paste 7 is pushed into the openings 4 will be referred to as a filling pressure.

On the other hand, from the point of view of an improvement in productivity, it is desired to reduce the printing time even in the solder paste printing process. However, if the travel speed (squeegee speed) of the squeegee 101a is increased in the conventional solder paste printing apparatus 100 for the reduction of the above-mentioned time, the so-called unfilled portion 9, where the amount of the solder paste 7 filled into the openings 4 of the printing mask 3 becomes insufficient, is generated as shown in FIG. 17, causing defective printing. As shown in FIG. 18, there occurs lacks of the solder paste 7 printed on the lands 6 of the printed board 5, and stable printing cannot be performed. The reasons are as follows.

If the squeegee speed is increased, then the time during which the edge portion 103 of the printing squeegee 101a passes over the openings 4 becomes reduced. Therefore, the time during which the solder paste 7 is filled into the openings 4 (hereinafter, referred to as a filling time) is, of course, reduced.

In order to examine this phenomenon, as shown in FIG. 17, there was measured the filling pressure when a pressure sensor 51 was arranged on the back surface of the printing mask 3 provided with an opening 4a located in the corresponding portion of the mask and the squeegee 101a was moved at a travel speed of 40 mm/sec and 200 mm/sec. FIG. 19 is a graph showing the measurement results.

The time t along the horizontal axis is the time during which the squeegee 101a passes over the pressure sensor 51, and the filling pressure P is the pressure that the pressure sensor 51 has detected via the solder paste 7 when the squeegee 101a passes over the pressure sensor 51.

By this graph, it is clearly understood that the filling time is reduced when the travel speed of the squeegee 101a is increased.

Moreover, although the filling pressure increases itself when the squeegee speed is increased, the time during which the edge portion 103 of the squeegee passes over the openings 4 is reduced, and further the duration of the high pressure is short. Therefore, a sufficient filling time cannot be obtained. As a result, the unfilled portion 9 is disadvantageously generated.

As described above, the conventional solder paste printing apparatus has not been able to achieve both of an increase in the printing speed and stable printing.

The object of the present invention is to solve the aforementioned conventional issues and provide a solder paste printing apparatus and printing method capable of performing stable printing even when the printing time is reduced for an increase in speed and consequently achieving high-quality solder paste printing with high productivity.

DISCLOSURE OF INVENTION

In order to achieve the aforementioned object, the present invention is constructed as follows.

According to a first aspect of the present invention, there is provided a solder paste printing apparatus for printing a solder paste supplied onto a surface of a printing mask where an opening is formed by moving a squeegee on the surface in a printing direction on a circuit-forming body placed on a back surface of the printing mask via the opening, the device comprising:

an elongated pressurizing member that has an axial direction extended roughly parallel to an axial direction of the squeegee and is able to form between the pressurizing member and the printing mask a first gap through which the solder paste can pass in a direction opposite to the printing direction of the squeegee during solder paste printing and is arranged so as to form between the pressurizing member and the squeegee a second gap through which the solder paste can pass from the first gap toward the squeegee side, the pressurizing member being provided in a vicinity of an edge of the squeegee, whereby a pressure toward the printing mask is applied to the solder paste by the pressurizing member when the solder paste passes through the first gap located between the pressurizing member and the printing mask during the solder paste printing.

According to a second aspect of the present invention, there is provided a solder paste printing apparatus as defined in the first aspect, wherein the pressurizing member is movably mounted with respect to the squeegee between a pressurizing position where the pressure is applied to the solder paste and a retreated position where the applying of the pressure is released, provided with an axial direction extended roughly parallel to the axial direction of the squeegee in the pressurizing position, is able to form the first gap through which the solder paste can pass in the direction opposite to the printing direction of the squeegee during the solder paste printing, and is arranged so that the second gap through which the solder paste can pass from the first gap toward the squeegee side is arranged between the pressurizing member and the squeegee.

According to a third aspect of the present invention, there is provided a solder paste printing apparatus as defined in the first aspect, wherein the pressurizing member is a round bar.

According to a fourth aspect of the present invention, there is provided a solder paste printing apparatus as defined in the first aspect, wherein the pressurizing member has a built-in heat-generating element for heating the solder paste.

According to a fifth aspect of the present invention, there is provided a solder paste printing apparatus as defined in the first aspect, wherein a pair of squeegees are provided, and at least one of the pair of squeegees is consistently brought in contact with the printing mask at least during printing.

According to a sixth aspect of the present invention, there is provided a solder paste printing apparatus as defined in any one of the first through fifth aspects, wherein the first gap has a roughly wedge-shaped cross-section shape that is narrowed toward the squeegee.

According to a seventh aspect of the present invention, there is provided a solder paste printing apparatus as defined in any one of the first through fifth aspects, wherein the pressurizing member has a height from the surface of the printing mask, the height being lower than a rolling height of the solder paste during printing, and the pressurizing member sinks in the rolling solder paste during the printing.

According to an eighth aspect of the present invention, there is provided a solder paste printing apparatus as defined in any one of the first through fifth aspects, wherein the pressurizing member is fixed so as to be unable to rotate.

According to a ninth aspect of the present invention, there is provided a solder paste printing apparatus as defined in any one of the first through fifth aspects, wherein a cross-section shape perpendicular to the axial direction of the pressurizing member is varied in the axial direction of the pressurizing member according to a number and a size of the openings of the printing mask, thus varying the pressure to be applied from the pressurizing member to the solder paste against the printing mask.

According to a tenth aspect of the present invention, there is provided a solder paste printing apparatus as defined in any one of the first through fifth aspects, wherein the pressurizing member is rotated in a direction reverse to a rolling direction of the solder paste around the pressurizing member during printing.

According to an 11th aspect of the present invention, there is provided a solder paste printing method for printing a solder paste located on a surface of a printing mask where an opening is formed by moving a squeegee on the surface in a printing direction on a circuit-forming body placed on a back surface of the printing mask via the opening, the method comprising:

applying a pressure toward the printing mask from the pressurizing member to the solder paste by making the solder paste pass in a direction opposite to the printing direction of the squeegee through a first gap formed between the printing mask and the pressurizing member during solder paste printing in a state in which an elongated pressurizing member provided in a vicinity of an edge of the squeegee is positioned in a pressurizing position where a pressure is applied to the solder paste from a retreated position where no pressure is applied thereto; and making the solder paste pass again through the first gap located between the pressurizing member and the printing mask after the solder paste that is passing from the first gap toward the squeegee side passes through a second gap located between the squeegee and the pressurizing member.

According to another aspect of the present invention, there is provided a solder paste printing method of the 11th aspect, wherein the pressurizing member is a round bar.

According to another aspect of the present invention, there is provided a solder paste printing method of the 11th aspect, wherein the pressurizing member has a built-in heat-generating element for heating the solder paste.

According to another aspect of the present invention, there is provided a solder paste printing method of the 11th aspect, wherein, when a pair of squeegees are provided, at least one squeegee of the pair of squeegees is consistently put in contact with the printing mask at least during printing.

According to another aspect of the present invention, there is provided a solder paste printing method of the 11th aspect, wherein the first gap has a wedge-like cross-section shape that narrows as the gap approaches the squeegee.

According to a 12th aspect of the present invention, there is provided a solder paste printing method as defined in the 11th aspect, wherein an interval of the first gap is smaller than a rolling height of the solder paste during printing, and the pressurizing member sinks in the rolling solder paste during printing.

According to a 13th aspect of the present invention, there is provided a solder paste printing method as defined in the 11th aspect, wherein the pressurizing member is fixed so as to be unable to rotate.

According to a 14th aspect of the present invention, there is provided a solder paste printing method as defined in the 11th aspect, wherein a cross-section shape perpendicular to the axial direction of the pressurizing member is varied in the axial direction of the pressurizing member according to a number and a size of the openings of the printing mask, thus varying the pressure to be applied from the pressurizing member to the solder paste against the printing mask.

According to a 15th aspect of the present invention, there is provided a solder paste printing method as defined in the 11th aspect, wherein the pressurizing member, is rotated in a direction reverse to a rolling direction of the solder paste around the pressurizing member during printing.

According to a 16th aspect of the present invention, there is provided a solder paste printing apparatus as defined in the first aspect, further comprising:

a pressure sensor that is provided within a range of printing on the back surface of the printing mask, which is a range in which the squeegee moves and detects a pressure of the solder paste applied via a pressure detection opening formed on the printing mask; and a control means for controlling driving conditions of the squeegee in correspondence with a detection result of the pressure sensor.

According to a 17th aspect of the present invention, there is provided a solder paste printing apparatus as defined in the 16th aspect, wherein the control means executes control on a basis of a pressure waveform that represents a change with a lapse of time of the pressure of the solder paste detected by the pressure sensor.

According to an 18th aspect of the present invention, there is provided a solder paste printing apparatus as defined in the 16th aspect, wherein the control means is provided with a database in which a pressure waveform of the solder paste is registered and controls the driving conditions of the squeegee by comparing the pressure waveform detected by the pressure sensor with the solder paste pressure waveform that is registered in the database and becomes a criterion of decision.

According to a 19th aspect of the present invention, there is provided a solder paste printing apparatus as defined in the 16th aspect, wherein a squeegee up-and-down drive device for changing a relative position in the vertical direction of the squeegee with respect to the printing mask is provided, and the relative position is adjusted by driving the squeegee up-and-down drive device by the control means.

According to a 20th aspect of the present invention, there is provided a solder paste printing apparatus as defined in the 16th aspect, wherein a printing drive device for moving the squeegee in the printing direction is provided, and a travel speed in the printing direction of the squeegee is adjusted by driving the printing drive device by the control means.

According to a 21st aspect of the present invention, there is provided a solder paste printing apparatus as defined in the 16th aspect, wherein a pressurizing member horizontal movement mechanism for changing a relative position of the pressurizing member with respect to the squeegee is provided, and the relative position of the pressurizing member is adjusted by driving the pressurizing member horizontal movement mechanism by the control means.

According to a 22nd aspect of the present invention, there is provided a solder paste printing apparatus as defined in the 16th aspect, wherein a pressurizing member vertical movement mechanism for changing a relative position of the pressurizing member with respect to the printing mask is provided, and the relative position of the pressurizing member is adjusted by driving the pressurizing member vertical movement mechanism by the control means.

According to a 23rd aspect of the present invention, there is provided a solder paste printing apparatus as defined in the 16th aspect, wherein the pressure sensor is provided short of a printing start end of the circuit-forming body, and the pressure detection of the solder paste is performed before starting the printing of the circuit-forming body.

According to a 24th aspect of the present invention, there is provided a solder paste printing method as defined in the 11th aspect, wherein the pressure of the solder paste flowing between the-pressurizing member and the printing mask is increased by the pressurizing member provided in a vicinity of the edge portion of the squeegee, and the driving conditions of the squeegee are controlled by detecting the increased pressure of the solder paste and comparing the detected pressure with a specified pressure preparatorily registered.

According to another aspect of the present invention, there is provided a solder paste printing method of the 24th aspect, wherein, when the driving conditions of the squeegee are controlled, the control is executed on a basis of a pressure waveform that represents a change with the lapse of time of the solder paste pressure detected by the pressure sensor.

According to another aspect of the present invention, there is provided a solder paste printing method of the 24th aspect, wherein, when the driving conditions of the squeegee are controlled, the driving conditions of the squeegee are controlled by comparing the pressure waveform detected by the pressure sensor with the pressure waveform of the solder paste, which becomes a criterion of decision.

According to another aspect of the present invention, there is provided a solder paste printing method of the 24th aspect, wherein, when the driving conditions of the squeegee are controlled, the relative position is adjusted by changing the up-and-down direction relative position of the squeegee with respect to the printing mask.

According to another aspect of the present invention, there is provided a solder paste printing method of the 24th aspect, wherein, when the driving conditions of the squeegee are controlled, the travel speed in the printing direction of the squeegee is adjusted.

According to another aspect of the present invention, there is provided a solder paste printing method of the 24th aspect, wherein, when the driving conditions of the squeegee are controlled, the relative position of the pressurizing member is adjusted by changing the relative position of the pressurizing member with respect to the squeegee.

According to another aspect of the present invention, there is provided a solder paste printing method of the 24th aspect, wherein, when the driving conditions of the squeegee are controlled, the relative position of the pressurizing member is adjusted by changing the relative position of the pressurizing member with respect to the printing mask.

According to a 25th aspect of the present invention, there is provided a solder paste printing method as defined in the 24th aspect, wherein the pressure of the solder paste is measured before starting pattern printing of the circuit-forming body, and the control of the driving conditions of the squeegee is completed before starting the pattern printing.

According to a 26th aspect of the present invention, there is provided a screen printing method for printing a printing paste on a board supported by a support base via a screen supported by a screen table section by means of a printing head section, comprising:

positioning the board on the support base in a specified position by supporting and positioning the board on the support base with the support base with the board loaded moved up and down with respect to a movable frame capable of moved up and down with respect to the table section, moving up the movable frame with respect to the table section roughly in synchronization with these operations, and horizontally moving the table section in a direction roughly perpendicular to a board loading and unloading direction;

making the recognition camera recognize a reference position mark preparatorily given to the board in accordance with a horizontal movement of the recognition camera in the board loading and unloading direction and a horizontal movement of the table section in a direction roughly perpendicular to the board loading and unloading direction; and performing relative positional alignment of the board with the screen by horizontally moving the table section in a direction roughly perpendicular to the board loading and unloading direction on a basis of a position of the reference position mark recognized by the recognition camera, moving the screen table section that supports the screen in the board loading and unloading direction, and rotating the screen table section within a horizontal plane roughly parallel to the board on the support base.

According to a 27th aspect of the present invention, there is provided a screen printing method as defined in the 26th aspect, wherein the board on which the printing paste is not printed is loaded in the board loading and unloading direction onto the support base supported vertically movably by the movable frame vertically movable with respect to the table section, and the board on which the printing paste has already been printed is unloaded in the board loading and unloading direction roughly in synchronization with the board loading operation.

According to a 28th aspect of the present invention, there is provided a screen printing method as defined in the 26th or 27th aspect, wherein the recognition camera further recognizes the reference position mark preparatorily given to the screen in accordance with the horizontal movement of the recognition camera in the board loading and unloading direction and in the direction roughly perpendicular to the board loading and unloading direction.

According to a 29th aspect of the present invention, there is provided a screen printing apparatus for printing a printing paste on a board supported by a support base via a screen supported by a screen table section by means of a printing head section, comprising:

the screen table section that is horizontally movably supported by a device frame;

a table section horizontal movement device for horizontally moving the table section in the direction roughly perpendicular to the board loading and unloading direction;

a movable frame that is vertically movably supported by the table section;

the support base vertically movably supported by the movable frame;

a screen table section that is arranged above the support base and supports the screen;

a printing head section that is arranged above the screen table section and prints the printing paste on the board via the screen supported by the screen table section;

a board loading device that loads the board, on which the printing paste is not printed, onto the support base in the board loading and unloading direction;

a board unloading device that unloads the board, on which the printing paste has already been printed, on the support base in the board loading and unloading direction;

a movable frame elevation device that is provided in the table section and moves up and down the movable frame with respect to the table section;

a support base elevation device that is provided on the movable frame and moves up and down the support base with respect to the movable frame;

a board regulation device that positions the board on the support base;

a screen table section horizontal movement device that horizontally moves the screen table section in the board loading and unloading direction;

a screen table section rotation device that rotates the screen table section in the horizontal plane roughly parallel to the board supported on the support base;

a recognition camera that is provided horizontally movably in the board loading and unloading direction and in the direction roughly perpendicular to the board loading and unloading direction and is able to recognize the reference position marks preparatorily given to the board and the screen; and a control means for controlling said devices and the recognition camera, the control means executing roughly in synchronism the loading of the board onto the support base by the board loading device and the unloading of the board from the support base by the board unloading device in the board loading and unloading direction, the control means executing roughly in synchronism the support of the board on the support base in accordance with the elevating operation of the support base by the support base elevation device, positioning of the board on the support base by the board regulation device, upward movement of the movable frame by the movable frame elevation device, horizontal movement of the table section in the direction roughly perpendicular to the board loading and unloading direction by the table section horizontal movement device, and positioning of the board to a specified position where the reference position mark recognition is performed by the recognition camera in accordance with the upward movement of the movable frame and the horizontal movement of the table section, and the control means executing the relative positional alignment of the board with the screen by controlling roughly in synchronism the table section horizontal movement device, the screen table section horizontal movement device, and the screen table section rotation device on a basis of the positions of the respective reference position marks of the board and the screen recognized by the recognition camera.

According to a 30th aspect of the present invention, there is provided a screen printing apparatus as defined in the 29th aspect, wherein the support base is vertically movably supported on a guide shaft fixed to the movable frame, the support base elevation device has on the movable frame a ball thread mechanism constructed of a ball thread shaft that has an outer peripheral surface on which a ball thread is formed and a ball thread nut that is provided on the support base and meshed with the ball thread shaft and a support base elevation motor that rotates the ball thread shaft of the ball thread mechanism, and the movable frame elevation device further has in the table section a ball thread mechanism constructed of a ball thread shaft commonly used for the support base elevation device and a ball thread nut that is meshed with the ball thread shaft and rotatably supported by the table section and a movable frame elevation motor that rotates the ball thread nut of the ball thread mechanism.

According to a 31st aspect of the present invention, there is provided a screen printing apparatus as defined in the 29th or 30th aspect, comprising:

a board stopper that is provided on the support base while being able to advance and retreat and stops the board in a specified position on the support base by being engaged with a fore end portion of the board loaded onto the support base by the board loading device; and a board detection sensor that is provided for the board stopper and detects presence or absence of a board on the support base, the control means controlling the board loading device and the board unloading device on a basis of a board detection signal from the board detection sensor.

According to a 32nd aspect of the present invention, there is provided a screen printing apparatus as defined in the 31st aspect, wherein a cushioning member is provided on an engagement surface that belongs to the board stopper and is engaged with the board.

According to a 33rd aspect of the present invention, there is provided a printing screen cleaning method for cleaning a printing screen by sliding a wiping member on a lower surface of the printing screen for supplying a printing paste onto a circuit-forming body through a printing paste supply section of a specified pattern with the wiping member backed up by a backup member so as to wipe the printing paste stuck to the lower surface and sucking the paste via the wiping member through a suction port provided through the backup member, whereby the printing paste that is stuck to the lower surface of the printing screen or staying in the printing paste supply section is stuck by suction to the wiping member side and kept by the wiping member, the cleaning being performed by sliding the wiping member on the printing screen in a state in which the backup of the wiping member is partially released by a groove located in the sliding direction with respect to the suction port of the backup member.

According to a 34th aspect of the present invention, there is provided a printing screen cleaning device for supplying a printing paste onto a circuit-forming body through a printing paste supply section of a specified pattern, comprising:

a cleaning head that sucks the paste via a wiping member while sliding the wiping member on a lower surface of a printing screen with the wiping member backed up by a backup member through a suction port provided on a backup surface for performing the backup, the backup member having on the backup surface a groove that partially releases the backup of the wiping member in the sliding direction with respect to the suction port.

According to a 35th aspect of the present invention, there is provided a printing screen cleaning device as defined in the 34th aspect, wherein the suction port is provided in a suction region extended in a direction roughly perpendicular to the sliding direction on the backup surface of the backup member, and a groove that is parallel to the suction region and partially releases the backup of the wiping member is provided.

According to a 36th aspect of the present invention, there is provided a printing screen cleaning device as defined in the 34th aspect, comprising: an elevation device that pressurizes the backup member against the printing screen on the cleaning head or releases the pressurization; and a movement device that makes the cleaning head advance under the printing screen from a standby position beside the printing screen and retreat from the screen and move under the printing screen.

According to a 37th aspect of the present invention, there is provided a printing screen cleaning device as defined in any one of the 34th through 36th aspects, comprising: a supply section that feeds and supplies the wiping member; and a winding section that winds up the wiping member.

According to a 38th aspect of the present invention, there is provided a printing screen cleaning device as defined in any one of the 34th through 36th aspects, wherein the suction ports are arranged in an array in a direction inclined in the sliding direction.

According to a 39th aspect of the present invention, there is provided a wiping member backup member comprising: a backup surface for sliding a wiping member on a printing screen while backing up the wiping member; a suction region provided in a direction roughly perpendicular to the sliding direction with a suction port provided on the backup surface; and a groove extended parallel to the suction region.

According to another aspect of the present invention, there is provided a wiping member backup member provided with a backup surface for bringing the wiping member in sliding contact with the printing screen while backing up the wiping member, a suction region that has a suction port on this backup surface and is provided in a direction roughly perpendicular to the sliding direction, and one or a plurality of grooves that are parallel to the suction region and provided on one side of this suction region.

According to another aspect of the present invention, there is provided a wiping member backup member provided with a backup surface for bringing the wiping member in sliding contact with the printing screen while backing up the wiping member, a suction region that has a suction port on this backup surface and is provided in a direction roughly perpendicular to the sliding direction, and one or a plurality of grooves that are parallel to the suction region and provided on both sides of this suction region.

According to another aspect of the present invention, there is provided a wiping member backup member provided with a backup surface for bringing the wiping member in sliding contact with the printing screen while backing up the wiping member, two suction regions that have a suction port on this backup surface and are provided in a direction roughly perpendicular to the sliding direction, and one or a plurality of grooves that are parallel to the suction region and provided on both sides of the portion where these two suction regions are arranged side by side.

According to another aspect of the present invention, there is provided a wiping member backup member provided with a backup surface for bringing the wiping member in sliding contact with the printing screen while backing up the wiping member, two suction regions that have a suction port on this backup surface and are provided in a direction roughly perpendicular to the sliding direction, and one or a plurality of grooves that are parallel to the suction region and provided in positions provided adjacently on both sides of the portion where these two suction regions are arranged side by side and between these two suction regions.

According to another aspect of the present invention, there is provided a wiping member backup member of the 39th aspect or any aspect subsequently described, wherein the suction ports are provided in an array in a direction inclined with respect to the sliding direction.

According to a 40th aspect of the present invention, there is provided a printing screen cleaning method for cleaning a printing screen by sliding a wiping member on a lower surface of the printing screen for supplying a printing paste onto a circuit-forming body through a printing paste supply section of a specified pattern with the wiping member backed up by a backup member so as to wipe the printing paste stuck to the lower surface and sucking the paste via the wiping member through suction ports provided through the backup member, whereby the printing paste that is stuck to the lower surface of the printing screen or staying in the printing paste supply section is stuck by suction to a wiping member side and kept by the wiping member, the cleaning being performed by continuously sucking by the suction ports arranged side by side in a sliding direction.

According to a 41st aspect of the present invention, there is provided a printing screen cleaning device for supplying a printing paste onto a circuit-forming body through a printing paste supply section of a specified pattern, comprising:

a cleaning head that sucks the paste via a wiping member while sliding the wiping member on a lower surface of a printing screen with the wiping member backed up by a backup member through a suction port provided on a backup surface for performing the backup, wherein a plurality of suction ports are arranged side by side in a sliding direction on the backup surface, and suction is continuously performed by the plurality of suction ports.

According to a 42nd aspect of the present invention, there is provided a printing screen cleaning device as defined in the 41st aspect, wherein the plurality of suction ports are provided in a suction region extended in a direction roughly perpendicular to the sliding direction on the backup surface of the backup member, arranged parallel to the suction region and have suction areas reduced stepwise.

According to a 43rd aspect of the present invention, there is provided a printing screen cleaning device as defined in the 41st or 42nd aspect, wherein the plurality of suction ports are arranged in proximity to each other.

According to a 44th aspect of the present invention, there is provided a printing screen cleaning device as defined in the 41st or 42nd aspect, wherein the plurality of suction ports are provided laterally symmetrically in the sliding direction.

According to a 45th aspect of the present invention, there is provided a printing screen cleaning device as defined in the 41st or 42nd aspect, comprising: an elevation device that pressurizes the backup member against the printing screen on the cleaning head or releases the pressurization; and a movement device that makes the cleaning head advance under the printing screen from a standby position beside the printing screen and retreat from the screen and move under the printing screen.

According to a 46th aspect of the present invention, there is provided a printing screen cleaning device as defined in the 41st or 42nd aspect, comprising: a supply section that feeds and supplies the wiping member; and a winding section that winds up the wiping member.

According to a 47th aspect of the present invention, there is provided a printing screen cleaning device as defined in the 41st or 42nd aspect, wherein the suction ports are arranged in an array in a direction inclined in the sliding direction.

According to a 48th aspect of the present invention, there is provided a wiping member backup member comprising: a backup surface for sliding a wiping member on a printing screen while backing up the wiping member; and a suction region provided in a direction roughly perpendicular to the sliding direction with a suction port provided on the backup surface, the suction port being comprised of a plurality of suction ports, which are arranged parallel to the suction region and side by side in the sliding direction.

According to another aspect of the present invention, there is provided a wiping member backup member of the 48th aspect, wherein the plurality of suction ports have suction port areas that reduce in succession in the sliding direction.

According to another aspect of the present invention, there is provided a wiping member backup member of the 48th aspect or any aspect subsequently described, wherein the plurality of suction ports are arranged in proximity to each other.

According to another aspect of the present invention, there is provided a wiping member backup member of the 48th aspect or any aspect subsequently described, wherein the plurality of suction ports are provided laterally symmetrically in the sliding direction.

BRIEF DESCRIPTION OF DRAWINGS

These and other aspects and features of the present invention will become clear from the following description taken in conjunction with the preferred embodiments thereof with reference to the accompanying drawings, in which:

FIG. 30 is an explanatory view showing a relation between the type (viscosity) of the solder paste and a printing condition when no pressurizing member is provided for the squeegee;

FIG. 31 is an explanatory view showing a relation of the type (viscosity) of the solder paste to printing conditions when a pressurizing member of a round bar is provided for the squeegee;

FIG. 65A and FIG. 65B are a plan view and an end view, respectively, of the backup member of another example of the cleaning device of the seventh embodiment;

FIG. 69 is a side view of the backup member of the cleaning device of the eighth embodiment;

FIG. 70A is a transverse sectional view of the backup member of the cleaning device of the eighth embodiment;

FIG. 70B is a sectional view showing another example of the backup member of the cleaning device of the eighth embodiment;

FIG. 71 is a graph showing by comparison between a cleaning effect when the backup member of the cleaning device of the eighth embodiment is used and that of a comparative example;

BEST MODE FOR CARRYING OUT THE INVENTION

Figure 1:
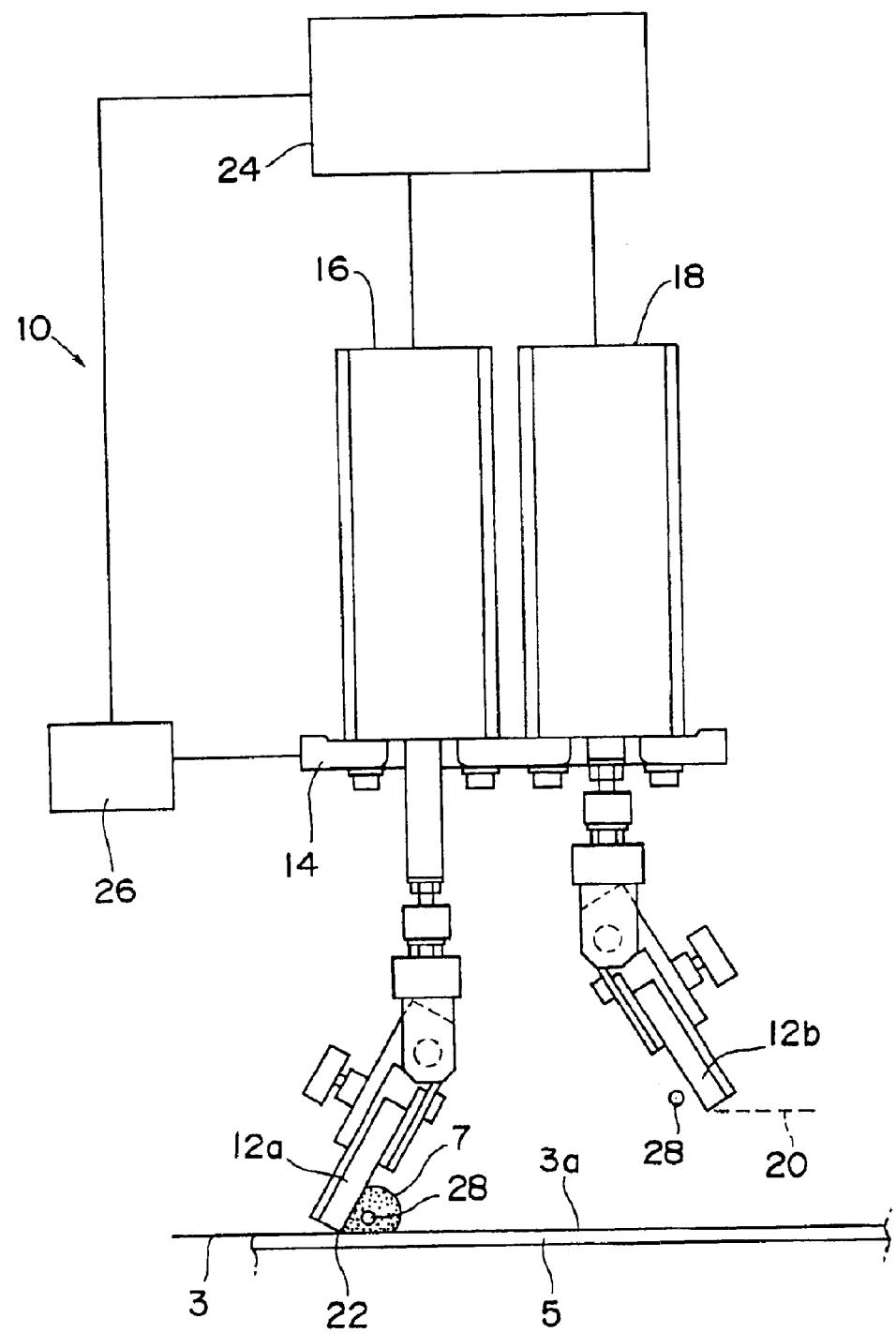
FIG. 1 is a structural view of a solder paste printing apparatus according to a first embodiment of the present invention.

Before the description of the present invention proceeds, it is to be noted that like parts are designated by like reference numerals throughout the accompanying drawings.

The first embodiment of the present invention will be described in detail below with reference to the drawings.

(First Embodiment)

The solder paste printing apparatus and printing method of the first embodiment of the present invention will be described below with reference to the drawings. The printing method is executed by the solder paste printing apparatus. Moreover, in each figure, identical constituent parts or those having same functions are denoted by same reference numerals, and no description is provided for them. In this specification, the solder paste means a solder in a paste form obtained by mixing powdery solder with a high-viscosity flux.

FIG. 1 is a view schematically showing a squeegee and its peripherals of a solder paste printing apparatus 10 in the first embodiment. The solder paste printing apparatus 10 is a type such that a pair of squeegees move in both printing directions of leftward and rightward directions. That is, the solder paste printing apparatus 10 is provided with a squeegee 12a to be used during the rightward printing and a squeegee 12b to be used during leftward printing.

Each of the squeegees 12a and 12b fills a solder paste 7 into a number of openings 4, . . . , 4 of a printing mask 3 placed on a circuit board 5 that serves as one example of the circuit-forming body during solder paste printing and scrapes the solder paste 7 off on the printing mask 3. Each of the squeegees 12a and 12b can independently move up and down between a standby position 20 in which the squeegee lower end is positioned above the printing mask 3 and an operating position 22 in which the squeegee lower end is in contact with the printing mask 3 by means of up-and-down drive devices 16 and 18 each of which is constructed of an air cylinder or the like for the squeegee mounted on a base plate 14 of the squeegee head that constitutes the solder paste printing apparatus 10. The squeegees 12a and 12b are formed into a plate-like shape, and, for example, hard rubber such as urethane rubber is adopted as a material.

In this case, the circuit-forming body means an object on which a circuit is formed, such as a circuit board of a resin board, a paper-phenol board, a ceramic board, a glass epoxy (glass-epoxy) board, a film board, or the like, a circuit board of a single-layer board, a multi-layer board or the like; a component; a casing; or a frame.

The base plate 14 is moved in the leftward and rightward printing directions by a drive device 26 such as a motor of which the operation is controlled by a control unit 24. FIG. 1 shows a state in which the rightward printing is being performed, where one squeegee 12a positioned on the left-hand side of FIG. 1 is moved down to the operating position 22 for the execution of filling and scraping, and the other squeegee 12b positioned on the right-hand side of FIG. 1 is moved up to the standby position 20.

In a state in which the squeegee 12a or 12b is positioned in the operating position 22, the edge portion of each squeegee 12a or 12b comes in contact with the surface 3a of the printing mask 3 in a state in which an appropriate pressure is applied to the surface 3a of the printing mask 3 and performs the filling of the solder paste 7 into the openings 4 of the printing mask 3 on the surface 3a and the scraping operation on the printing mask surface 3a.

A pressurizing member 28 is provided in the vicinity of the edge portion of each of the squeegees 12a and 12b.

The drive device 26 and the up-and-down drive devices 16 and 18 are connected to the control unit 24 that executes the operation control of the solder paste printing apparatus 10, and the control unit 24 executes the movement control of both the squeegees 12a and 12b by means of the drive device 26 in the right-and-left directions and the up-and-down operation control of the up-and-down drive devices 16 and 18.

Figure 2:
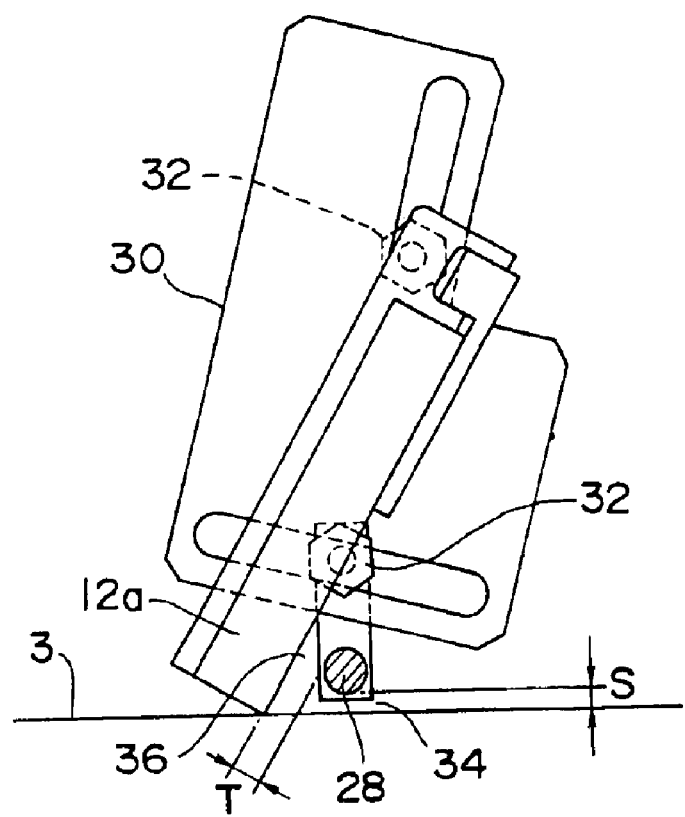
FIG. 2 is a structural view of the pressurizing member mounted on the solder paste printing apparatus-of FIG. 1.
Figure 3:
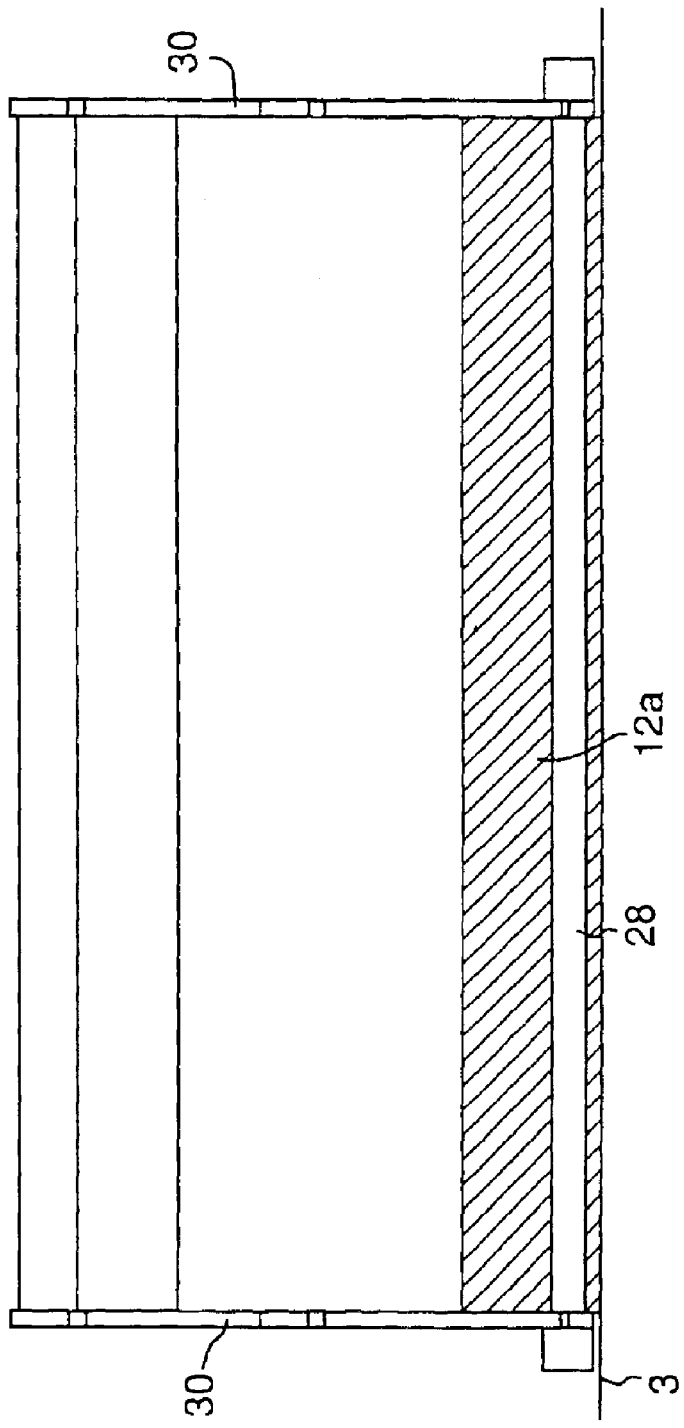
FIG. 3 is a schematic view showing a relation between the pressurizing member and the squeegee of the solder paste printing apparatus of FIG. 1 (note that the hatching of the squeegee 12a in FIG. 3 is provided so as not to show the cross-section but to clearly show the region of the squeegee 12a)

FIG. 2 is a side view showing the mounting structure of a pressurizing member provided in the vicinity of the edge portion of the squeegee 12a. FIG. 3 is a schematic view showing a relation between the squeegee 12a and the pressurizing member provided in the vicinity of the squeegee 12a. Since the other squeegee 12b is similarly constructed, only the construction of one squeegee 12a will be described.

As an example, a pressurizing member 28 is a round bar having a circular cross-section shape and fixed by a fixing member 32 such as a bracket 30 and a bolt and nut so that the surface of the squeegee 12a and the center axis of the pressurizing member 28 become parallel to each other in the vicinity of the edge portion of the squeegee 12a in the lengthwise direction, which is an example of the axial direction of the squeegee 12a. When the squeegee 12a comes in contact with the printing mask 3, the pressurizing member 28 forms a narrow path 34 of a minute interval S between the member and the surface 3a of the printing mask 3. The interval S of this narrow path 34 is preferably about 1 mm to 3 mm.

Figure 4:
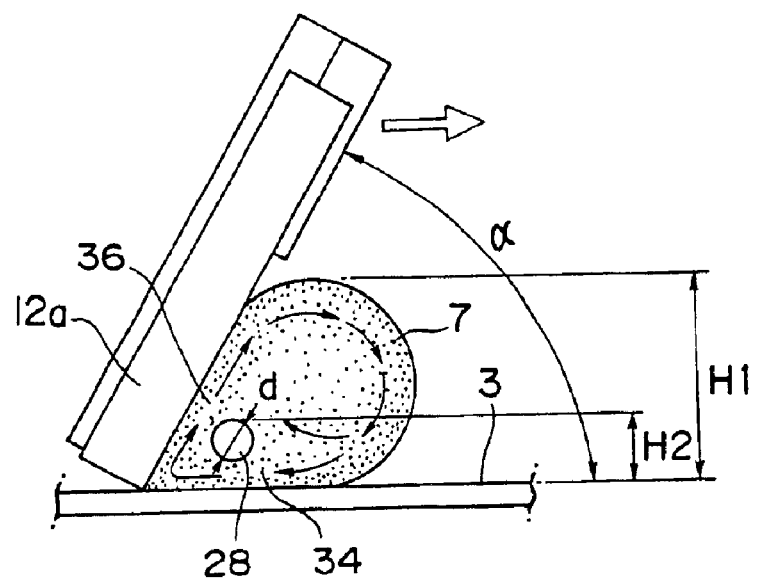
FIG. 4 is a view showing a rolling state of the solder paste of the solder paste printing apparatus of FIG. 1.

Moreover, the pressurizing member 28 forms a flow path 36 of an interval T, which becomes the flow path of the solder paste 7 rolling during the solder paste printing, between the member and the squeegee 12a. The interval T of this flow path 36 is preferably about 1 mm to 3 mm. As shown in FIG. 4, the rolling solder paste 7 flows on both of the upper and lower sides of the pressurizing member 28. In particular, the solder paste 7 located under the pressurizing member 28 circulates clockwise as indicated by arrow by so as to pivot by passing through the narrow path 34 between the member and the printing mask 3, thereafter passing through the flow path 36 located between the squeegee 12a and the pressurizing member 28, moving over or above the pressurizing member 28 in the rightward direction in FIG. 4 and passing again through the narrow path 34.

The height of the pressurizing member 28 from the surface 3a of the printing mask 3, i.e., the height H2 of the upper end surface of the pressurizing member 28 is lower than the rolling height of the solder paste 7 during printing, i.e., the height H1 of the upper end surface of the solder paste 7 in the rolling operation, and the pressurizing member 28 sinks in the rolling solder paste 7 during printing. Moreover, the pressurizing member 28 is fixed so as not to be able to rotate.

As described above, when the pressurizing member 28 is constructed of a round bar, the diameter d of the round bar is preferably 0.2 to 10 mm, and more particularly, is 5 to 7 mm.

By virtue of the formation of the narrow path 34 between the pressurizing member 28 and the printing mask 3, the solder paste 7 that passes through the narrow path 34 while rolling comes to have a higher pressure than in the conventional case in accordance with the movement of the squeegees 12a and 12b. As a result, the solder paste 7 is appropriately filled into the openings 4 of the printing mask 3, and the insufficient filling attributed to a shortage of pressure of the solder paste 7 as in the prior art technique is eliminated.

If the pressurizing member 28 warps when a high pressure is generated in the narrow path 34, then a uniform pressure cannot be obtained in the lengthwise direction. Therefore, the pressurizing member 28 is preferably formed of a high-rigidity material that causes no warp. For example, the pressurizing member 28 is formed of a metal, ceramic, or hard plastic.

Figure 5:
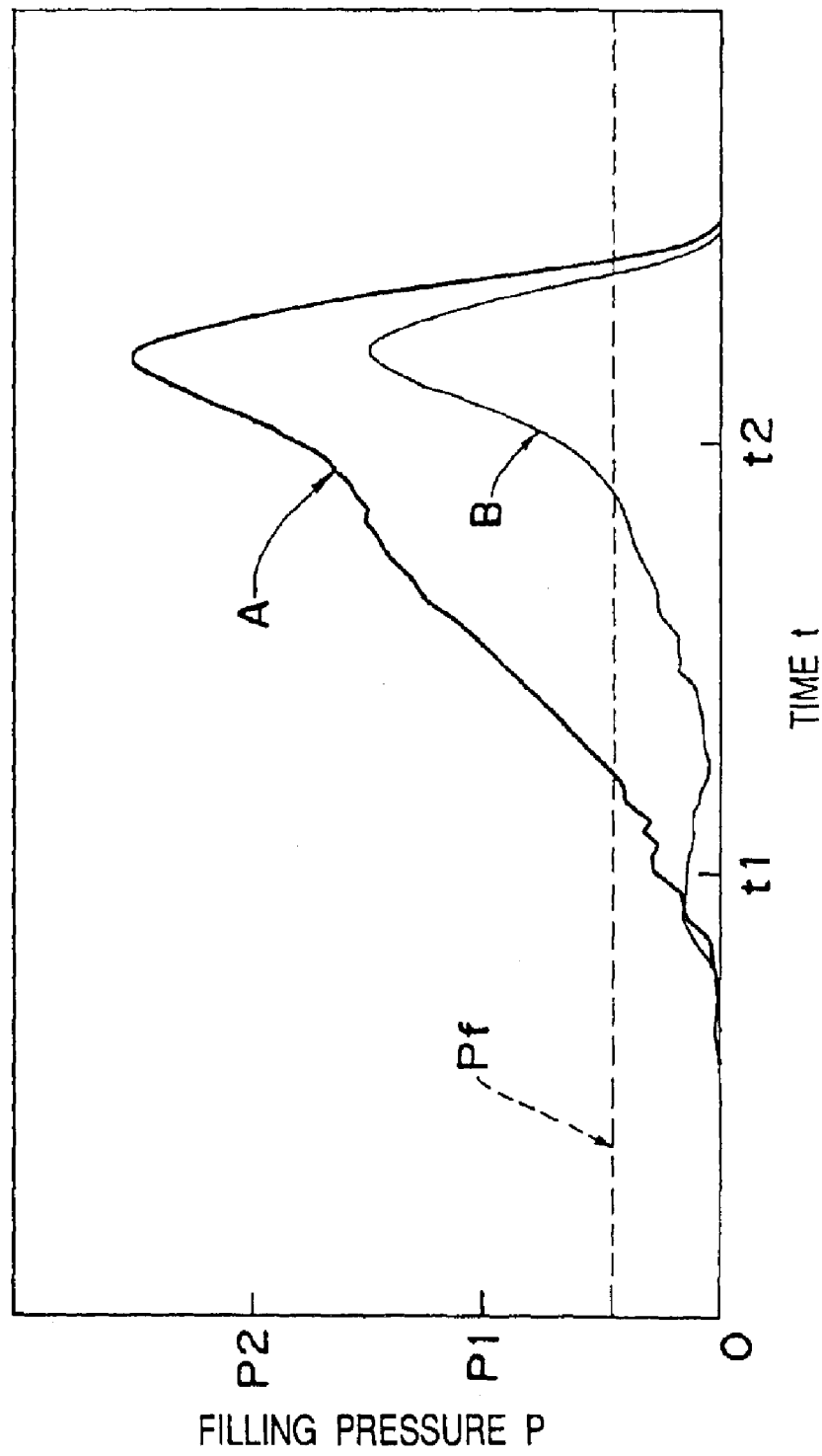
FIG. 5 is a graph showing the characteristics of the filling pressures of a squeegee provided with the pressurizing member of the solder paste printing apparatus of FIG. 1 and a squeegee provided with no pressurizing member.

FIG. 5 is a graph of the measurement results of the change in the filling pressure of the solder paste 7 in the openings 4 while the squeegee is operating at a high squeegee speed of 200 mm/sec. In FIG. 5, the reference letter A represents the characteristic of the squeegees 12a and 12b provided with the pressurizing members 28, and the reference letter B represents the characteristic of the conventional squeegee provided with no pressurizing member.

Figure 17:
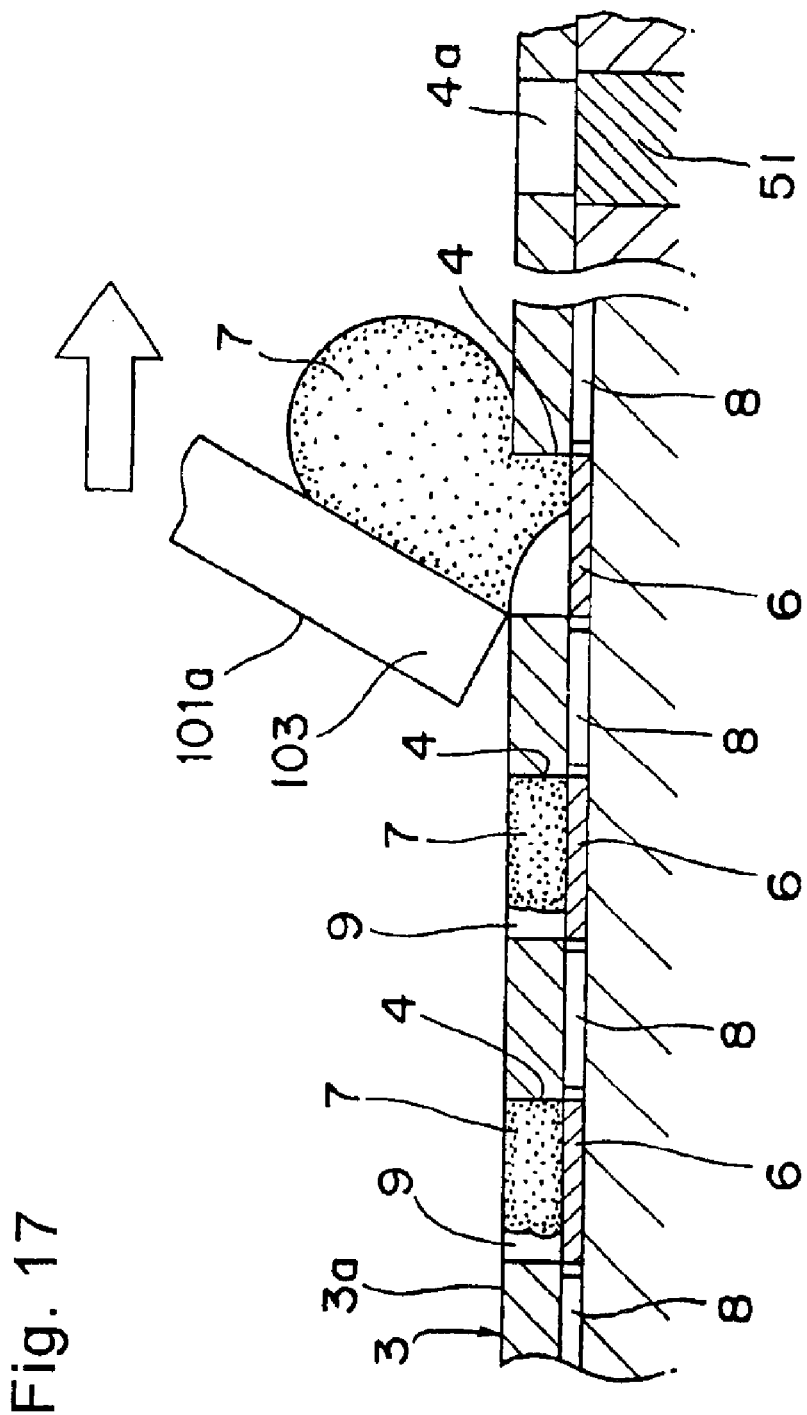
FIG. 17 is a view showing a case where unfilled portions of the solder paste occur in the openings of a printing mask.
Figure 18:
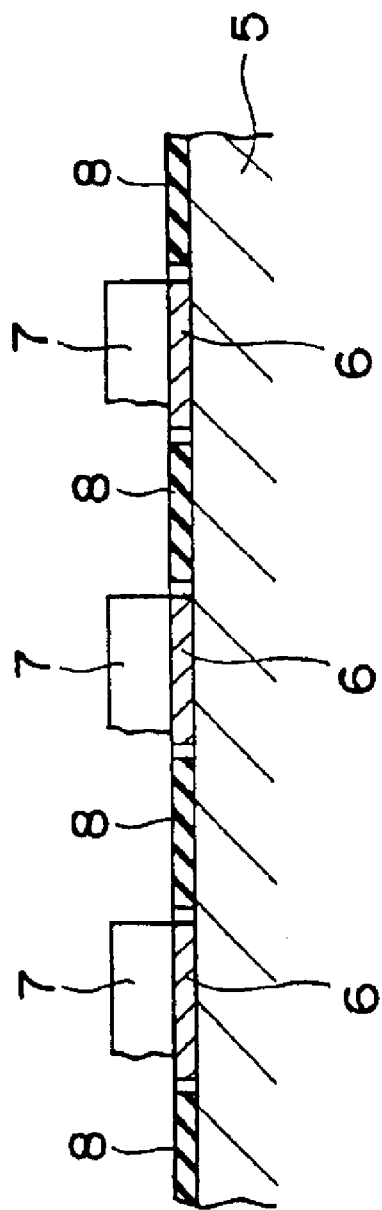
FIG. 18 is an explanatory view showing the solder paste formed on the lands of a printed board after the printing of the solder paste of FIG. 17.
Figure 19:
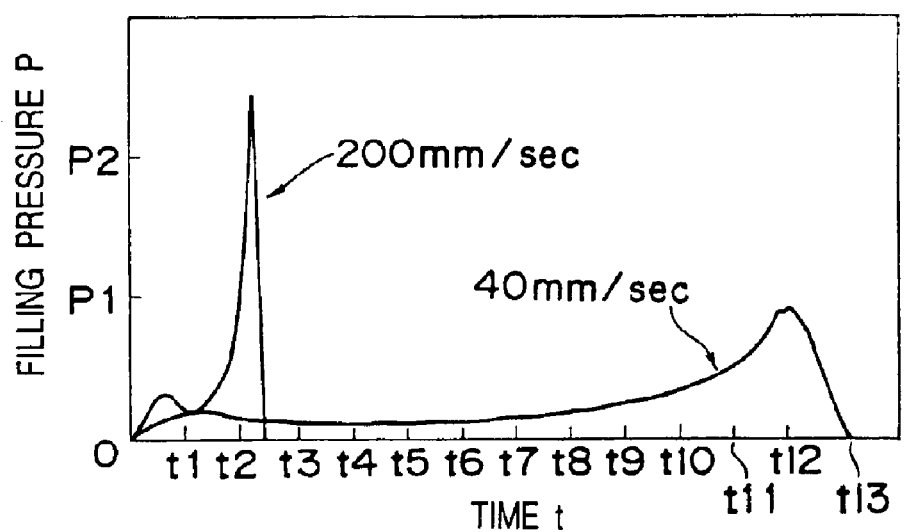
FIG. 19 is a graph showing a change in a filling pressure relative to a squeegee-passing time by a conventional apparatus.
Figure 20:
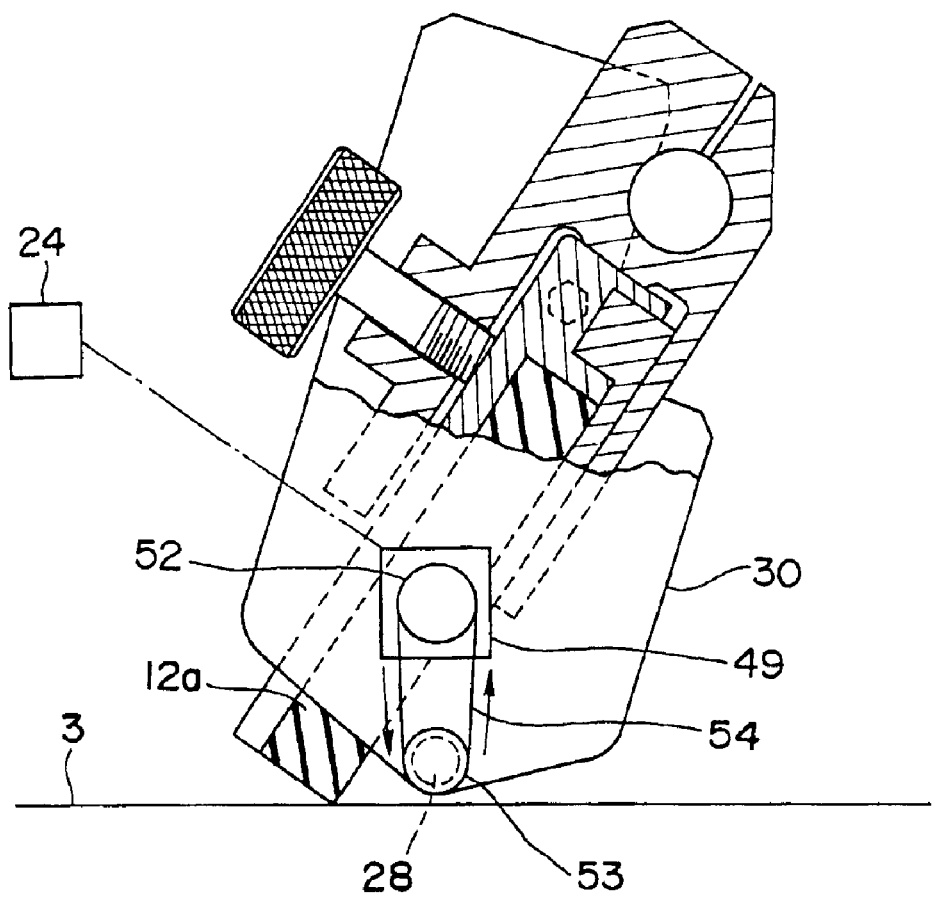
FIG. 20 is a partially enlarged view of a solder paste printing apparatus according to a third embodiment of the present invention.
Figure 21:
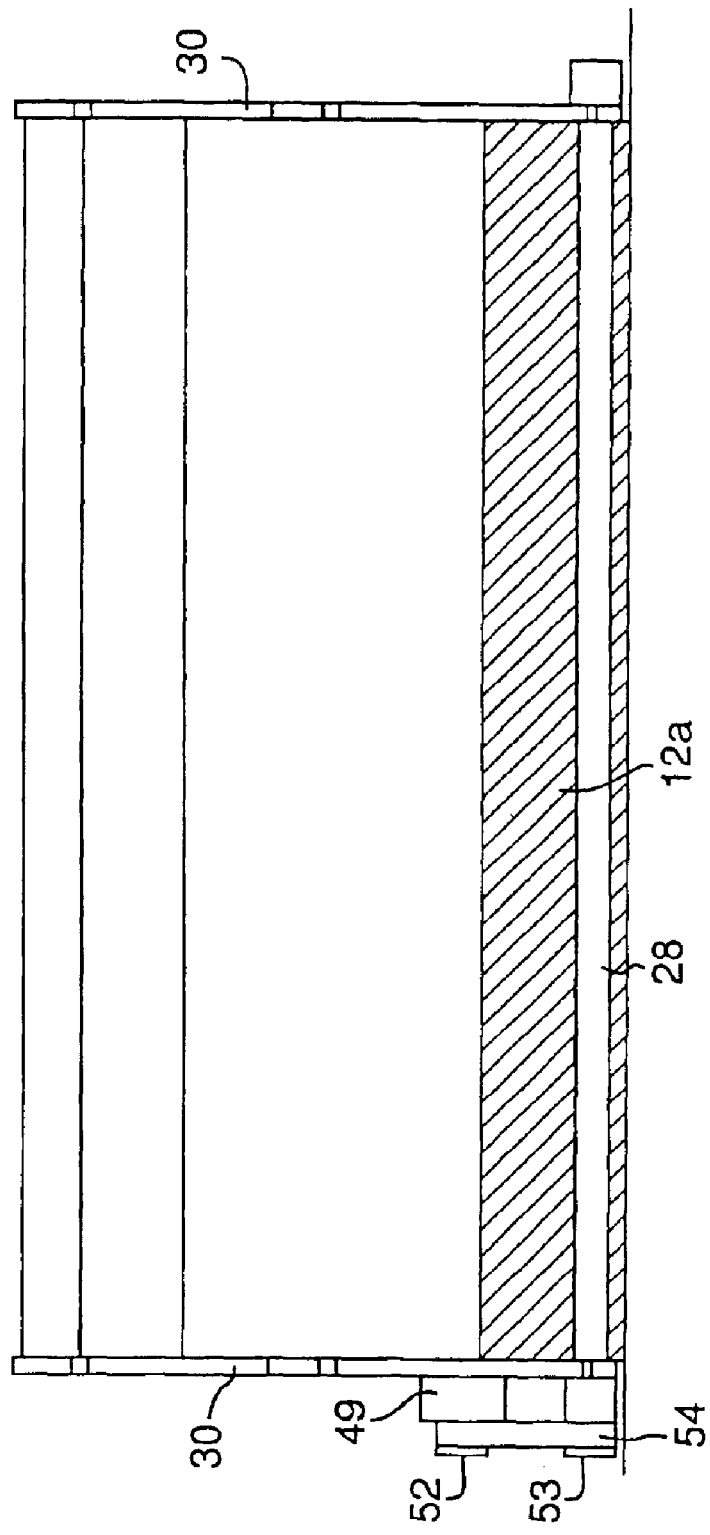
FIG. 21 is a schematic view showing a relation between the pressurizing member and the squeegee of the solder paste printing apparatus of the third embodiment (note that the hatching of the squeegee 12a in FIG. 21 is provided so as not to show the cross-section but to clearly show the region of the squeegee 12a)

As shown in FIG. 17, there were measured the filling pressures with a pressure sensor 51 arranged on the back surface of the printing mask 3, with the openings 4a provided in the specified portions of the printing mask 3, and with the squeegees 12a and 12b moved at a travel speed of 200 mm/sec.

Time t on the horizontal axis is the time during which the squeegees 12a and 12b pass over the pressure sensor 51, and the filling pressure P on the vertical axis is the pressure detected by the pressure sensor 51 via the solder paste 7 when the squeegees 12a and 12b pass over the pressure sensor 51.

As is apparent from this graph, the squeegees 12a and 12b provided with the pressurizing members 28 produce a required pressure (for example, Pf shown in the figure) or more needed for the filling during a longer time even if the squeegee speed is increased, whereas the conventional squeegee produces the required pressure Pf needed for the filling during only a shorter time when the squeegee speed is increased.

Therefore, it can be understood that the solder paste 7 is sufficiently filled into the openings 5 of the printing mask 3 even when the squeegee speeds of the squeegees 12a and 12b provided with the pressurizing members 28 are increased.

As described above, in the case of the pressurizing member 28 constructed of a round bar, the cross-section shape of the introducing portion of the narrow path 34 is formed into a roughly wedge-like shape by the curved surface of the round bar of the pressurizing member 28, and therefore, the pressure can be increased with the solder paste 7 drawn in.

Figure 6:
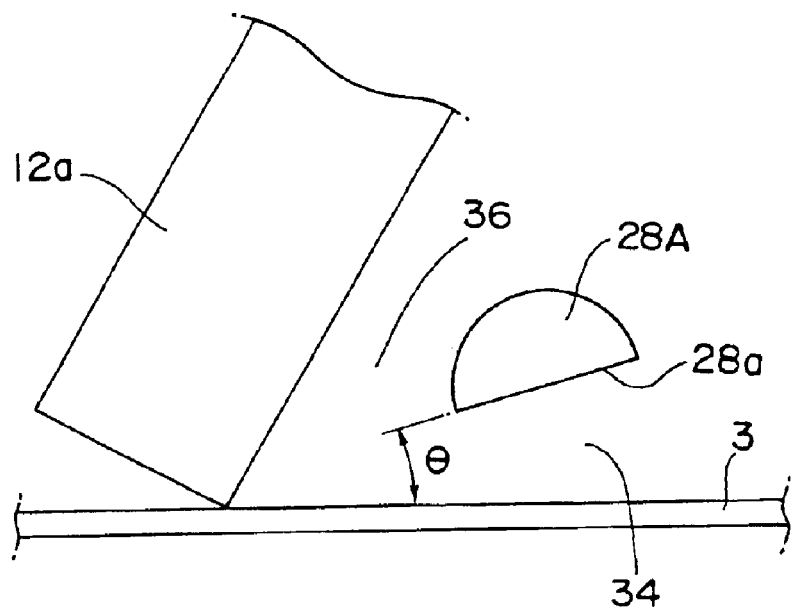
FIG. 6 is a view showing a modification example of the pressurizing member and the narrow path of the solder paste printing apparatus of FIG. 1.
Figure 7:
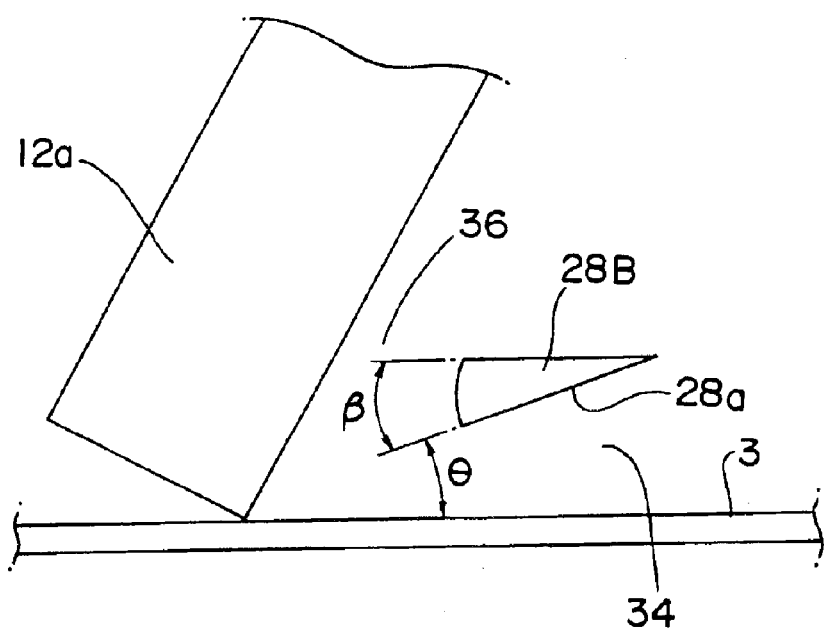
FIG. 7 is a view showing another modification example of the pressurizing member and the narrow path of the solder paste printing apparatus of FIG. 1.

Moreover, the narrow path 34 may have a wedge-like cross-section shape as shown in FIG. 6 and FIG. 7 for the same purpose. FIG. 6 shows a construction in which a pressurizing member 28A is a rod that has a semicircular cross-section shape and an inclined flat surface 28a on the lower side, and this pressurizing member 28A forms the narrow path 34 of the wedge-like cross-section shape. FIG. 7 shows a construction in which a pressurizing member 28B is obtained by processing a rod that has semicircular cross-section shape to have a wedge-like cross-section shape with its outer peripheral surface partially left so that the pressurizing member has an inclined flat surface on the upper side and the inclined flat surface 28a on the lower side, and this pressurizing member 28B forms the narrow path 34 of a wedge-like cross-section shape.

It is to be noted that the cross-section shape of the narrow path 34 located between the pressurizing member 28, 28A, or 28B and the printing mask 3 is not especially limited, and it is acceptable only to form a narrow gap between the pressurizing member and the printing mask 3.

The narrow path 34 is only required to generate a gap of about 0.5 mm to 10 mm between the pressurizing member 28, 28A, or 28B and the printing mask 3 as described above, and it is particularly preferable to generate a gap of about 1 mm to 3 mm.

As shown in FIG. 6 and FIG. 7, if the surface 28a that belongs to each of the pressurizing members 28A and 28B and faces the printing mask 3 is an inclined surface for the formation of the narrow path 34 of the wedge-like cross-section shape, then an angle of inclination θ with respect to the printing mask 3 is preferably about 30 degrees. Even if the shape of the pressurizing member 28 is changed to that of the pressurizing member 28A or 28B as described above, the filling pressure of the solder paste 7 into the openings 4 of the printing mask 3 roughly obtains the characteristic of A shown in FIG. 5, and the required pressure needed for the filling is generated for a longer time than in the conventional case.

Figure 8:
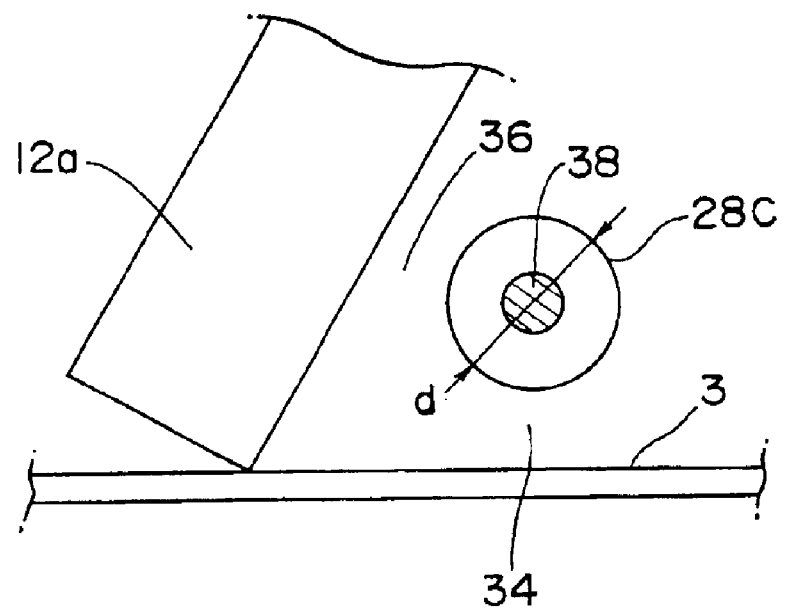
FIG. 8 is a view showing another modification example of the pressurizing member of the solder paste printing apparatus of FIG. 1.

Moreover, it is preferred that a pressurizing member 28C has a built-in heat-generating element 38 as shown in FIG. 8 and appropriately heats the solder paste 7 up to a temperature of about 20 to 30° C. The pressurizing member 28C having the built-in heat-generating element 38 appropriately heats the solder paste 7 and maintains the temperature of the solder paste 7 constant, by which the viscosity of the solder paste 7 is maintained constant, allowing a stable filling characteristic to be obtained.

Figure 9:
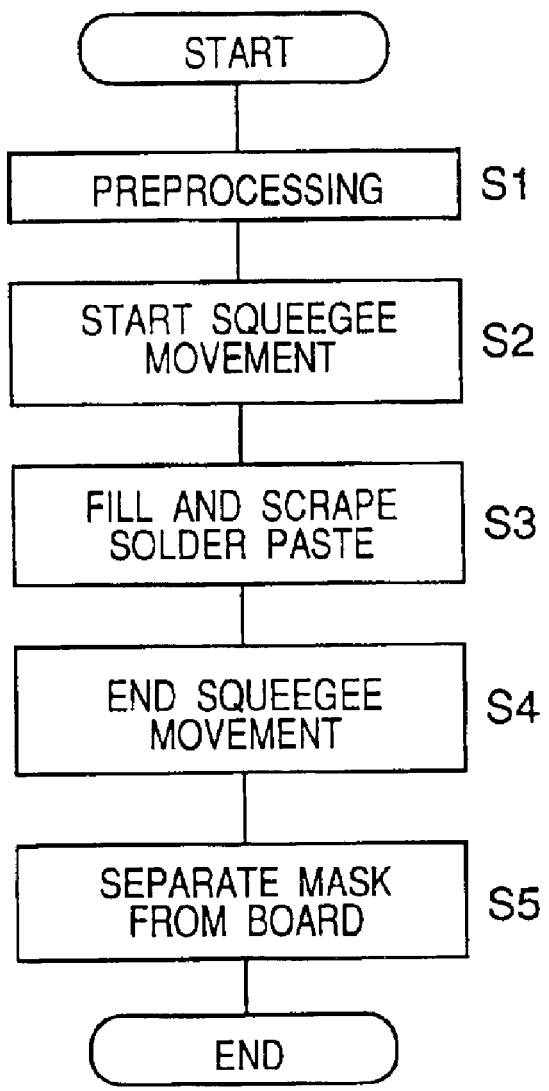
FIG. 9 is a flowchart showing the operations of the solder paste printing apparatus shown in FIG. 1.

The solder paste printing operation by the solder paste printing apparatus 10 constructed as above will be described below with reference to FIG. 9.

In step (indicated by "S" in FIG. 9) 1, the following operation is performed. First of all, a prescribed amount of solder paste 7 is supplied to the surface 3a of the printing mask 3. The printed board 5 is moved up to a printing position and held by a printed board elevation device or the like (not shown), and the printed board 5 is positioned and layered with the printing mask 3 so that the openings 4 of the printing mask 3 is positioned on the lands 6 of the printed board 5. Then, in the case of rightward printing, the rightward printing squeegee 12a is moved down by the up-and-down drive device 16 under the control of the control unit 24. At this time, the edge portion 20 of the squeegee 12a is brought in contact with the surface 3a of the printing mask 3 with a proper application pressure. The leftward printing squeegee 12b is made to stay in the standby position by the up-and-down drive device 18.

In step 2, the base plate 14 is moved rightward in FIG. 1 by the drive device 26 under the control of the control unit 24 in a state in which the rightward printing squeegee 12a is brought in contact with the surface 3a of the printing mask 3 with a proper application pressure, linearly moving the squeegee 12a in the rightward printing direction. By this operation, the filling operation of the solder paste 7 into the openings 4 of the printing mask 3 by the squeegee 12a and the scraping operation on the surface 3a of the printing mask 3 are started in step 3. At this time, the solder paste 7 that is rolling on the surface 3a of the printing mask 3 flows clockwise around the pressurizing member 28 as shown in FIG. 4. In particular, the solder paste 7 located on the lower side of the pressurizing member 28 circulates so as to pass through the narrow path 34 located between the member and the printing mask 3 in the leftward direction opposite to the printing direction, thereafter pass through the flow path 36 located between the squeegee 12a and the pressurizing member 28 upwardly aslant to the right, move to the upper right-hand side of the pressurizing member 28 in FIG. 4, move to the lower right-hand side and pass again through the narrow path 34. By the passing of the solder paste 7 through this narrow path 34, the filling pressure is made higher than in the conventional case, and the solder paste 7 is sufficiently filled into the openings 4 even if the squeegee speed is increased.

In step 4, when the squeegee 12a arrives at a movement end position, the movement of the squeegee 12a is stopped by the drive device 26 under the control of the control unit 24.

Subsequently, in step 5, the printed board 5 is moved down by the printed board elevation device or the like (not shown) to separate the printed board 5 from the printing mask 3, completing the printing of the solder paste 7.

Next, during the leftward printing, similar to the aforementioned rightward printing, the printed board 5 is moved up to the printing position and held by the printed board elevation device or the like (not shown), and the printed board 5 is positioned and layered with the printing mask 3 so that the openings 4 of the printing mask 3 is positioned on the lands 6 of the printed board 5. Thereafter, the leftward printing squeegee 12b is moved down by the up-and-down drive device 18 under the control of the control unit 24. Also, at this time, the edge portion of the squeegee 12b is brought in contact with the surface 3a of the printing mask 3 with a proper application pressure. At this time, the rightward printing squeegee 12a is made to stay in the standby position by the up-and-down drive device 16. The subsequent operation is performed similarly to the aforementioned rightward printing. By alternately repeating the printing operations as described above, the solder paste 7 is continuously printed on the lands 6 of the printed board 5 via the printing mask 3.

It is to be noted that the solder paste printing apparatus 10 of the first embodiment is the type of the movement in both the leftward and rightward printing directions, and therefore, both the squeegees 12a and 12b are provided. However, the solder paste printing apparatus may be the type of the movement only in either one direction, and in such a case, the squeegee 12a or the squeegee 12b corresponding to the direction of movement is provided.

(Second Embodiment)

Figure 10:
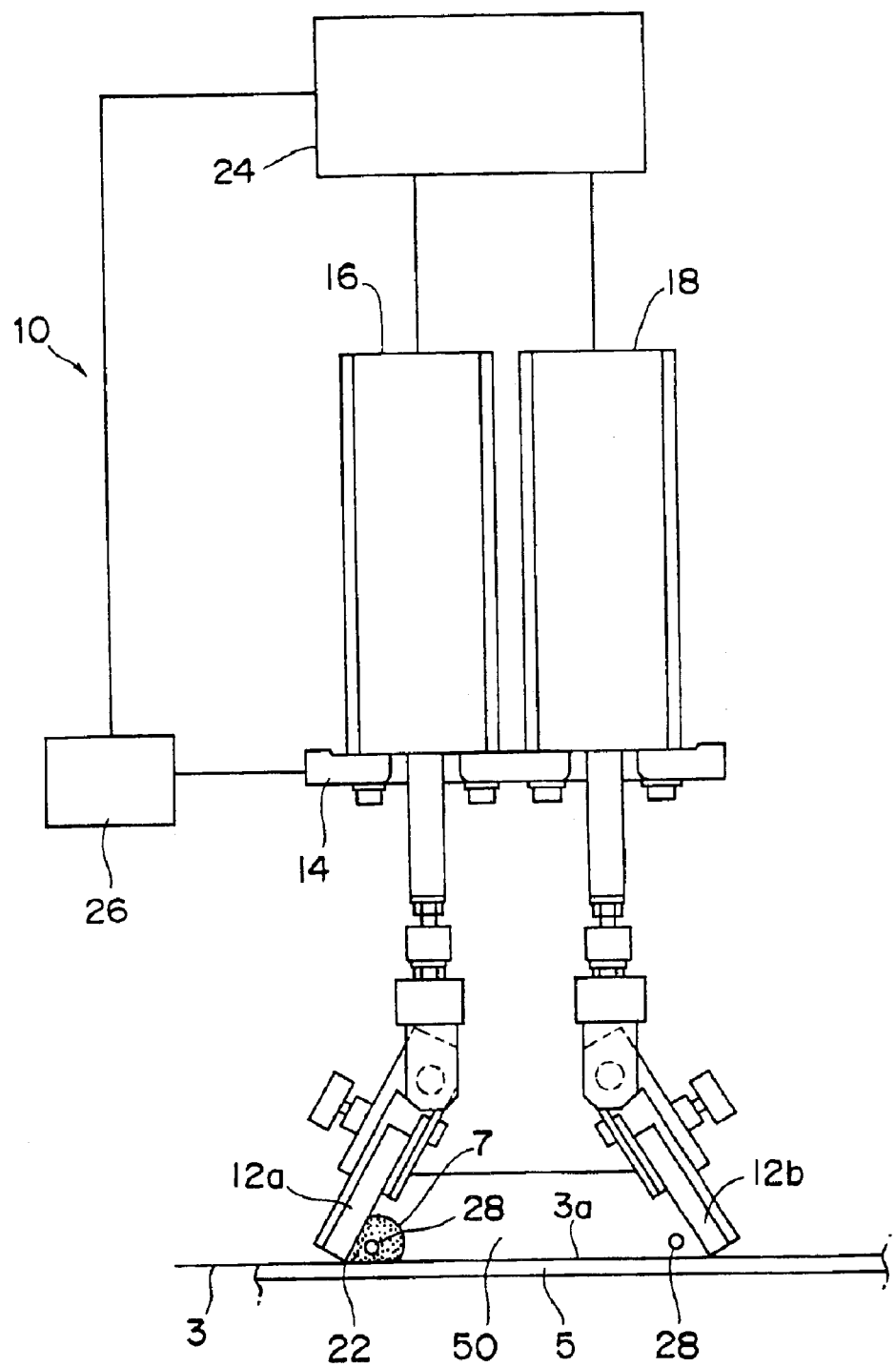
FIG. 10 is a structural view of a solder paste printing apparatus according to a second embodiment of the present invention.

Moreover, the first embodiment has the construction in which the squeegees 12a and 12b are vertically moved. However, as in FIG. 10 showing the solder paste printing apparatus of the second embodiment of the present invention, both the squeegees may consistently brought in contact with the surface 3a of the printing mask 3 without the vertical (up-and-down) movement during printing. The printing apparatus shown in FIG. 10 executes the filling and scraping operations of the solder paste 7 in the state in which a pair of squeegees 12a, 12b are consistently brought in contact with the printing mask 3 during printing, releases the application pressure that has been applied when the movement of the squeegees 12a and 12b is ended, and then separates the printed board 5 from the printing mask 3. By repeating this operation, the printing is continuously performed. By this operation, the solder paste 7 is consistently held between both the squeegees 12a and 12b, and the up-and-down movement of the squeegees 12a and 12b can be eliminated, allowing the printing time to be further reduced. When the printing ends, both the squeegees 12a and 12b are moved up by the drive devices 16 and 18 and held in the standby position 20. Since the printing apparatus shown in FIG. 10 has the same construction as that of the printing apparatus shown in FIG. 1 although the operation control is varied, no description is provided for the construction.

It is to be noted that the reference numeral 50 denotes a side plate provided so as to stride over either one or both of the squeegees 12a and 12b and is able to prevent the solder paste 7 from moving into a position displaced from the squeegees 12a and 12b in the axial direction of the squeegees 12a and 12b.

Furthermore, although the squeegees 12a and 12b are driven by the up-and-down drive devices 16 and 18 independently from each other, it is acceptable to mount both the squeegees on one up-and-down drive device.

The working examples of the present invention will be described next. It is to be noted that the squeegee speed in each of the following working examples is 200 m/sec increased from the conventional squeegee speed (40 mm/sec).

WORKING EXAMPLE 1

Printing was performed by setting a squeegee angle α to 60 degrees in the conventional squeegee provided with no pressurizing member and the squeegee of the working example 1 of the present invention provided with the pressurizing member constructed of a round bar in order to observe a change in the filling pressure depending on the presence or absence of the pressurizing member and a change in the squeegee angle. A squeegee made of urethane rubber was adopted.

Sample a (working example 1): provided with the pressurizing member.

Sample b (comparative example): provided with no pressurizing member.

It is to be noted that a round bar having a diameter of 5 mm was used as a pressurizing member for the Sample a, the gap between the pressurizing member and the printing mask was set to 3 mm, and the gap between the pressurizing member and the squeegee was set to 1 mm.

Figure 11:
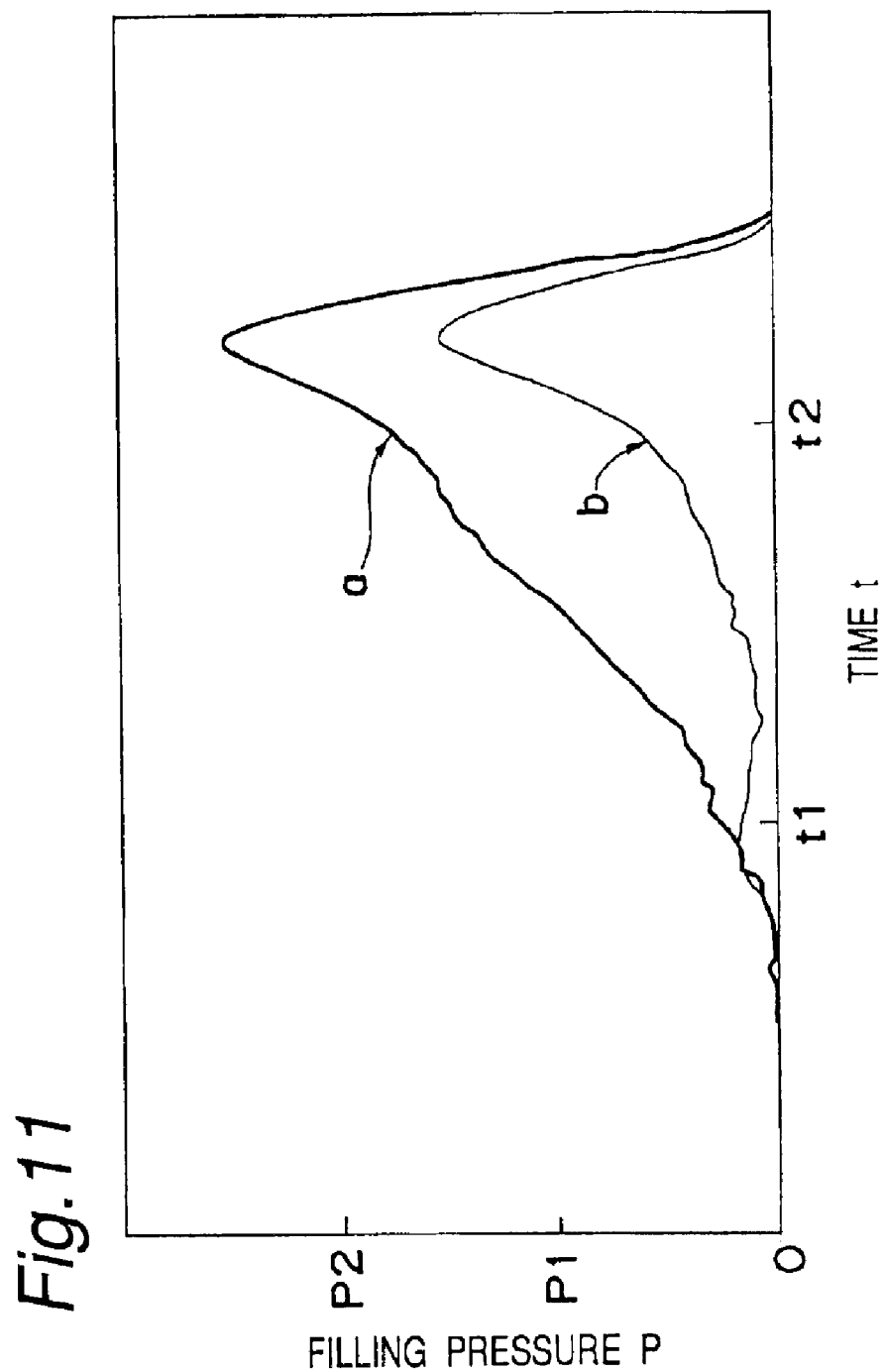
FIG. 11 is a graph showing the results of a working example 1.

FIG. 11 shows the results.

As apparent from the graph shown in FIG. 11, when the pressurizing member existed as in the case of the Sample a, the high-pressure state was able to be maintained for a long time. Therefore, it can be understood that satisfactory printing can be performed even if the squeegee speed is increased. In contrast to this, when no pressurizing member existed as in the case of the Sample b, a sufficient pressure was not able to be obtained. This indicates that the pressurizing member is extremely effective.

WORKING EXAMPLE 2

In the working example 2, the printing conditions depending on a change in the cross-section shape of the pressurizing member was observed. Other printing conditions are roughly similar to those of the working example 1.

Sample e: a circular cross-section having a diameter d of 5 mm.

Sample f: a semicircular cross-section having a diameter d of 5 mm, and the angle θ with respect to the printing mask is set to 30 degrees (FIG. 6).

Sample g: a semicircular cross-section having a diameter d of 8 mm, and the angle θ with respect to the printing mask is set to 30 degrees (FIG. 6).

Sample h: a semicircle having a diameter d of 8 mm is processed into a wedge-shaped cross-section with an angle β set to 30 degrees leaving the diametrical surface, and the angle θ with respect to the printing mask is set to 30 degrees (FIG. 7).

Sample i: a circular cross-section having a diameter d of 6 mm.

Sample j: a circular cross-section having a diameter d of 7 mm.

Sample k: provided with no pressurizing member (comparative example).

Figure 12:
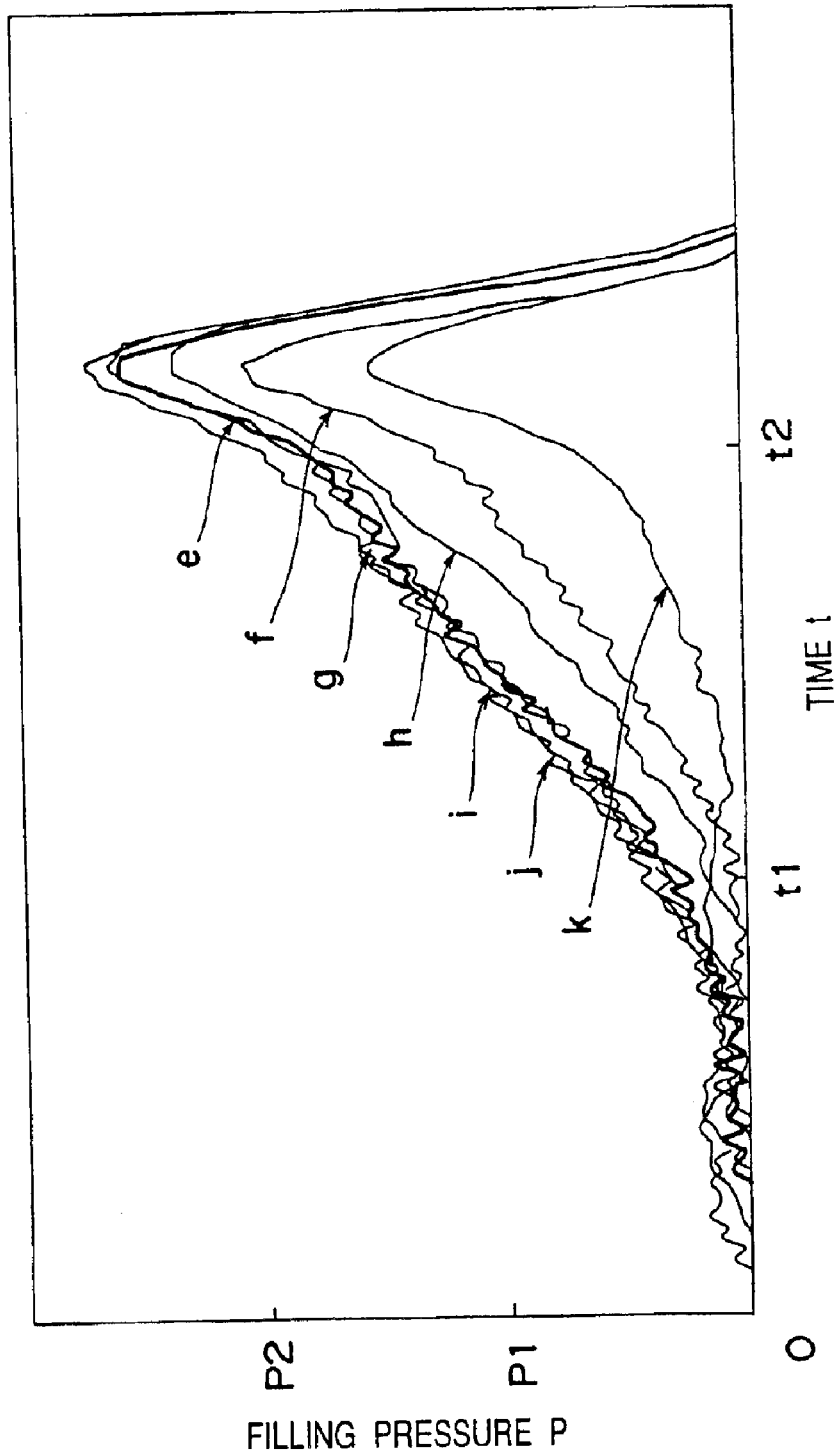
FIG. 12 is a graph showing the results of a working example 2.
Figure 13:
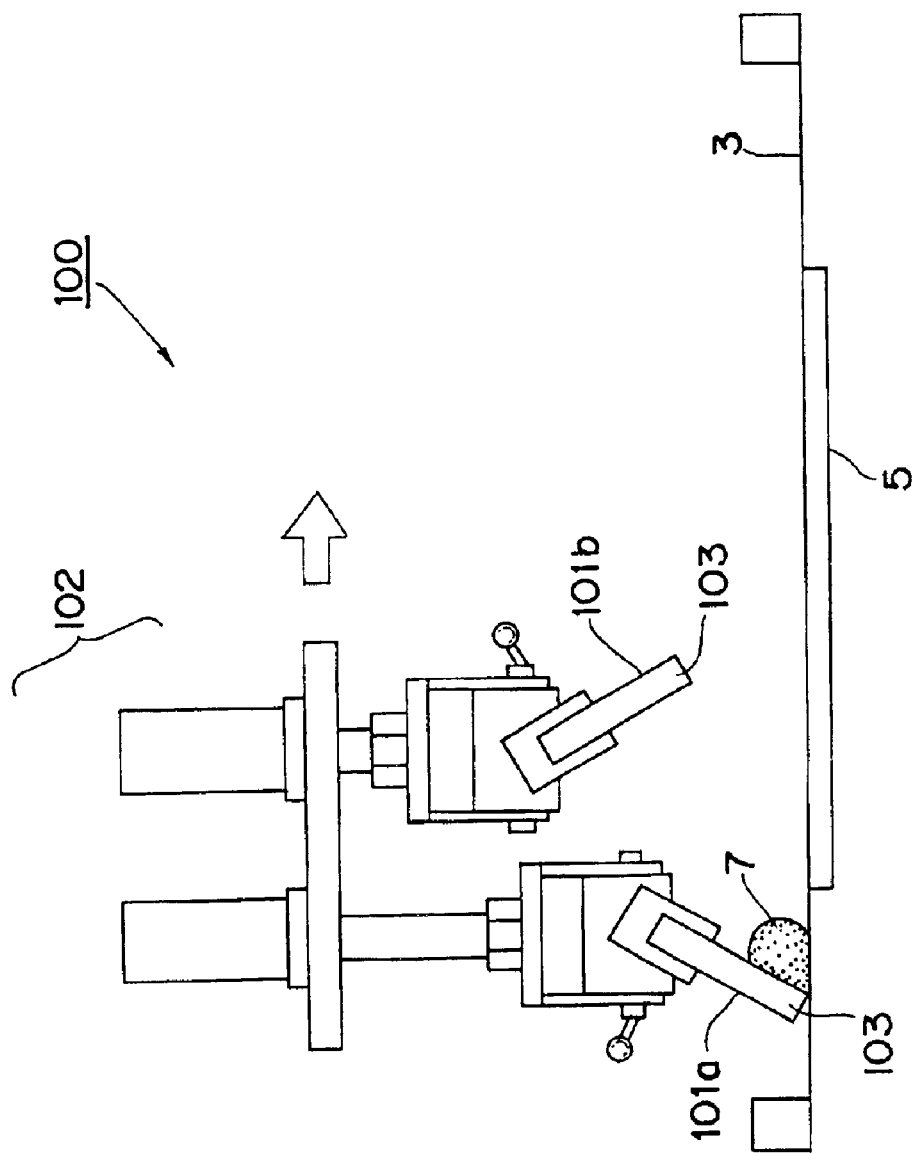
FIG. 13 is a structural view of a conventional solder paste printing apparatus.
Figure 14:
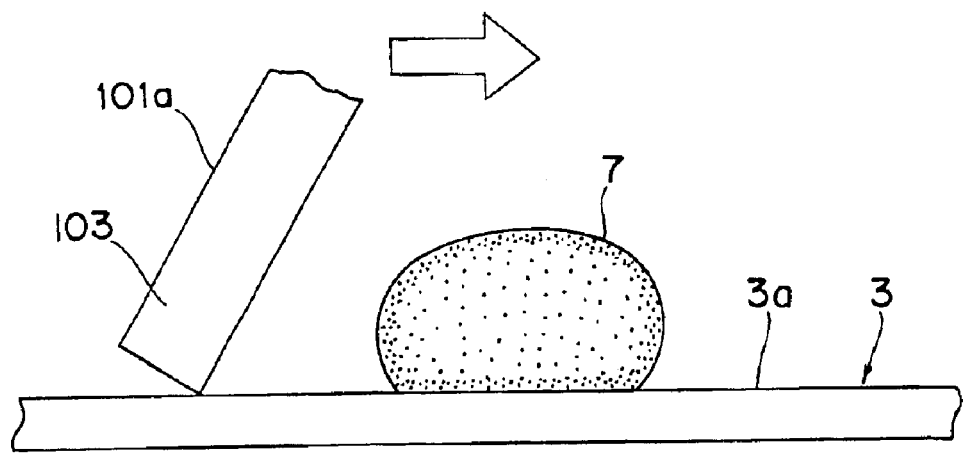
FIG. 14 is a view showing a state in which printing is performed by the squeegee shown in FIG. 12.
Figure 15:
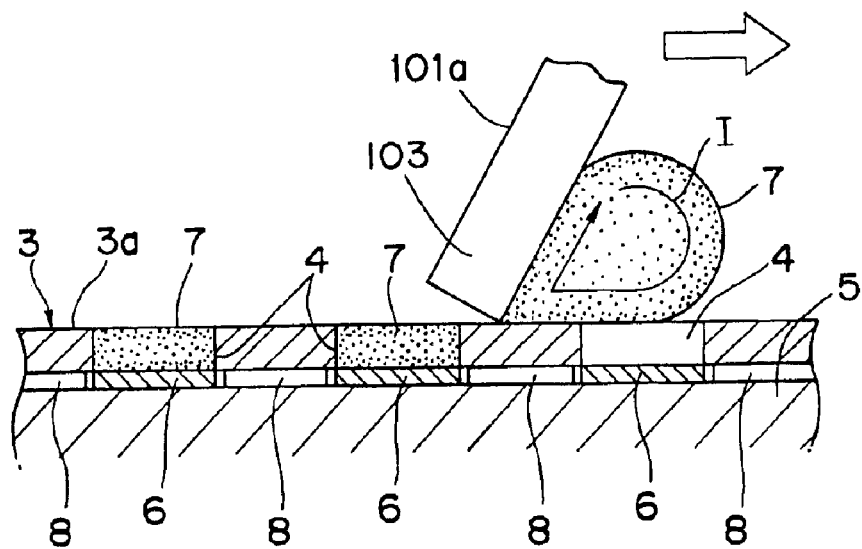
FIG. 15 is a view showing a state in which the solder paste is gradually filled into the openings by the squeegee shown in FIG. 12.
Figure 16:
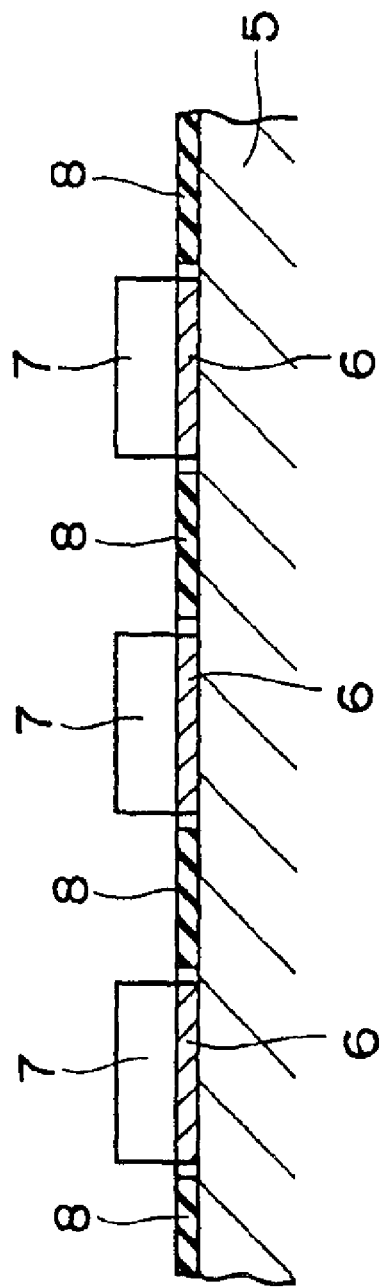
FIG. 16 is an explanatory view showing the solder paste formed on the lands of a printed board after the printing of the solder paste of FIG. 15.

FIG. 12 shows the results.

As apparent from the results shown in FIG. 12, high-pressure states were able to be maintained for a longer time than in the conventional case in the presence of the pressurizing members of the Samples e to j. Therefore, it can be understood that satisfactory printing can be performed even if the squeegee speed is increased and the pressurizing member is extremely effective.

Moreover, in the cases of the Samples e, i, and j in which the round bars having a diameter d of 5 mm, 6 mm, and 7 mm are used as the pressurizing members, there is no need for the complicated mechanical processing of the material for manufacturing the pressurizing members, and the pressurizing members can be provided with a simple construction. Therefore, the pressurizing members can be provided without increasing the manufacturing cost, which are more effective.

Moreover, according to FIG. 12, a higher pressure state can be maintained for a longer time than in the conventional case whichever cross-section shape the pressurizing members have. Therefore, the cross-section shape of the pressurizing member is not limited to the cross-section shape shown in the working examples and is merely required to be such a shape that the narrow path is formed between the pressurizing member and the printing mask.

According to the first embodiment and the second embodiment, by providing the pressurizing members 28, 28A, 28B, 28C, and 28D that form the narrow paths 34 between the members and the printing masks 3 and form the flow paths 36 between the members and the squeegees 12a and 12b in the vicinity of the edge portions of the squeegees 12a and 12b, the solder paste 7 that is rolling during the movement of the squeegee for solder paste printing passes through the narrow path 34, as a consequence of which the higher pressure state than in the conventional case can be provided by the narrow path 34. That is, the pressure of the solder paste 7 that is flowing between the pressurizing members 28, 28A, 28B, 28C, and 28D and the printing masks 3 is increased further than in the conventional case, and a larger amount of solder paste 7 flows downward by the increased pressure so as to be filled into the openings 4 of the printing mask 3. The pressurizing members 28, 28A, 28B, 28C, and 28D form the narrow path 34 between the members and the surface 3a of the printing mask 3, and therefore, the solder paste 7 that is flowing between the pressurizing members 28, 28A, 28B, 28C, and 28D and the surfaces 3a of the printing masks 3 maintains the high pressure for a long time. Therefore, even if the squeegee speed is increased, the solder paste 7 is sufficiently filled into the openings 4 when the pressurizing members 28, 28A, 28B, 28C, and 28D face the openings 4 of the printing masks 3, and a shortage of filling is eliminated.

Moreover, when the pressurizing member 28 is constructed of a round bar, there is no need for the complicated mechanical processing of the material in manufacturing the pressurizing member 28, and the pressurizing member 28 can be provided with a simple construction. Therefore, the manufacturing cost is not increased.

Moreover, when the pressurizing member 28C has the built-in heat-generating element 38, the temperature of the solder paste 7 can be maintained constant. Consequently, the viscosity of the solder paste 7 is maintained constant, and constant printing characteristics are obtained.

Moreover, particularly in the second embodiment, a pair of squeegees 12a and 12b is provided, and both the squeegees 12a and 12b are consistently brought in contact with the printing mask 3 at least during printing. Therefore, the take-out of the solder paste 7 by the rising squeegees 12a and 12b is prevented, and the set amount of solder paste 7 can be consistently held on the printing mask 3. Moreover, neither the squeegee 12a nor 12b vertically moves during printing. Therefore, the printing time can be reduced, and the productivity can be improved.

Figure 26A:
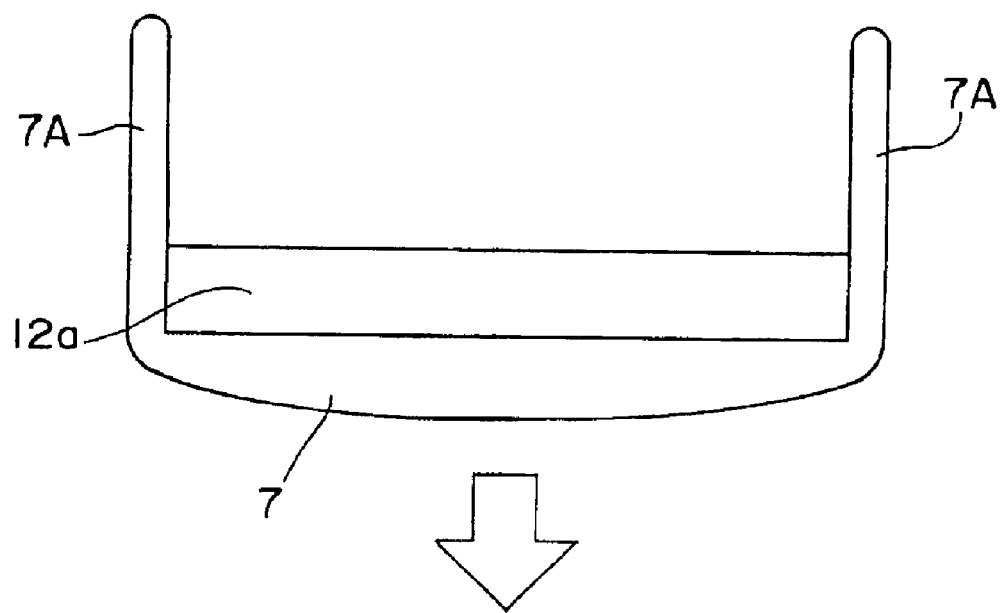
FIG. 26A and FIG. 26B are an explanatory view showing a state in which the solder paste is protruded from both sides of the squeegee through the repetition of the conventional solder paste printing and an explanatory view showing a state in which the solder paste is not protruded from both sides of the squeegee through the repetition of the solder paste printing of the first and second embodiments.
Figure 26B:
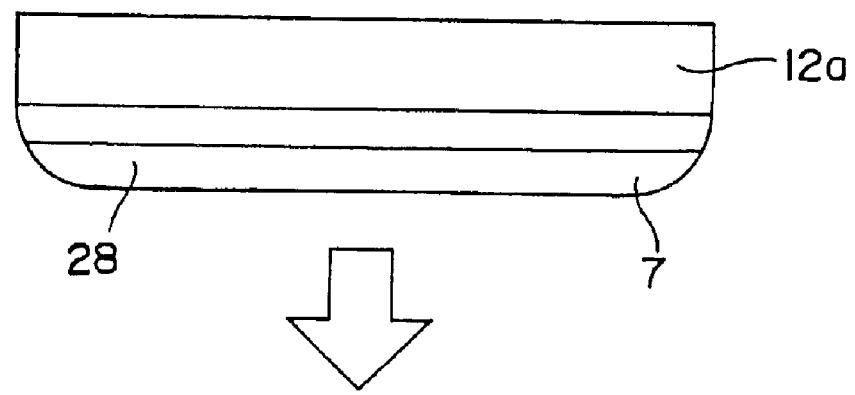

Moreover, as shown in FIG. 26A, if the printing is repetitively performed with the conventional construction, the solder paste 7 is protruded from both sides of the squeegee 12a. The solder paste 7A protruded therefrom does not naturally return, and the operator collects and puts back the paste at regular intervals of time or dispose of it. In contrast to this, by applying a pressure to the solder paste 7 with the pressurizing members 28, 28A, 28B, 28C, and 28D arranged, the solder paste 7 rolls around the pressurizing members 28, 28A, 28B, 28C, and 28D and comes to surround the pressurizing members 28, 28A, 28B, 28C and 28D. Therefore, even if the printing is repeated, as shown in FIG. 26B, a large amount of solder paste is not protruded dissimilar to the conventional case. Therefore, the work of the operator can be reduced and the productivity can be improved.

Furthermore, the pressurizing members 28, 28A, 28B, 28C, and 28D are merely supported with interposition of a specified gap to the squeegees 12a and 12b, and no tightly closing portion exists. Therefore, when cleaning the squeegee and the like, the cleaning can be simply performed.

Moreover, since the narrow path 34 has a roughly wedge-shaped cross-section shape, the solder paste 7 is efficiently introduced by the inclined surfaces 28a of the pressurizing members 28, 28A, 28B, 28C, and 28D, and the pressure of the solder paste 7 that is flowing between the pressurizing members 28, 28A, 28B, 28C, and 28D and the surfaces 3a of the printing masks 3 can be efficiently increased.

Moreover, the height H2 of the pressurizing members 28, 28A, 28B, 28C, and 28D from the surfaces 3a of the printing masks 3 is lower than the rolling height H1 of the solder paste 7 during printing, and the pressurizing members 28, 28A, 28B, 28C, and 28D sink in the rolling solder paste 7 during the printing. Therefore, the pressurizing members 28, 28A, 28B, 28C, and 28D exert no bad influence on the rolling of the solder paste 7, and the pressure of the solder paste 7 that is flowing between the members and the surfaces 3a of the printing masks 3 can be increased.

Moreover, the pressurizing members 28, 28A, 28B, 28C, and 28D, which are fixed so as to be unable to rotate, can be mounted with a simple construction.

Figure 26C:
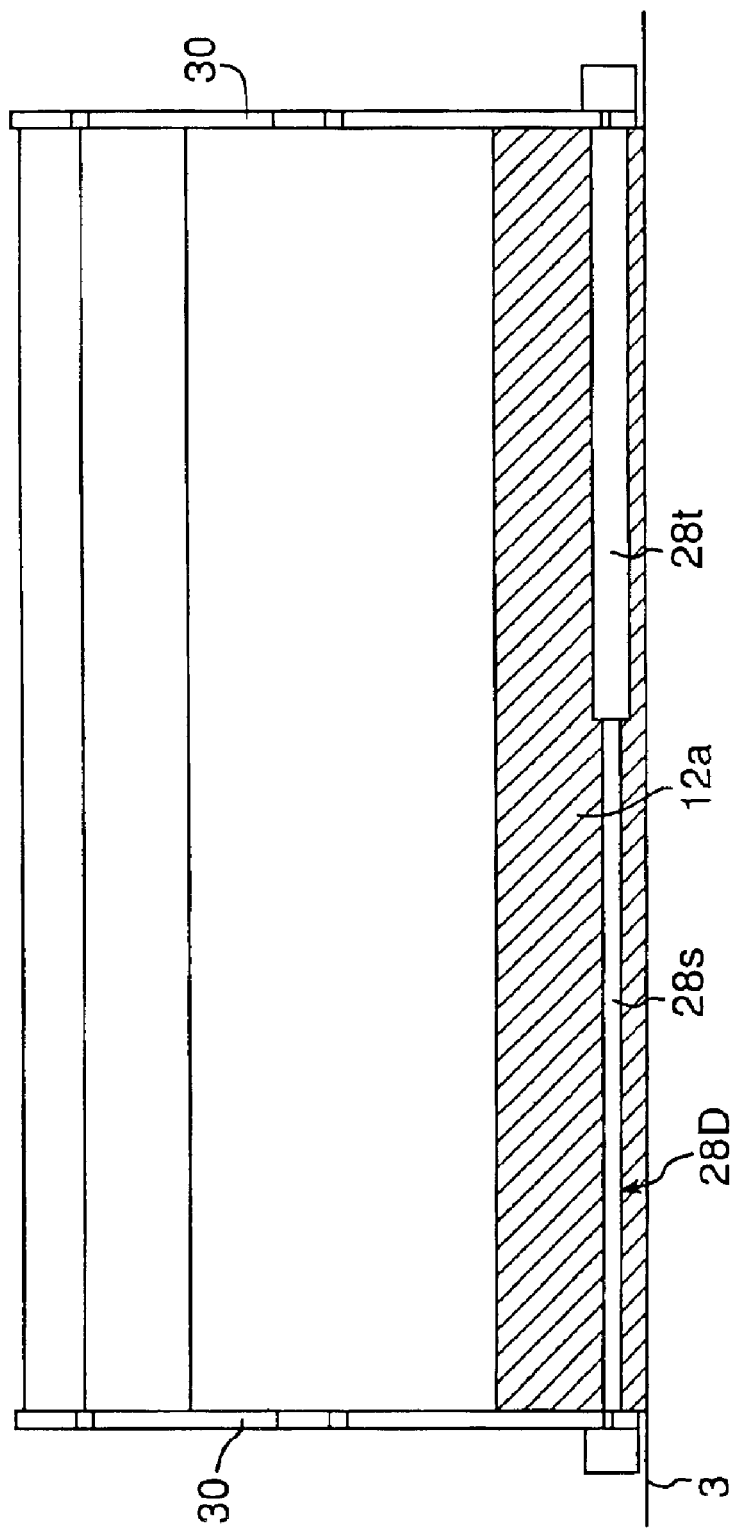
FIG. 26C is a schematic view showing a relation between the pressurizing member and the squeegee of a solder paste printing apparatus according to a modification example of the first embodiment of the present invention (note that the hatching of the squeegee 12a in FIG. 26C is provided so as not to show the cross-section but to clearly show the region of the squeegee 12a)

It is to be noted that the present invention is not limited to the aforementioned embodiments and is able to be put into practice in a variety of forms. For example, with regard to the cross-section shape of the pressurizing member 28D in the direction perpendicular to the axial direction, by varying the diametrical dimension so as to construct the member of a large-diameter portion 28t in the axial direction of the pressurizing member 28D and a small-diameter portion 28s of a diameter smaller than that of the large-diameter portion 28t as shown in FIG. 26C depending on the number and the size of the openings 4 of the printing mask 3, the pressure applied to the solder paste 7 by the pressurizing member 28D can be varied. For example, in the region where a lot of openings 4 of the printing mask 3 exist or are arranged at high density, it is required to increase the filling pressure with the large-diameter portion 28t arranged oppositely, and it is preferable to arrange the small-diameter portion 28s oppositely to provide a normal pressure in the other regions. More concretely, for example, in the high-filling region in which the openings 4, . . . , 4 of a large printing mask 3 of a square having a side of not smaller than 2 mm or the like are concentrated or in the high-filling region in which minute openings 4, . . . , 4 corresponding to the narrow pitch pattern of the 0.3-mm pitch QFP (Quad Flat Package) pattern of an area of about 0.15 mm×1.4 mm, a 0.5-mm pitch CSP (Chip Size Package) pattern of a diameter of about 0.25 mm, or the like, the cross-section shapes of the pressurizing members 28, 28A, 28B, 28C, and 28D perpendicular to the axial direction are increased to enable the application of a higher pressure to the solder paste 7 by the pressurizing members 28, 28A, 28B, 28C, and 28D. On the other hand, other than the aforementioned case, in the low-filling region where openings 4 of a normal size are sparsely arranged, the cross-section shape of the pressurizing members 28, 28A, 28B, 28C, and 28D perpendicular to the axial direction is reduced to enable the application of a pressure lower than in the high-density region to the solder paste 7 by the pressurizing members 28, 28A, 28B, 28C, and 28D.

(Third Embodiment)

In the solder paste printing apparatus of the third embodiment of the present invention, as shown in FIG. 20 through FIG. 23, the pressurizing member 28 of a round bar is rotated in the direction opposite to the rolling direction of the solder paste 7.

The pressurizing member 28 of a round bar is rotatably supported by a pair of brackets 30 and 30, one end of the pressurizing member 28 is made to project from one bracket 30, and a pulley 53 is fixed to the projecting end. A motor 49 is arranged in the vicinity of the pressurizing member 28 of the one bracket 30, and a pulley 52 fixed to a rotary shaft of motor 49 and the pulley 53 located at the projecting end portion of the pressurizing member 28 are connected to each other by means of a belt 54. With this arrangement, if the rotary shaft of the motor 49 is rotated counterclockwise in FIG. 20, then the pressurizing member 28 is to be rotated counterclockwise (in a direction of the arrow Y in FIG. 22) via the pulley 52, the belt 54, and the pulley 53, by which the pressurizing member 28 can be rotated in the direction opposite to the flow (rotational flow in the direction of the arrow X in FIG. 22) of the rolling solder paste 7 during printing in the rightward direction in FIG. 20. If the motor 49 is connected to the control unit 24, then the motor 49 can be controlled to be rotatively driven by the control unit 24 during printing or immediately before the printing.

It is to be noted that the rotary mechanism of the pressurizing member 28 may connect the motor 49 directly to the pressurizing member 28 or take similar measures, and the present invention is not limited to the aforementioned construction.

Figure 22:
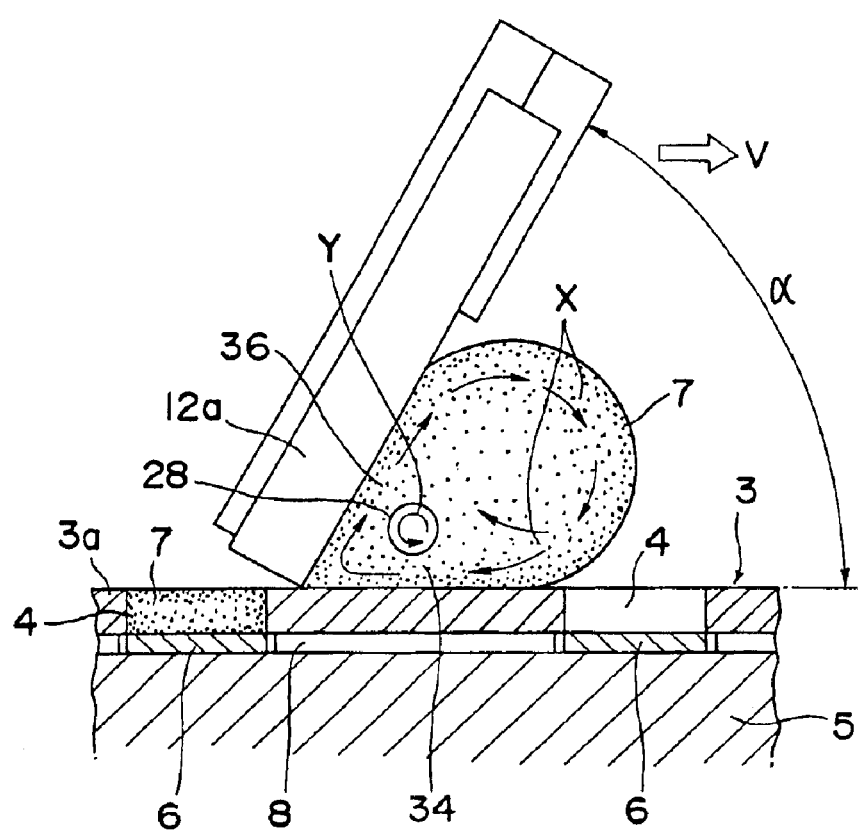
FIG. 22 is a view showing the rolling state of the solder paste of the solder paste printing apparatus of the third embodiment.
Figure 23:
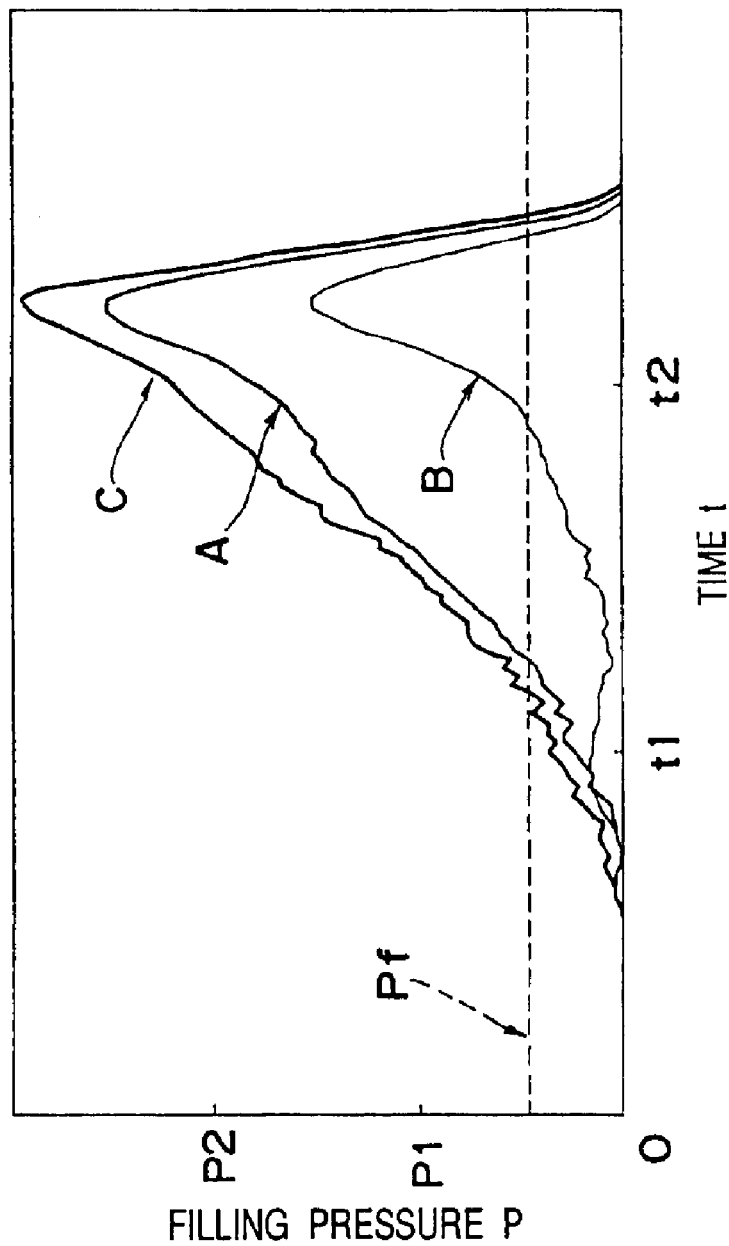
FIG. 23 is a graph showing the characteristics of the filling pressures of a squeegee provided with the pressurizing member of the solder paste printing apparatus of the third embodiment, a squeegee provided with the pressurizing member of the solder paste printing apparatus of the first embodiment, and a squeegee provided with no pressurizing member.

According to the aforementioned construction, as shown in FIG. 22, by rotating the pressurizing member 28 in the direction of the arrow Y opposite to the direction of the arrow X of the direction in which the rolling solder paste 7 flows during printing, it is more difficult for the solder paste 7 to pass through the narrow path 34 and the flow path 36 than when the pressurizing member 28 is fixed so as to be unable to rotate. In general, the pressure of the fluid such as the solder paste 7 is increased when the fluid becomes uneasy to flow, and therefore, as shown in FIG. 23C, the filling pressure is further increased than in the case of. FIG. 23A (corresponding to FIG. 5A). Therefore, a shortage of filling attributed to a shortage of filling pressure of the solder paste is eliminated dissimilar to the conventional case. That is, FIG. 23C shows the case of a squeegee provided with the pressurizing member of the solder paste printing apparatus of the third the embodiment. The reference letter A indicates the case of the squeegee provided with the pressurizing member of the solder paste printing apparatus of the first embodiment. The reference letter B indicates the case of a squeegee provided with no pressurizing member.

(Fourth Embodiment)

Figure 24:
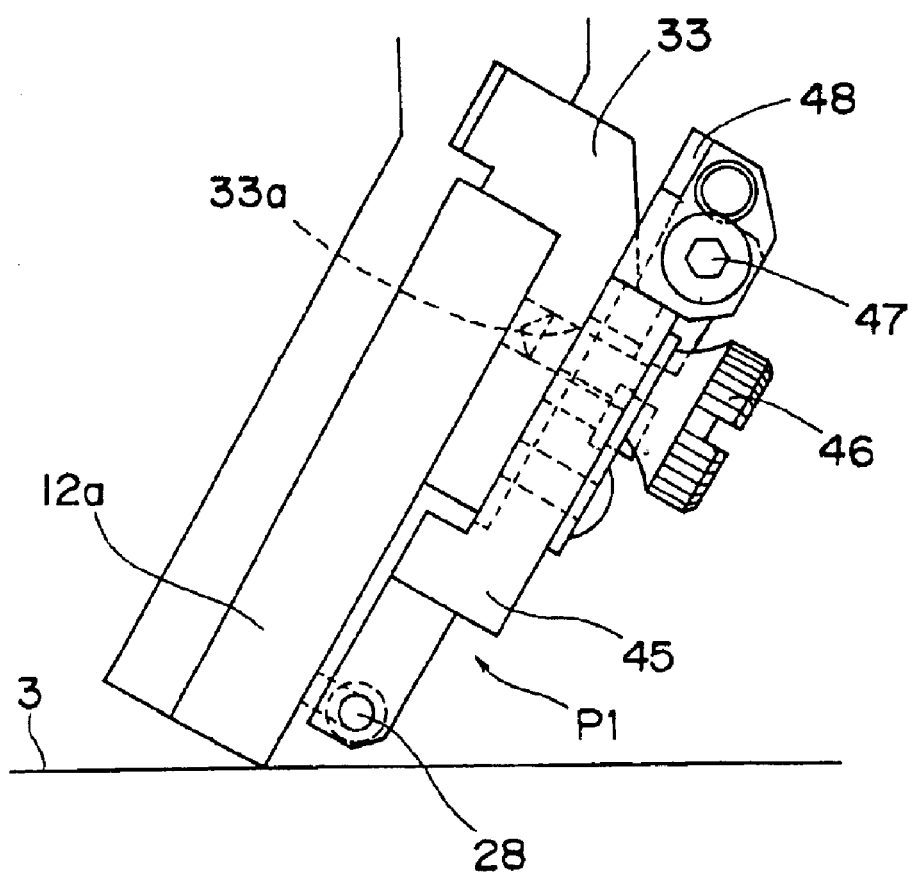
FIG. 24 is an enlarged side view of a state in which the pressurizing member of a solder paste printing apparatus according to a fourth embodiment of the present invention is positioned in a pressurizing position.
Figure 25:
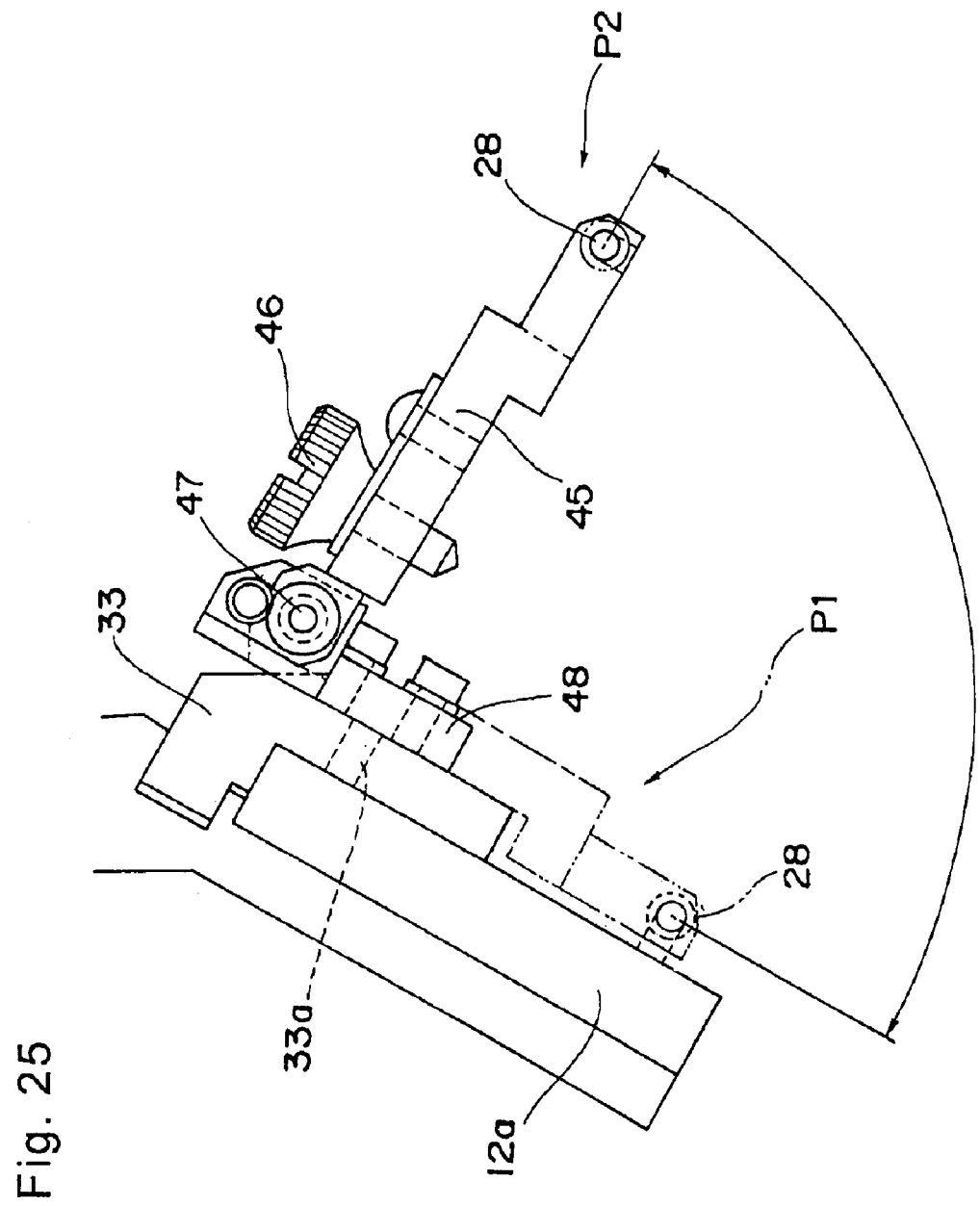
FIG. 25 is an enlarged side view of a state in which the pressurizing member of the solder paste printing apparatus of the fourth embodiment is retreated in a retreated position.

In the solder paste printing apparatus of the fourth embodiment of the present invention, as shown in FIG. 24 and FIG. 25, the pressurizing member 28 may be mounted on the squeegees 12a and 12b while being able to be opened and closed by an openable mechanism, facilitating the cleaning of the lodging solder paste and the like.

Although the pressurizing members 28A, 28B, and 28C can also be applied similarly to the pressurizing member 28, the pressurizing member 28 will be described as a representative for the simplicity of explanation.

In the fourth embodiment, both ends of the pressurizing member 28 are supported not by the bracket 30 but by a retention member 45. The retention member 45 is mounted on a holder 33 for holding the squeegee 12a via a fitting member 48 while being able to pivot at an angle of at least 90 degrees around a pin 47 for opening and closing, i.e., between a pressurizing position P1 where the pressurizing member 28 applies a pressure to the solder paste 7 and a retreated position P2 where the applying of pressure is released and able to be positioned and held in each position. A fixing bolt 46 is mounted on the retention member 45 while being rotatably held and unable to be dismounted. By screwing the fixing bolt 46 into a threaded hole 33a of the holder 33, the retention member 45 contacts the holder 33, enabling the positioning of the pressurizing member 28 supported by the retention member 45 in the pressurizing position P1.

Therefore, during the solder paste printing, as shown in FIG. 24, by fixing the retention member 45 to the holder 33 by means of the fixing bolt 46 and positioning and holding the pressurizing member 28 in the pressurizing position P1, a specified pressure is applied to the solder paste 7. When the cleaning of the squeegee 12a is needed at the time of the end of the solder paste printing, board type change, or the like, as shown in FIG. 25, by loosening the fixing bolt 46, pulling out the fixing bolt 46 from the threaded hole 33a of the holder 33, thereafter rotating the retention member 45 counterclockwise at an angle of 90 degrees around the pin 47 for opening and closing and positioning, and holding the member in the retreated position P2, the retention member 45 can be kept in the open state.

With the above-mentioned construction, the pressurizing member 28 is separated from the squeegee 12a during, for example, cleaning. Therefore, the squeegee does not become an impediment, and the cleaning work of the solder paste 7 that has stuck to the squeegee 12a can be easily performed, improving the maintenance.

Figure 27:
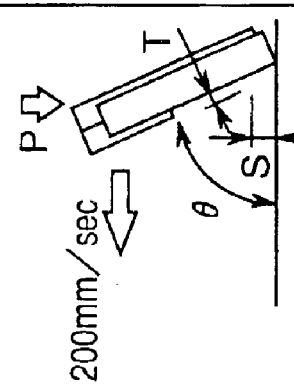
FIG. 27 is an explanatory view showing a relation of arrangement dimensions of a pressurizing member of a round bar.

FIG. 27 shows a graph and an explanatory view of a change depending on the arrangement of the pressurizing member 28 of a round bar. It is assumed that an interval S of the narrow path 34 is 1 mm, 2 mm, 3 mm, and 5 mm when an interval T of the flow path 36 is 1 mm, 2 mm, and 3 mm when the angle of inclination θ of the squeegee is fixed to 60 degrees. At this time, the pressure given to the solder paste, i.e., the application pressure P is measured, and a solder rolling property, a solder scraping state on the printing mask and a printing state are evaluated. The solder rolling property, the solder scraping state on the printing mask and the printing state are visually evaluated, when the mark ○ indicates the satisfactory state and the mark Δ represents the unsatisfactory state. According to this FIG. 27, the solder rolling property, the solder scraping state on the printing mask, and the printing state are all satisfactory when the interval S of the narrow path 34 is 1 mm, 2 mm, and 3 mm when the interval T of the flow path 36 is 1 mm and 2 mm. However, when the interval S of the narrow path 34 is 5 mm, the solder rolling property and the printing state become all defective.

According to this FIG. 27, it can be understood that the interval T of the flow path 36 is preferably about 1 mm to 3 mm and that the interval S of the narrow path 34 is preferably about 1 mm to 3 mm.

Figure 28A:
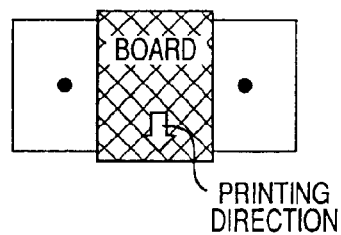
FIG. 28A and FIG. 28B are an explanatory view showing a relation between a board and the printing direction and a graph showing a filling pressure profile of a relation between the filling pressure and time when the printing speed is changed in nine steps from 40 mm/sec to 400 mm/sec with no pressurizing member provided for the squeegee.
Figure 28B:
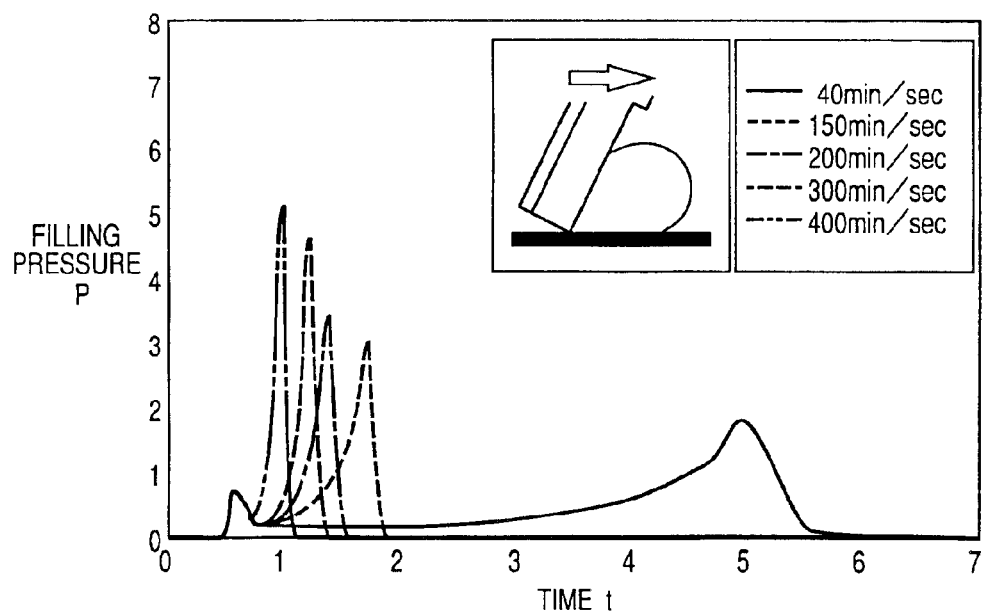
Figure 29:
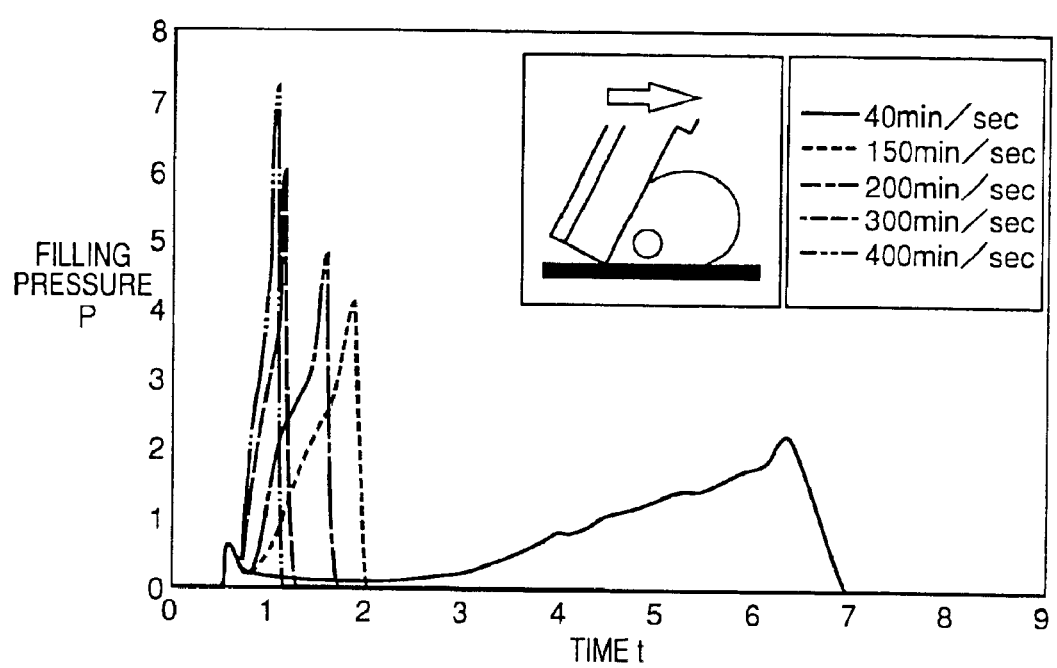
FIG. 29 is a graph showing a filling pressure profile of the relation between the filling pressure and time when the printing speed is changed in nine steps from 40 mm/sec to 400 mm/sec with a pressurizing member of a round bar provided for the squeegee.

FIG. 28A, FIG. 28B, and FIG. 29 show a relation between the printing speed and the filling pressure profile. FIG. 28A is an explanatory view showing a relation between the board and the printing direction. FIG. 28B shows a filling pressure profile of a relation between the filling pressure and time when the printing speed is changed in five steps from 40 mm/sec to 400 mm/sec when the squeegee is provided with no pressurizing member. FIG. 29 shows a filling pressure profile of a relation between the filling pressure and time when the printing speed is changed in five steps from 40 mm/sec to 400 mm/sec when the squeegee is provided with the pressurizing member 28 of a round bar.

FIG. 30 shows a relation between the type (viscosity) of the solder paste and the printing conditions when the squeegee is provided with no pressurizing member. FIG. 31 shows a relation between the type (viscosity) of the solder paste and the printing conditions when the squeegee is provided with the pressurizing member 28 of a round bar. In FIG. 30 and FIG. 31, the state of the scraping state, the solder rolling property on the printing mask, and the filling (printing) state are visually evaluated. The mark ○ represents the satisfactory state, the mark Δ represents the unsatisfactory state, and the mark x represents the defective state. The printing pressure is set to 0.08 to 0.20 N/mm.

Comparing FIG. 30 with FIG. 31, it can be understood that the scraping state, the solder rolling property on the printing mask, and the filling (printing) state become satisfactory even when the printing speed is fast in the presence of the pressurizing member of a round bar of FIG. 31 in all the cases of the solders of the materials A through I.

It is to be noted that, by appropriately combining arbitrary embodiments out of the aforementioned various embodiments, the effects owned by the embodiments can be produced.

According to the present invention, the pressurizing member, which forms the narrow path between the member and the printing mask and the flow path between the member and the squeegee during printing, is provided in the vicinity of the edge portion of the squeegee. With this arrangement, the rolling solder paste during the squeegee movement passes through the narrow path, by which a higher pressure than in the conventional case can be applied. Therefore, even if the squeegee speed is increased, the solder paste is sufficiently filled into the openings when the pressurizing member faces the openings of the printing mask, and a shortage of filling is eliminated.

Moreover, the pressurizing member is mounted so as to be movable between the pressurizing position where a pressure is applied to the solder paste and the retreated position where the applying of pressure is released, with respect to the squeegee. With this arrangement, when the cleaning of the squeegee is needed at the time of the end of the solder paste printing, board type change, or the like, the squeegee can be positioned in the retreated position. Therefore, the pressurizing member can be separated from the squeegee during cleaning or the like and does not become an impediment, by which the cleaning work of the solder paste that has stuck to the squeegee can easily be performed, improving the maintenance.

Moreover, when the introducing portion of the cross-section shape of the narrow path is formed into a roughly wedge-like cross-section shape with the curved surface or the like of the round bar of the pressurizing member, the pressure can be increased while drawing the solder paste into the narrow path.

Moreover, when the pressurizing member has the built-in heat-generating element to appropriately heat the solder paste, the viscosity of the solder paste is maintained constant by maintaining the solder paste temperature constant, and stable filling characteristics can be obtained.

Moreover, when the pressurizing member is constructed of a round bar, there is no need for subjecting the material to the complicated mechanical processing in manufacturing the pressurizing member, and the pressurizing member can be provided with a simple construction. Therefore, the manufacturing cost is not increased.

Moreover, when a pair of squeegees is provided and both the squeegees are consistently brought in contact with the printing mask at least during printing, the take-out of the solder paste by the rising squeegees is prevented, and the set amount of solder paste can be consistently kept on the printing mask. Moreover, the squeegee does not vertically move during printing. Therefore, the printing time can be reduced, and the productivity can be improved.

Moreover, if the printing is repetitively performed with the conventional construction, the solder paste is protruded from both sides of the squeegee. The solder paste protruded therefrom does not naturally return, and the operator collects and puts back the paste at regular intervals of time or dispose of it. In contrast to this, by applying a pressure to the solder paste with the pressurizing member arranged, the solder paste rolls around the pressurizing member and comes to surround the pressurizing member. Therefore, even if the printing is repeated, a large amount of solder paste is not protruded dissimilar to the conventional case. Therefore, the work of the operator can be reduced and the productivity can be improved.

Furthermore, the pressurizing member is merely supported with interposition of a specified gap to the squeegee, and no tightly closed portion exists. Therefore, when cleaning the squeegee and the like, the cleaning can be simply performed.

Moreover, when the narrow path has a roughly wedge-shaped cross-section shape, the solder paste is efficiently introduced by the inclined surface of the pressurizing member, and the pressure of the solder paste that is flowing between the pressurizing member and the surface of the printing mask can be efficiently increased.

Moreover, when the height of the pressurizing member from the surface of the printing mask is lower than the rolling height of the solder paste during printing, and the pressurizing member sinks in the rolling solder paste during the printing, the pressurizing member exerts no bad influence on the rolling of the solder paste, and the pressure of the solder paste that is flowing between the member and the surface of the printing mask can be increased.

Moreover, when the pressurizing member is fixed so as to be unable to rotate, the member can be mounted with a simple construction.

Moreover, by varying the cross-section shape perpendicular to the axial direction of the pressurizing member in the axial direction of the pressurizing member depending on the number and the size of the openings of the printing mask, the pressure applied to the solder paste by the pressurizing member can be varied.

Moreover, when the pressurizing member is rotated in the direction opposite to the direction of the flow of the rolling solder paste during printing, it is more difficult for the solder paste to pass through the narrow path and the flow path than when the pressurizing member is arranged fixed so as to be unable to rotate. In general, the pressure of the fluid such as the solder paste is increased when the fluid becomes uneasy to flow, and therefore, the filling pressure is further increased. Therefore, a shortage of filling attributed to a shortage of filling pressure of the solder paste is eliminated dissimilar to the conventional case.

(Fifth Embodiment)

The fifth embodiment of the present invention will be described in detail below with reference to FIG. 32 through FIG. 41. In each figure, the same components or the constituent elements that produce the same functions are denoted by the same reference numerals, and no description is provided for them.

In the conventional solder paste printing apparatus, it is required to manually appropriately set various printing conditions of squeegee travel speed, squeegee contact pressure, and so on during printing on the basis of the rule of thumb in order to maintain a satisfactory printing state while increasing the printing speed, and this setting work has required skill.

Accordingly, the solder paste printing apparatus and printing method of the fifth embodiment of the present invention solves the aforementioned conventional issues and enables a satisfactory printing state to be stably maintained while increasing the printing speed by simply setting optimum printing conditions.

Figure 32:
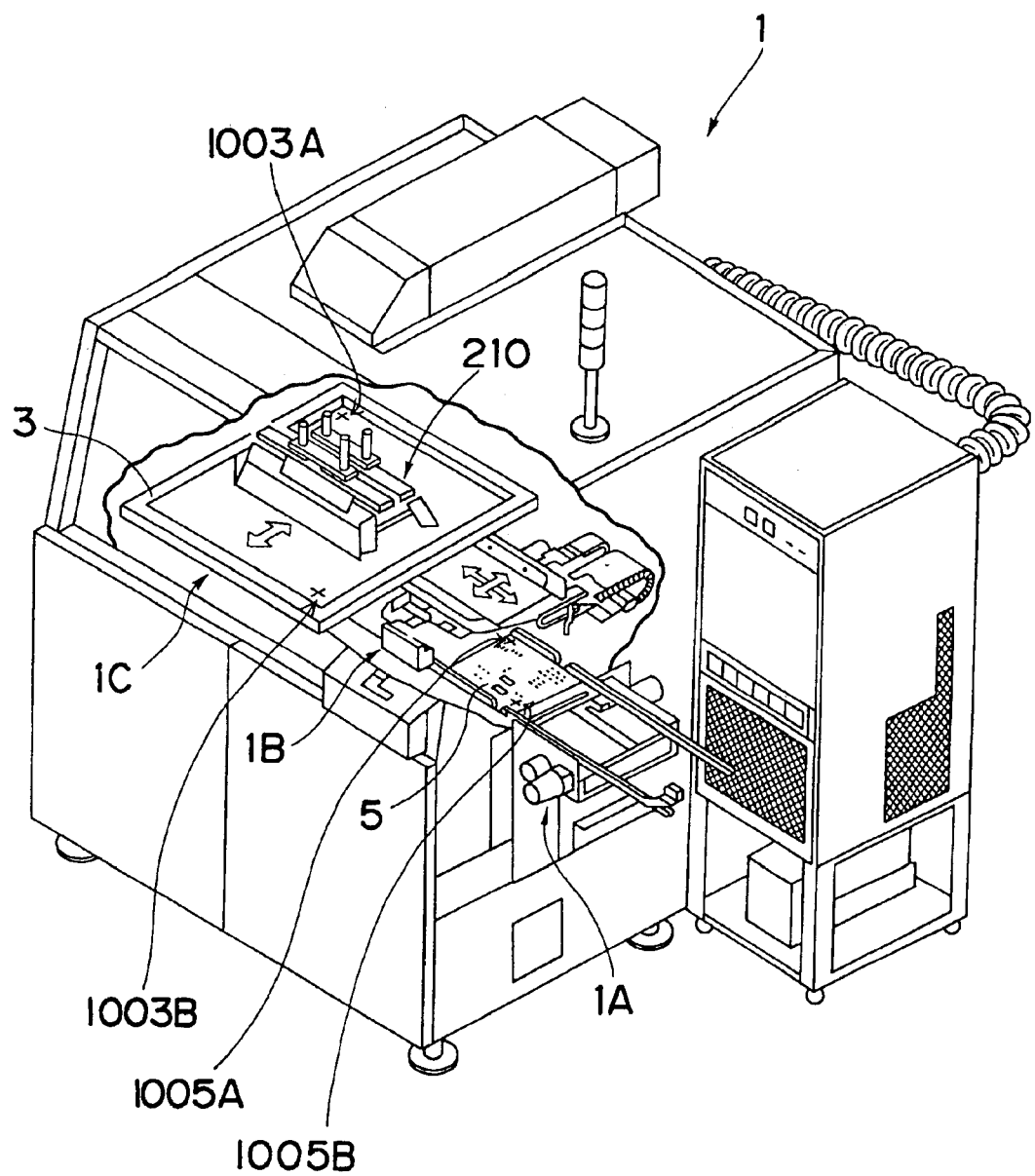
FIG. 32 is an overall perspective view showing a solder paste printing machine on which the solder paste printing apparatus according to a fifth embodiment of the present invention is mounted, with a part thereof removed.

FIG. 32 is a view of a solder paste printing machine 1 equipped with the solder paste printing apparatus 210 of the fifth embodiment, with a part thereof removed. In FIG. 32, the solder paste printing machine 1 is constructed of a printed board conveying section 1A for loading and unloading a printed board (circuit board) 5 that serves as one example of the circuit-forming body that is the object on which the solder paste is to be printed into and from the printing machine 1, a table section 1B which moves to a portion under the printing mask 3 and on which the printed board 5 is placed, and a printing section 1C for printing a solder paste on the upper surface of the printed board 5 that is positioned under the lower surface of the printing mask 3 and layered with the mask and the printing mask 3 by means of a squeegee. If the solder paste printing apparatus 10 of the first through fourth embodiments is arranged in place of the solder paste printing apparatus 210 of FIG. 32, a solder paste printing machine equipped with the solder paste printing apparatus 10 of the first through fourth embodiments is provided.

According to the solder paste printing machine 1 equipped with the solder paste printing apparatus 210 of this fifth embodiment, the printed board conveying section 1A receives the printed board 5 loaded from a printed board stocker and a printed board conveyance line and supplies the printed board 5 to the table section 1B arranged inside the printing machine. Then, the table section 1B positions and fixes the supplied printed board 5 and moves the board into a specified position under the lower surface of the printing mask 3 of the printing section 1C. When the printing in the printing section 1C ends, the table section 1B conveys the printed board 5 from the printing section 1C to the printed board conveying section 1A. Thereafter, the printed board conveying section 1A takes out the printed board 5 from the table section 1B and discharges the printed board 5 to an unloading port (not shown).

Figure 33:
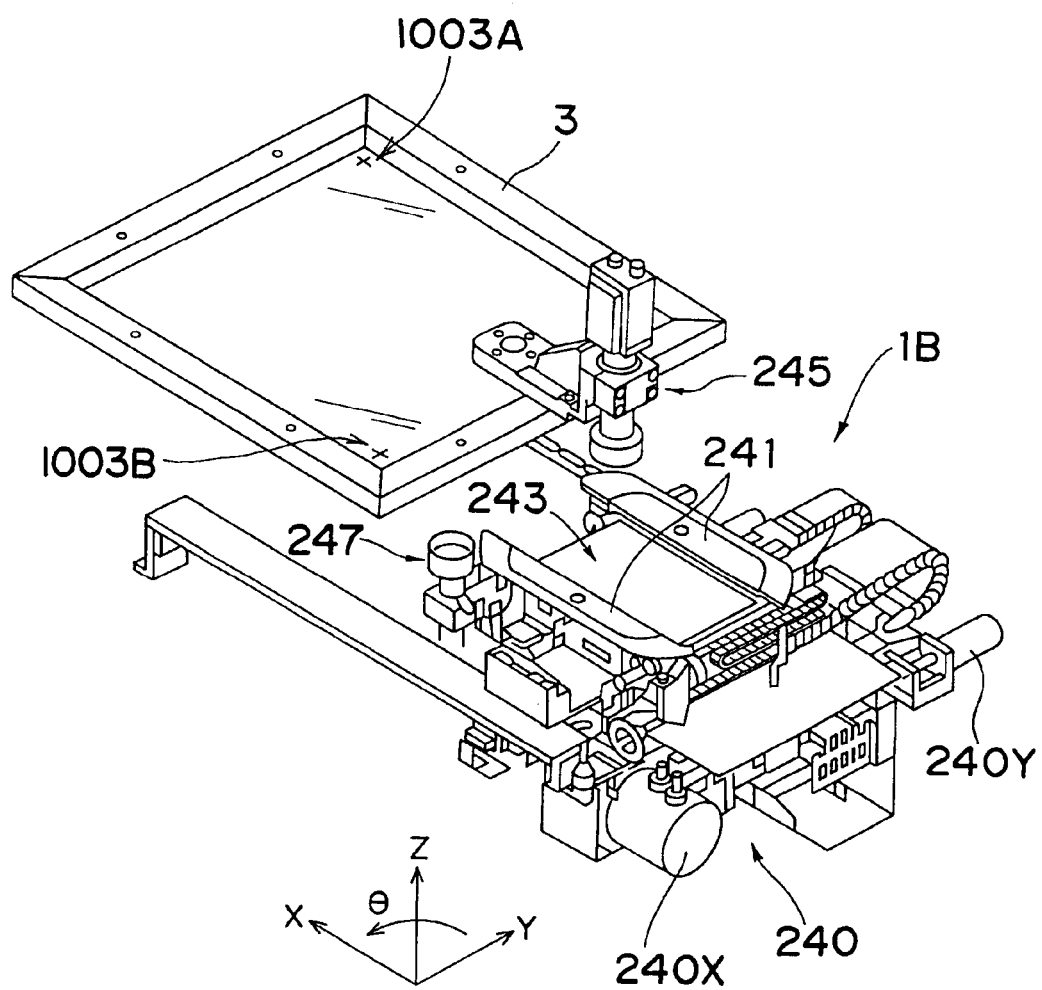
FIG. 33 is a perspective view showing the construction of a table section 1B of the solder paste printing apparatus of the fifth embodiment.

FIG. 33 shows the detailed construction of the table section 1B. The table section 1B is provided with a board placement base 243 that fixes the printed board 5 by a pair of holding members 241 and is able to be moved and rotated by motor control in the directions of X, Y, Z, and θ shown in FIG. 33, a board recognizing camera 245 for recognizing the positional alignment marks (refer to 1005A and 1005B) on the printed board 5 and a printing mask recognizing camera 247 for recognizing the alignment marks (refer to 1003A and 1003B) on the printing mask 3.

The board recognizing camera 245 images the positional alignment marks 1005A and 1005B preparatorily provided on the printed board 5 that is the object to be printed supplied to the table section 1B by the printed board conveying section 1A. By recognizing the mark positions through the image processing of this pick-up image, the printed board 5 can be positioned with high accuracy in the specified position for the printing.

The printing mask recognizing camera 247 images the positional alignment marks 1003A and 1003B preparatorily provided on the printing mask 3 for the printing of the printed board 5. By recognizing the mark positions through the image processing of this pick-up image, the printed board 5 can be positioned with high accuracy in the proper position corresponding to the pattern of the printing mask 3.

Figure 34:
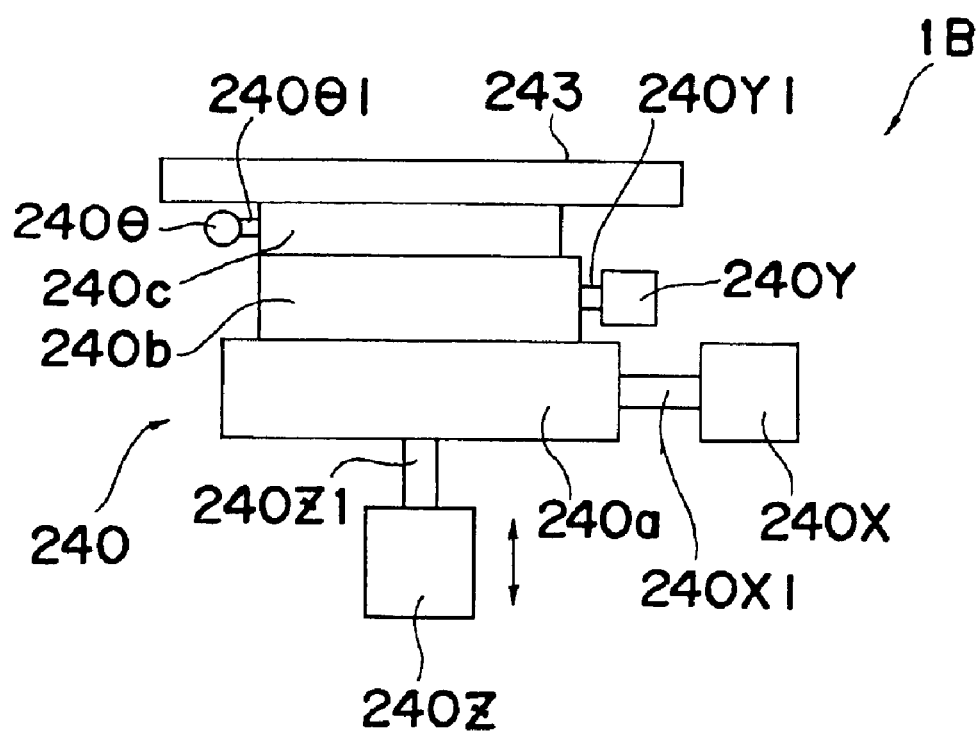
FIG. 34 is a schematic structural view of the table section 1B of FIG. 33.

A loader and an unloader, which are generally widely used, can be used for the printed board conveying section 1A. Moreover, as shown in FIG. 34, a four-axis stage 240, which has a total of four axes of X, Y, Z, and θ and are generally widely used, can be used for the table section 1B. That is, in FIG. 34, a threaded shaft 240Z1 is rotated forwardly and reversely by forwardly and reversely rotating, for example, a motor 240Z in the Z-direction, and then, an X-stage 240a to which a nut member meshed with the threaded shaft 240Z1 is fixed advances and retreats in the Z-direction. In an X-direction perpendicular to the Z-direction, a motor 240X is rotated forwardly and reversely to rotate a threaded shaft 240X1 forwardly and reversely, and then, a Y-stage 240b to which a nut member meshed with the threaded shaft 240X1 is fixed advances and retreats in the X-direction. Moreover, in a Y-direction perpendicular to the X-direction, a motor 240Y is rotated forwardly and reversely to rotate a threaded shaft motor 240Y1 forwardly and reversely, and then, a θ-stage 240c to which a nut member meshed with the threaded shaft motor 240Y1 advances and retreats in the Y-direction. Moreover, in the θ-direction around the center axis of the board placement base 243, a motor 240θ is rotated forwardly and reversely to rotate a threaded shaft 240θ1 forwardly and reversely, and the board placement base 243 to which a nut member meshed with the threaded shaft is fixed rotates forwardly and S reversely clockwise or counterclockwise in the θ-direction.

Figure 35:
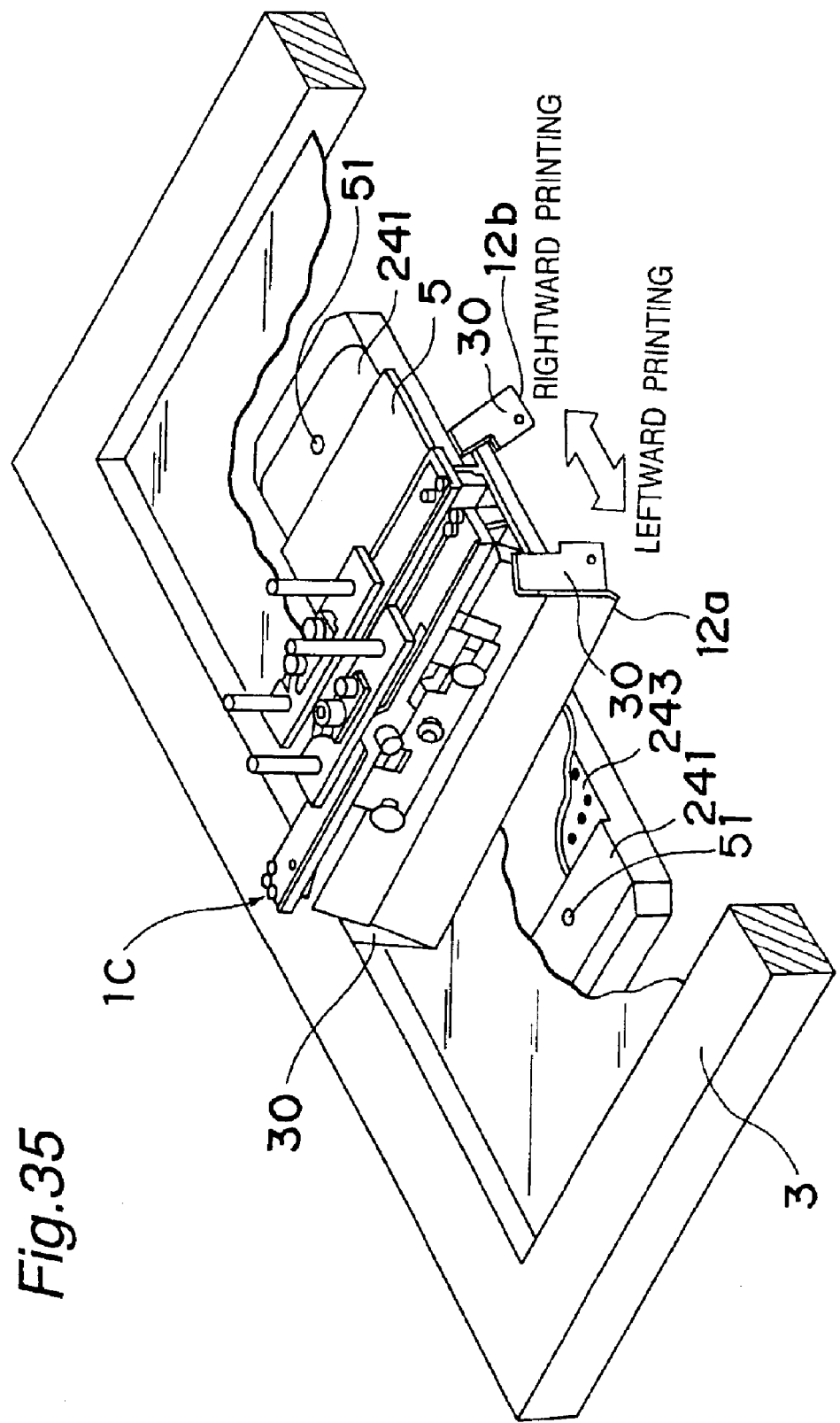
FIG. 35 is a perspective view showing the construction of a printing section.

FIG. 35 shows a perspective view of the printing section 1C with a part thereof shown sectionally. Although the detailed construction of the printing section 1C will be described later, the section roughly has a construction such that the solder paste 7 is printed on the printed board 5 by moving a pair of squeegees 12a and 12b horizontally on the printing mask 3 in both the rightward and leftward printing directions in a state in which the printed board 5 fixed on the board placement base 243 by the holding members 241 is arranged under the printing mask 3. In this case, the squeegee 12a is used during the rightward printing, and the squeegee 12b is used during the leftward printing. However, it is also acceptable to perform the rightward printing or the leftward printing or the rightward printing and leftward printing by concurrently bringing both the squeegees 12a and 12b in contact with the printing mask 3 as in the second embodiment.

Figure 36:
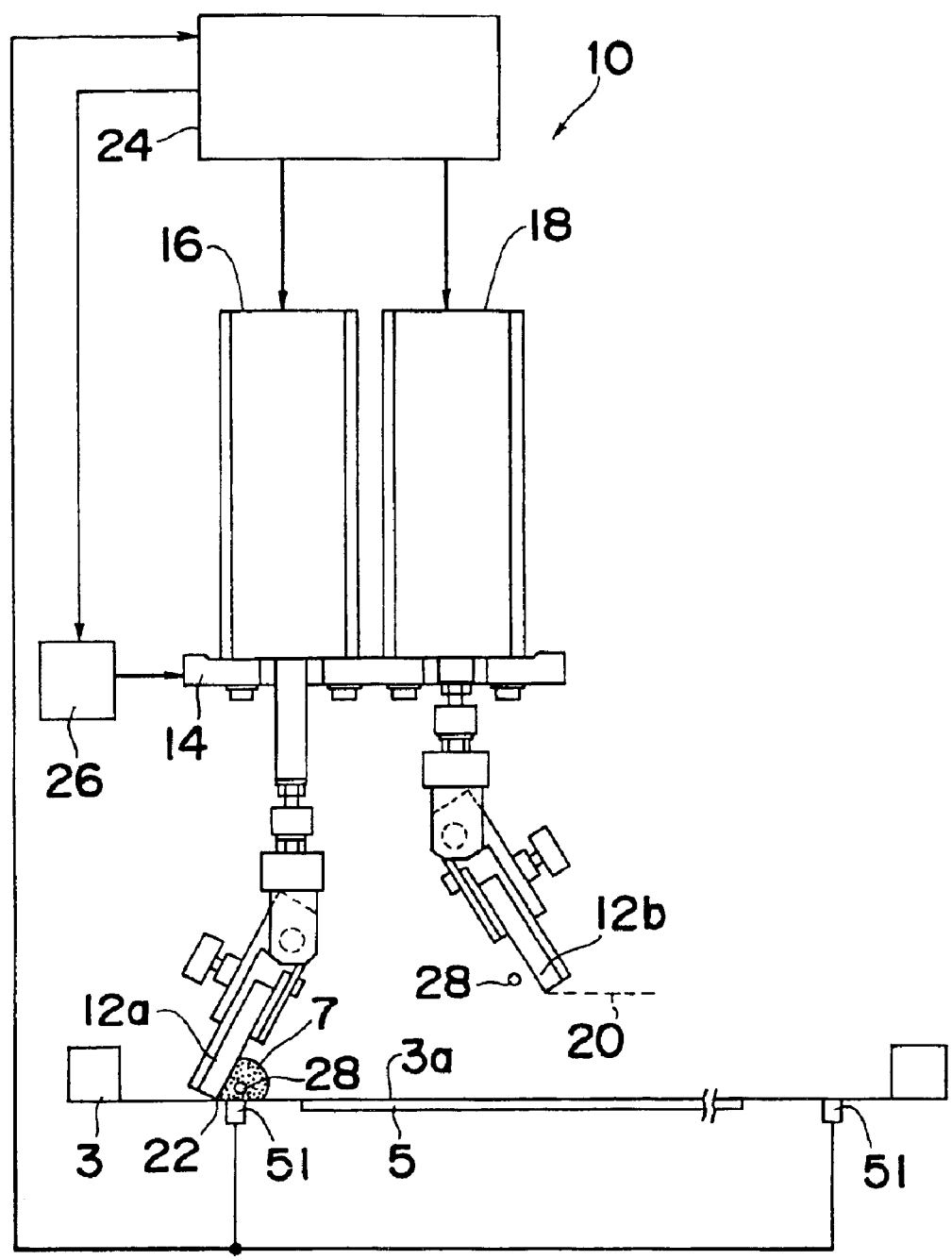
FIG. 36 is an enlarged side view showing the construction of the printing section shown in FIG. 35.

FIG. 36 is a view showing the schematic construction of the periphery of the squeegee of a solder paste printing apparatus 210 that is one concrete example of the printing section 1C. The solder paste printing apparatus 210 of the fifth embodiment fills the solder paste 7 into a number of openings 4 of the printing mask 3 during printing. Moreover, the squeegees 12a and 12b that perform the scraping operation of the solder paste 7 on the printing mask 3 are each constructed so as to be able to move up and down between the standby position 20 where the lower end of the squeegee is positioned above the printing mask 3 and the operating position 22 where the lower end of the squeegee is put in contact with the printing mask 3 as in the first embodiment by the squeegee up-and-down drive devices 16 and 18 each of which is constructed of an air cylinder or the like mounted on the base plate 14 of the squeegee head that constitutes the solder paste printing apparatus 210. The squeegees 12a and 12b are formed into a plate-like shape, and, for example, hard rubber such as urethane rubber is adopted as the material.

The base plate 14 is moved in the leftward and rightward printing directions by the printing drive device 26 such as a motor of which the operation is controlled by the control unit (control means) 24. FIG. 36 shows the state in which the rightward printing is being performed, where one squeegee 12a located on the left-hand side in FIG. 36 moves down to the operating position 22 where the filling and scraping operations are performed, and the other squeegee 12b located on the right-hand side in FIG. 34 is moved up to the standby position 20.

In the state in which the squeegee 12a or 12b is located in the operating position 22, the edge portion of each squeegee comes in contact with the surface 3a of the printing mask 3 in a state in which the proper application pressure is applied to the surface 3a of the printing mask 3 and performs the filling of the solder paste 7 into the openings 4 of the printing mask 3 and the scraping operation on the printing mask surface 3a.

A pressurizing member 28 described in detail later is provided in the vicinity of the edge portions of the squeegees 12a and 12b.

Moreover, the printing drive device 26 and the squeegee up-and-down drive devices 16 and 18 of the base plate 14 are each connected to the control unit 24 that executes overall operation control of the solder paste printing apparatus 210, and the control unit 24 controls the right and left movement control of both the squeegees 12a and 12b by means of the drive device 26 and the up-and-down movement control of the up-and-down drive devices 16 and 18.

Figure 37:
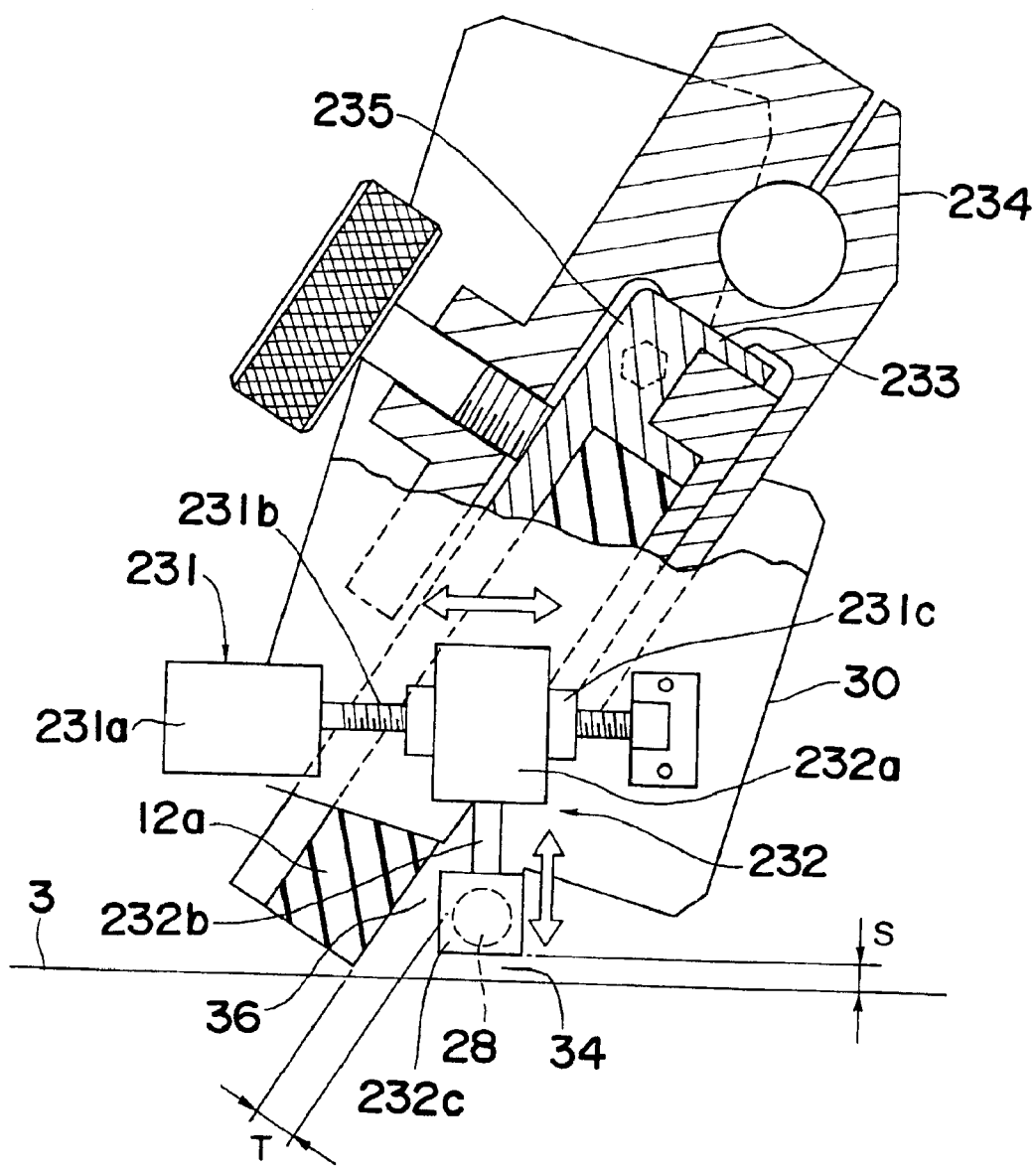
FIG. 37 is a sectional side view showing the construction of the pressurizing member shown in FIG. 36 with a part thereof removed (note that the hatching of the squeegee 12a in FIG. 37 is provided so as not to show the cross-section but to clearly show the region of the squeegee 12a)

FIG. 37 is a side view showing the mounting construction of the pressurizing member 28 provided in the vicinity of the edge portion of the squeegee 12a. Since the other squeegee 12b is similarly constructed, only the construction of one squeegee 12a is described here. It is to be noted that the squeegee 12a (12b) and the pressurizing member 28 are constructed so as to be able to adjust the relative mounting positions by being independently supported, as described later.

In this case, the pressurizing member 28 is a rod body of a circular cross-section shape similar to that of the first embodiment. The plane of the squeegee 12a and the center axis of the pressurizing member 28 are supported parallel to each other in the lengthwise direction that is one example of the axial direction of the squeegee 12a in the vicinity of the edge portion of the squeegee 12a while being able to be moved horizontally and vertically by a pressurizing member horizontal movement mechanism (referred to as a horizontal movement mechanism hereinafter) 231 and a pressurizing member vertical movement mechanism (referred to as a vertical movement mechanism hereinafter) 232, which are mounted on a pair of brackets 30 arranged at both end portions of the rod body.

As the horizontal movement mechanism 231 and the vertical movement mechanism 232, for example, a combination of a thread shaft driven to be forwardly and reversely rotated by a motor and a nut meshed with the thread shaft, a well-known movement mechanism such as a solenoid capable of performing positional control with excellent accuracy, or the like can be used. More specifically, for example, the horizontal movement mechanism 231 is constituted of a thread shaft 231b driven to be forwardly and reversely rotated by a motor 231a and a nut member 231c meshed with the thread shaft 231b with a motor 232a of the vertical movement mechanism 232 fixed to the nut member 231c. The vertical movement mechanism 232 is constituted of a thread shaft 232b driven to be forwardly and reversely rotated by the motor 232a and a nut member 232c meshed with the thread shaft 232b and supporting the end portion of the pressurizing member 28.

Moreover, the squeegee 12a is held by a holder cover 34 via a holder 33, and the brackets 30 are fixed to the holder 33 by means of a bolt and nut 35.

When the squeegee 12a comes in contact with the printing mask 3, the pressurizing member 28 forms a narrow path 34 of a minute interval S between the member and the surface 3a of the printing mask 3. The interval S of this narrow path 34 is adjusted within a range of about 1 mm to 3 mm by controlling the vertical movement mechanism 232.

Moreover, the pressurizing member 28 forms a flow path 36 of an interval T, which becomes the flow path of the rolling solder paste during the solder paste printing between the member and the squeegee 12a (12b). The interval T of this flow path 36 is also adjusted within a range of about 1 mm to 3 mm by controlling the horizontal movement mechanism 231.

Figure 38A:
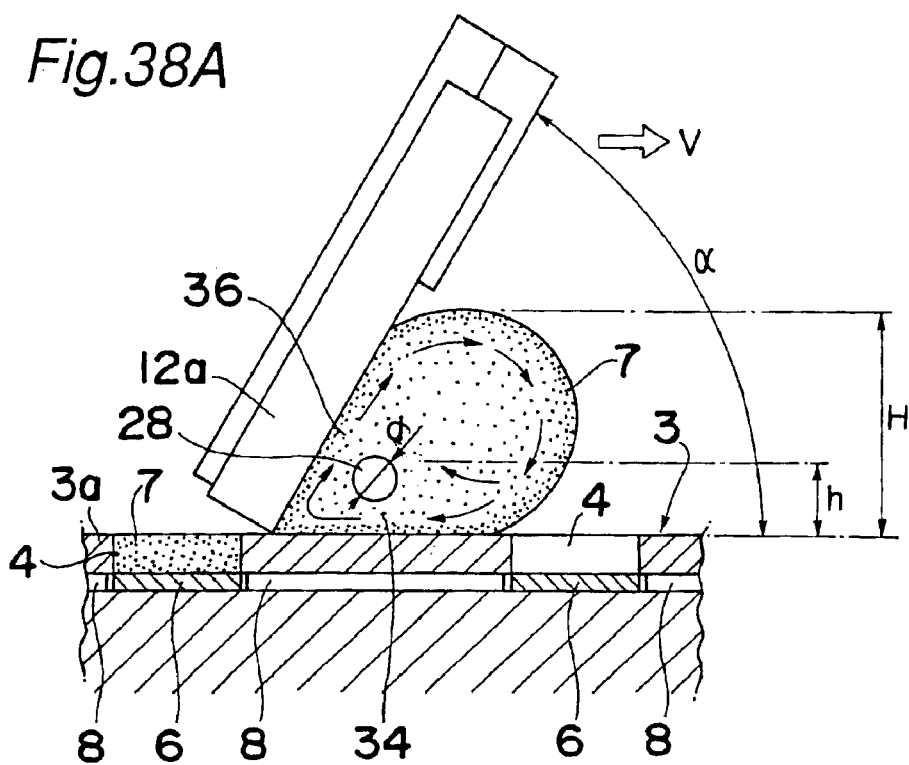
FIG. 38A is a graph showing the rolling state of the solder paste.

By providing the pressurizing member 28 that can adjust the intervals S and T of the above-mentioned narrow path 34 and flow path 36, as shown in FIG. 38A, the solder paste rolling during printing flows on the upper and lower sides of the pressurizing member 28. In particular, the solder paste 7 on the lower side of the pressurizing member 28 comes to circulate so as to pivot counterclockwise as indicated by arrow in the figure by passing through the narrow path 34 located between the member and the printing mask 3, thereafter passing through the flow path 36 located between the squeegee 12a and the pressurizing member 28, moving over or above the pressurizing member 28 to the right-hand side in FIG. 4, and thereafter passing again through the narrow path 34. As a result, the filling pressure can be improved.

When the pressurizing member 28 is constructed of a round bar, the diameter d of the round bar is preferably about 2 to 10 mm and more especially be 5 to 7 mm. Moreover, the shape of the pressurizing member 28 is not limited to the round bar, and those of various shapes of a semicircular cross-section shape, a wedge-like cross-section shape, or the like can be utilized.

As shown in FIG. 38A, the pressurizing member 28 is provided so that the height from the surface 3a of the printing mask 3, i.e., the height h of the upper end surface of the pressurizing member 28 is lower than the rolling height of the solder paste 7 during printing, i.e., the height H of the upper surface of the solder paste 7 that is rolling, and the pressurizing member 28 is provided so as to sink in the rolling solder paste 7 during printing.

By virtue of the formation of the narrow path 34 between the pressurizing member 28 and the printing mask 3, the solder paste that passes through the narrow path 34 during rolling comes to have a higher pressure than in the conventional case in accordance with the movement of the squeegees 12a and 12b. As a result, the solder paste 7 is properly filled into the openings 4 of the printing mask 3, and a shortage of filling attributed to a shortage of filling pressure of the solder paste, which has conventionally occurred, is eliminated.

Since a uniform pressure cannot be obtained in the lengthwise direction when the pressurizing member 28 warps when a high-pressure state occurs in the narrow path 34, it is preferable to form the pressurizing member 28 of a high-rigidity material that hardly causes warp. For example, the pressurizing member 28 is preferably formed of a metal, ceramic, or hard plastic.

Figure 38B:
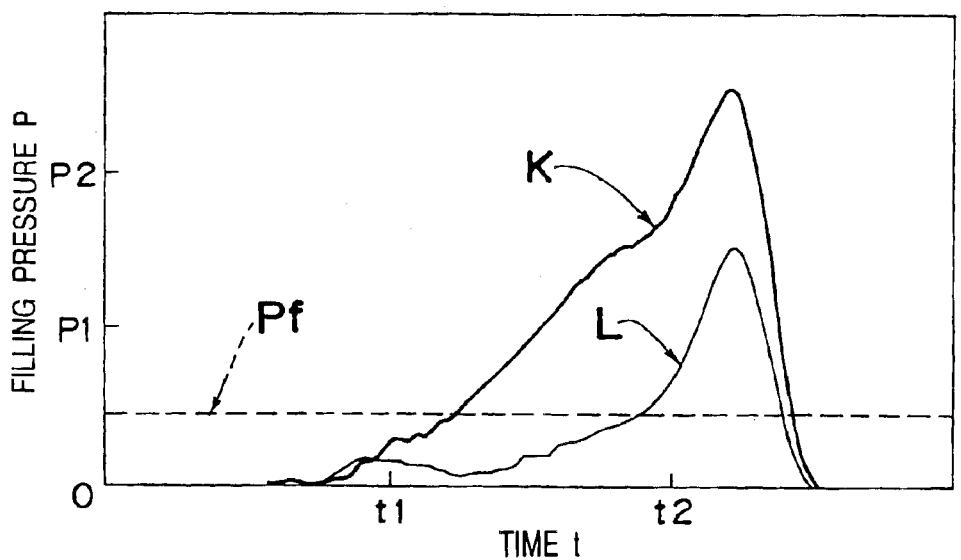
FIG. 38B is a graph showing a time variation in the solder paste filling pressure detected by the pressure sensor.

FIG. 38B is a graph of the results of the measurement of the change in the filling pressure of the solder paste 7 during high-speed squeegee operation at a squeegee speed of 200 mm/sec into the openings 4. In FIG. 38B, the reference letter K represents the characteristics of the squeegees 12a and 12b provided with the pressurizing members 28, and the reference letter L represents the characteristics of the conventional squeegee provided with no pressurizing member 28. It is to be noted that the measurement of this filling pressure was performed with a pressure sensor 51 arranged on the back surface of the printing mask 3 and with an opening 4a provided in the corresponding portion of the printing mask 3, as shown in FIG. 17.

Time t on the horizontal axis of the graph shown in FIG. 38B is the time from the start of the passing of the squeegee over the pressure sensor 51 to the end of the passing, while the filling pressure P on the vertical axis is the pressure detected by the pressure sensor 51 via the solder paste when the squeegee passes over the pressure sensor.

As is apparent from this graph, when the squeegee speed is increased, the conventional squeegee produces a pressure equal to or higher than the required pressure (refer to, for example, Pf in FIG. 38B) needed for the filling only for a short time (refer to L in FIG. 38). On the other hand, the squeegees 12a and 12b provided with the pressurizing members 28 produce the required pressure needed for the filling for a long time even if the squeegee speed is increased (refer to K in FIG. 38B).

As described above, by virtue of the squeegees 12a and 12b provided with the pressurizing members 28, a sufficient amount of solder paste 7 can stably be filled into the openings 4 of the printing mask 3 even if the squeegee speed is increased.

The narrow path 34 preferably has a gap of about 1 mm to 3 mm generated between the path and the printing mask 3 as described hereinabove, and it is only required to generate a gap of about 0.5 mm to 10 mm between the path and the printing mask 3.

Figure 39:
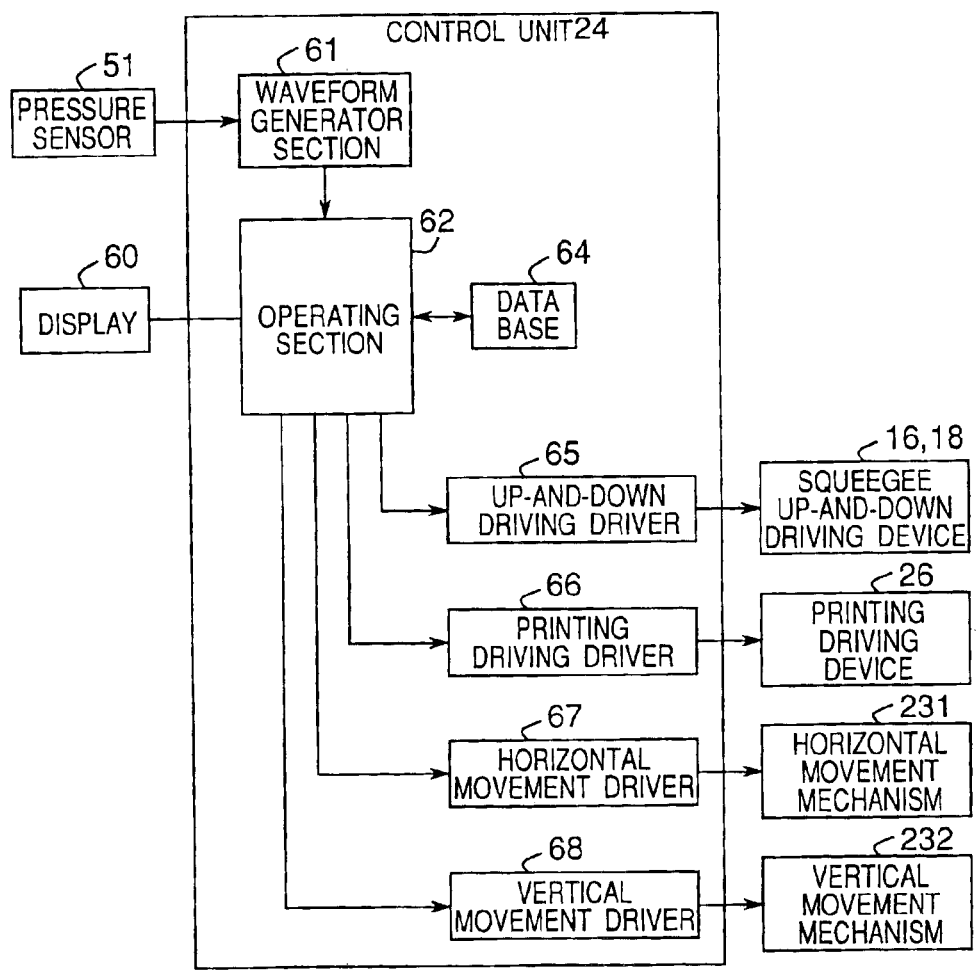
FIG. 39 is a control block chart for controlling the squeegee driving conditions of the solder paste printing apparatus.

A control method for controlling the squeegee driving conditions including the pressurizing member 28 will be described next on the basis of the solder paste filling pressure detected by the pressure sensor 51 arranged on the lower surface of the printing mask 3, which is the characteristic construction of the solder paste printing apparatus 210 of the fifth embodiment, with reference to the control block diagram shown in FIG. 39. The squeegee driving conditions are controlled by the control unit 24 shown in FIG. 36 and FIG. 39.

The solder paste filling pressure detected by the pressure sensor 51 is patterned as waveform data indicated by, for example, K in FIG. 38B by a waveform generating section 61 of the control unit 24 and transmitted to an operating section 62. The operating section 62 refers to a database 64 that has preparatorily stored normal waveform data, or the information, which is the pressure waveform of the solder paste and becomes a criterion of decision, and determines whether or not the waveform of the measured filling pressure of the solder paste 7 is normal by comparison.

Then, if the waveform of the measured filling pressure of the solder paste 7 is normal as a result of this comparison, then the operating section 62 does not perform the following adjustment operation of the squeegee driving conditions. If the waveform of the measured filling pressure of the solder paste 7 is abnormal as a consequence of comparison and it is determined that the adjustment of the squeegee driving conditions is needed, then operation signals are appropriately outputted to a up-and-down driving driver 65 for vertically driving the squeegee, a printing driving driver 66 for squeegee printing driving, a horizontal movement driver 67 for the horizontal movement of the pressurizing member, and a vertical movement driver 68 for the vertical movement of the pressurizing member, by which the squeegee up-and-down drive devices 16 and 18, the printing drive device 26, the horizontal movement mechanism 231, and the vertical movement mechanism 232 are driven to perform the positional adjustment of the pressurizing member 28, so that the desired filling pressure of the pressurizing member 28 can be obtained. When it is determined whether or not the waveform of the measured filling pressure of the solder paste 7 is normal by comparison referring to the database 64 that has preparatorily stored the normal waveform data, it is also acceptable to preset the specified range of tolerance for the normal waveform data and determine that the data is normal when a deviation exists within the range of tolerance and that the data is abnormal when the data exceeds the range of tolerance.

By this operation, the squeegee driving conditions of the application pressure of the squeegees 12a and 12b (a force that pressurizes the squeegees 12a and 12b against the printing mask 3 in order to prevent the floating of the squeegees 12a and 12b), the squeegee speed V, the arrangement conditions of the pressurizing member 28 (the interval S of the narrow path 34 between the member and the printing mask 3 and the interval T of the flow path 36 between the member and the squeegees 12a and 12b), and so on are adjusted. As one example of the adjustment operation of the squeegee driving conditions, the adjustment operation of the arrangement conditions of the pressurizing member 28 is first performed, and when the adjustment operation is insufficient, the squeegee speed V is adjusted. As another example of the adjustment operation of the squeegee driving conditions, the arrangement conditions of the pressurizing member 28 and the squeegee speed V are concurrently adjusted. As other parameters of these parameters for performing the adjustment of the squeegee driving conditions, there can be enumerated a squeegee angle α, a rolling height H depending on the amount of the solder paste 7, the substantial diameter d of the pressurizing member 28, the angle of inclination within the printing mask plane with respect to the direction in which the squeegees 12a and 12b move, and so on.

The database 64 preparatorily registers squeegee driving condition adjustment information such as information of the extent of a change in the filling pressure when the squeegee driving condition adjustment parameters of the interval S, the interval T, the squeegee speed V, and so on are changed and how the printing results are influenced by the change of the parameters in combination in the form of, for example, a table or a graph or the like. With this arrangement, when it is determined that the waveform of the measured filling pressure of the solder paste 7 is abnormal and the adjustment of the squeegee driving conditions is needed, the operating section 62 finds the extent of the change in the filling pressure on the basis of a difference between the waveform of the detected filling pressure and the waveform of the normal filling pressure registered in the database 64. On the basis of the found results, the squeegee driving condition adjustment parameters of the interval S, the interval T, the squeegee speed V, and so on or the squeegee driving condition adjustment parameters of any combination of the parameters are changed by referring to the squeegee driving condition adjustment information. As a result, the quantity of change of each parameter can promptly be set without needing the rule of thumb, and rapid and accurate adjustment work can be performed. As one concrete working example, there is performed the adjustment for increasing the application pressure when the viscosity of the solder paste is increased.

The solder paste printing operation by means of the solder paste printing apparatus 210 of the fifth embodiment constructed as above will be described next with reference to the flowchart shown in FIG. 40.

First of all, the printed board 5 loaded from the printed board conveying section 1A is positioned and layered on the back surface of the printing mask 3 whose surface is supplied with a prescribed amount of solder paste 7 by the table section 1B (step 11: hereinafter referred to as S11).

Next, in the case of the rightward printing, the rightward printing squeegee 12a is moved down by the squeegee up-and-down drive device 16 as shown in FIG. 36. At this time, the edge portion of the squeegee 12a is brought in contact with the surface 3a of the printing mask 3 with a proper application pressure.

With this state maintained, the base plate 14 is moved rightward by the printing drive device 26, and the squeegee 12a is linearly moved in the rightward direction (S12). By this operation, the filling of the solder paste 7 into each opening 4 of the printing mask 3 and the scraping on the surface 3a of the printing mask 3 by the squeegee 12a are started as shown in FIG. 38A. At this time, the solder paste 7 on the lower side of the pressurizing member 28 circulates so as to pass through the narrow path 34 between the member and the printing mask 3, thereafter pass through the flow path 36 between the squeegee 12a and the pressurizing member 28, and pass again through the narrow path 34, by rolling. By the passing of the solder paste 7 through this narrow path 34, the filling pressure is increased, and the solder paste 7 is sufficiently filled into each opening 4 of the printing mask 3 even if the squeegee speed is increased.

Next, the filling pressure of the solder paste 7 is detected by the pressure sensor 51 shown in FIG. 36 in accordance with the movement of the squeegee 12a, and this detection result is outputted to the control unit 24, by which the waveform data is generated in the waveform generating section 61 (S13). Then, the squeegee 12a is moved to a specified position, and the squeegee movement is ended (S14).

Subsequently, the printed board 5 is moved down by the table section 1B so as to separate the printed board 5 from the printing mask 3 (S15). Although the pressure sensors 51 are provided at the two portions of the printing start side and the printing end side of the printed board 5 in the direction of the movement of the squeegee, the filling pressure is detected by using only the pressure sensor 51 at the printing start side in this case.

Next, it is determined whether or not the adjustment of the squeegee driving conditions is required by the operating section 62 of the control unit 24 by comparing the waveform detection result of the filling pressure of the solder paste 7 with the optimum waveform registered in the database 64 (S16).

In this case, when it is determined that the waveform detection result coincides with the optimum waveform and the adjustment of the squeegee driving conditions is not needed by the operating section 62, the printing of the solder paste 7 on the printed board 5 is ended in this state.

When it is determined that the waveform detection result does not coincide with the optimum waveform and the adjustment of the squeegee driving conditions is needed by the operating section 62, the method of adjusting the squeegee driving conditions most appropriate for this case is determined from the aforementioned comparison result by referring to the squeegee driving condition adjustment information of the database 64, and the squeegee driving conditions are adjusted (S17). Then, the printed board 5 is replaced (S18), and the program flow returns again to S11. It is also acceptable to connect a display section 60 of a monitor or the like to the operating section 62 of the control unit 24 as shown in FIG. 39 and display the aforementioned comparison result or display the result only in the abnormal case.

Through the aforementioned processes, the solder paste 7 comes to be properly printed on the printed board 5. When the printing conditions are improper, the adjustment is repetitively performed until the proper conditions are achieved, and finally the satisfactory printing conditions are set. As a board to be used for setting the satisfactory printing conditions (when the so-called teaching is performed), a board for test may be used besides the board to be produced.

The printing operation is similarly repetitively performed in the leftward printing manner when the previous printing operation has been the rightward printing and in the rightward printing manner when the previous printing operation has been the leftward printing. By repeating the above-mentioned printing operation, the solder paste 7 can be successively continuously printed and applied on each land 6 of the printed board 5 via the printing mask 3 under satisfactory printing conditions.

Moreover, since the printing conditions are fed back to the next printing process, it is possible to stably perform the repetitive printing consistently under satisfactory printing conditions and perform high-quality solder paste printing.

Furthermore, the squeegee driving conditions are controlled on the basis of the pressure waveform that represents the change with the lapse of time of the pressure of the solder paste. Therefore, an instantaneous change in the pressure can be qualitatively and quantitatively perceived more precisely, and fine control can be performed, allowing more stable satisfactory printing state to be maintained.

It is to be noted that solder paste printing apparatus 210 of the fifth embodiment is the type of the movement in both the rightward and leftward directions, and therefore, both the squeegees 12a and 12b are provided. However, the solder paste printing apparatus may be the type of the movement in either one of the directions, and in such a case, the squeegee 12a or the squeegee 12b corresponding to the direction of movement is provided.

Although the fifth embodiment has the construction in which each squeegee is vertically moved, both the squeegees may be consistently brought in contact with the printing mask surface without vertically moving during printing.

Figure 41:
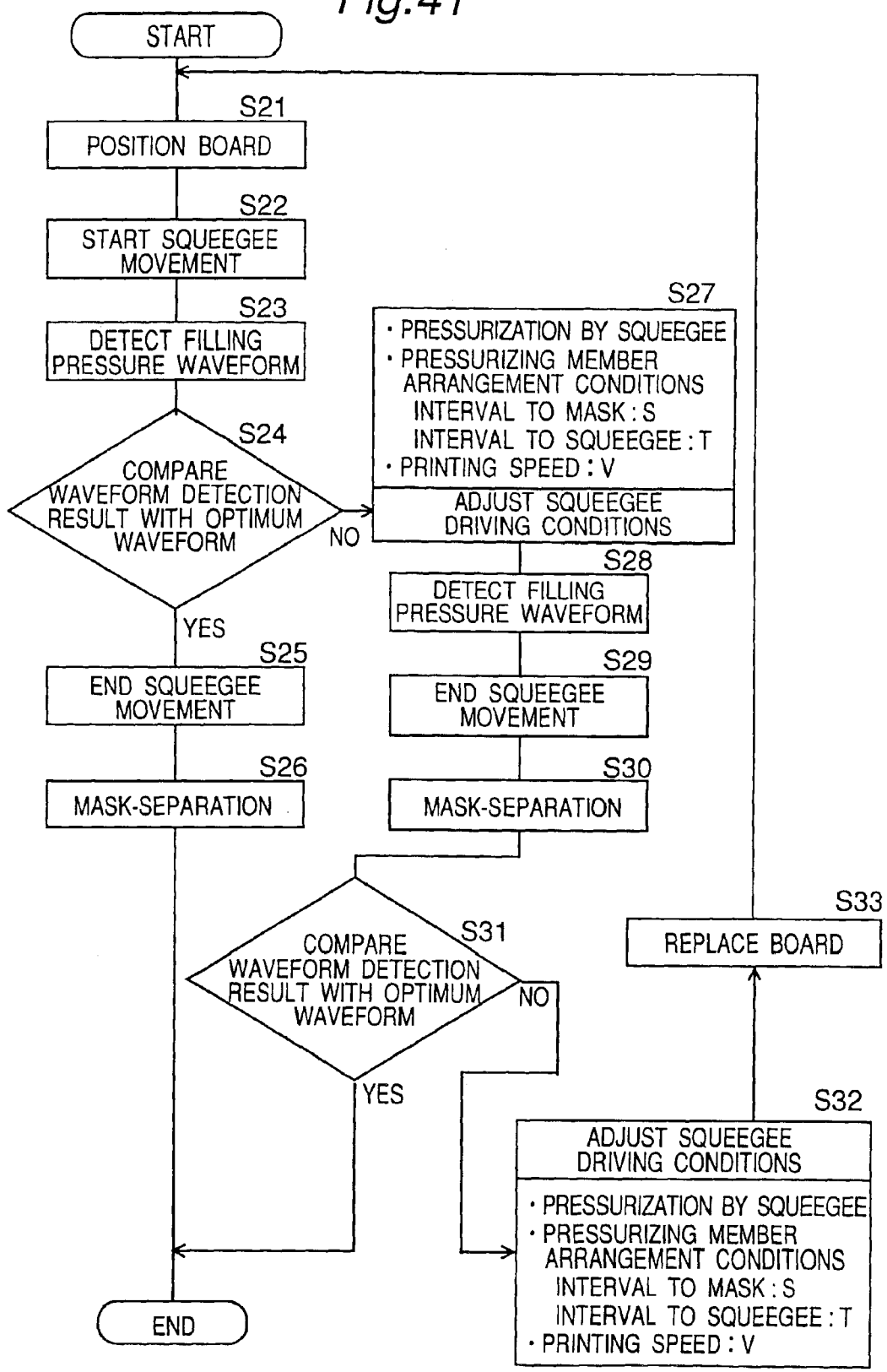
FIG. 41 is a flowchart for explaining another control example of controlling the squeegee driving conditions.

Another solder paste printing operation using the solder paste printing apparatus 210 of the fifth embodiment will be described next with reference to the flowchart shown in FIG. 41.

The printing operation shown in FIG. 41 executes feedback control in real time during printing, and the operation procedure thereof will be described below.

Figure 40:
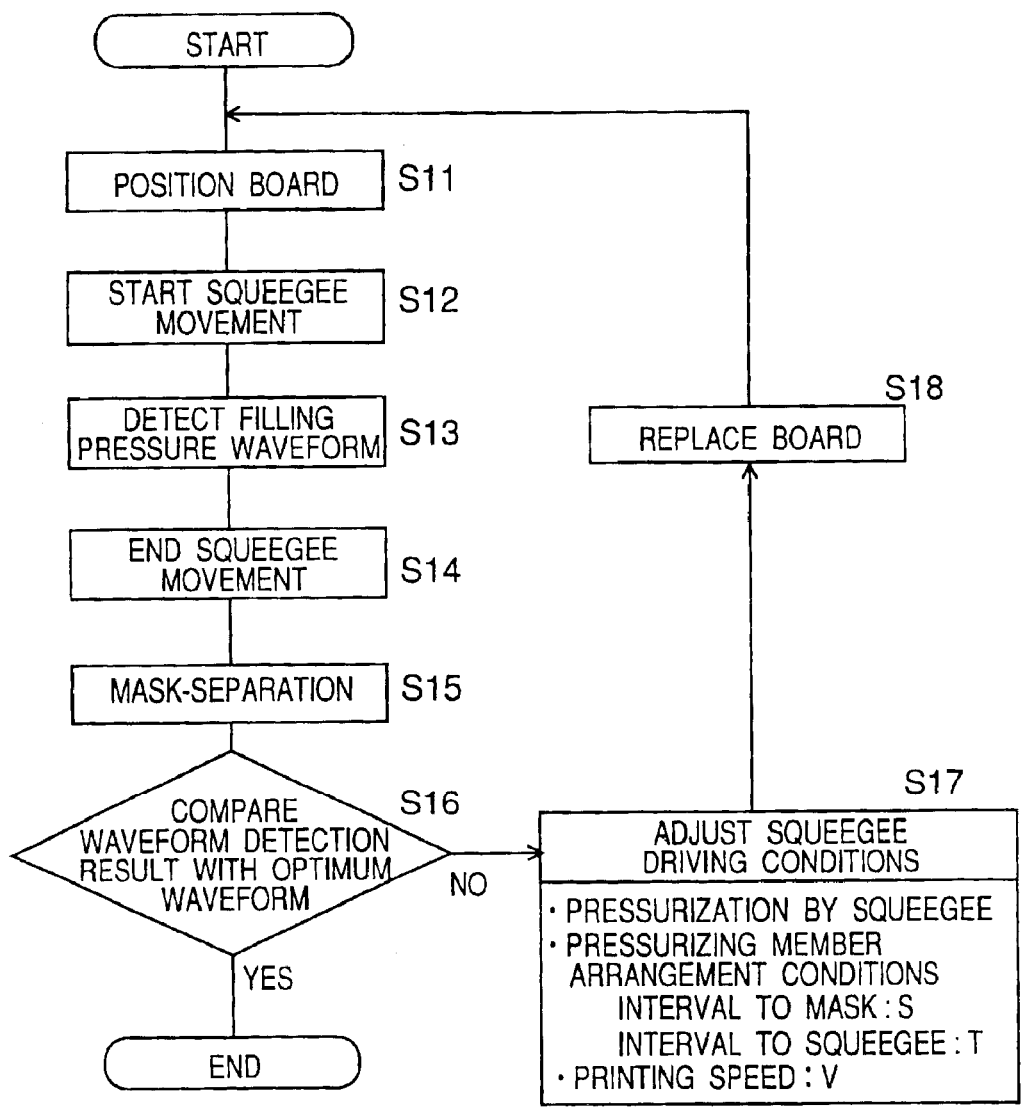
FIG. 40 is a flowchart for explaining one control example of controlling the squeegee driving conditions.

First of all, the printed board 5 is positioned similarly to S11 of FIG. 40 (S21), and thereafter, the movement of the squeegee 12a is started (S22). In accordance with the movement of this squeegee 12a, the filling pressure of the solder paste 7 is detected by the pressure sensor 51 provided on the this side of (short of) the printed board printing start end in the direction of the squeegee movement shown in FIG. 36, and this detection result is outputted to the control unit 24 so as to generate waveform data in the waveform generating section 61 (S23). Then, the operating section 62 of the control unit 24 determines whether or not the adjustment of the squeegee driving conditions is needed by comparing the generated waveform data with the optimum waveform registered in the database 64 (S24).

In this case, when it is determined that the generated waveform data coincides with the normal waveform data and the adjustment of the squeegee driving conditions is not needed by the operating section 62, the squeegee is moved to the specified position to end the squeegee movement (S25), and the printed board is made to separate from the printing mask (S26).

When it is determined in S24 that the generated waveform data does not coincide with the normal waveform data and the adjustment of the squeegee driving conditions is needed by the operating section 62, the method of adjusting the squeegee driving conditions most appropriate for this case is determined on the basis of the aforementioned comparison result and the squeegee driving condition adjustment information of the database 64, and then, the squeegee driving conditions are adjusted (S27). This adjustment is controlled so as to be performed in real time during the squeegee movement and completed before the squeegees 12a and 12b reach the patterned openings 4 of the printing mask 3.

Then, in the state in which the squeegee driving conditions are adjusted, the detection of the filling pressure of the solder paste 7 is performed again by the pressure sensor 51 provided on the rear side of the printed board printing end in the direction of squeegee movement after the squeegees 12a and 12b have passed through the openings 4 of the printing mask 3, and this detection result is outputted to the control unit 24 so as to generate a pressure waveform in the waveform generating section 61 (S28).

Then, the squeegee is moved to a specified position to end the squeegee movement (S29), and the printed board 5 is made to separate from the printing mask 3 (S30).

Next, it is determined whether or not the squeegee driving conditions adjusted in S27 have been proper by comparing the waveform detection result of the solder paste filling pressure that has been detected by the operating section 62 of the control unit 24 and generated in the waveform generating section 61 with the optimum waveform registered in the database 64 (S31).

In this case, when the adjustment of the squeegee driving conditions in S27 is proper and the waveform detection result coincides with the optimum waveform, the printing of the solder paste 7 on the printed board 5 is ended in this state.

When it is determined that the adjustment of the squeegee driving conditions in S27 has not yet been proper, the method of adjusting the squeegee driving conditions most appropriate for this case is determined again on the basis of the aforementioned comparison result, and then, the squeegee driving conditions are adjusted (S32). Then, the printed board 5 is replaced (S33), and the program flow returns again to S21.

Through the aforementioned processes, the printing of the solder paste 7 on the printed board 5 is ended.

By performing the aforementioned solder paste printing operation, the pressure waveform of the application pressure is detected immediately before performing the printing on the printed board, and the printing is performed with the squeegee driving conditions properly adjusted before the pattern printing as the need arises. By this operation, the printing conditions can be changed in real time, and high-quality solder paste printing can promptly be achieved. Moreover, when the squeegee driving conditions are adjusted, by detecting again the pressure waveform of the application pressure immediately after the printing on the printed board so as to confirm whether or not the pressure waveform is the same as the specified optimum waveform, the reliability of the driving condition adjustment is improved, and the printing can be stably performed under satisfactory squeegee driving conditions.

As described above, by adjusting the squeegee driving conditions in the early stage by feeding back the printing result, a printed board in a satisfactory printing state can promptly simply be obtained.

Moreover, by performing the aforementioned printing operations, the adjustment work of the device during printing can be simplified, and the amount of work can be remarkably reduced. Therefore, the work efficiency is improved, and stable printing can be continuously performed, enabling the printing process appropriate for mass production to be performed.

Furthermore, by preparatorily registering the extent of change in the filling pressure when each of the adjustment parameters of the intervals S and T, the squeegee speed V, and so on is changed, how the printing result is influenced by the change in the parameters in combination, and so on in the database, the quantity of change of each parameter can promptly be set without needing the rule of thumb whatever filling pressure waveform is detected, and this enables rapid and correct adjustment work.

According to the solder paste printing apparatus and printing method of the fifth embodiment of the present invention, by detecting the pressure of the solder paste increased by the pressurizing member provided in the vicinity of the edge portion of the squeegee by means of the pressure sensor and then controlling the squeegee driving conditions in correspondence with the detection result of this pressure, the printing of the solder paste on the printed board can be correctly performed without causing the unfilled portion of the solder paste even if the squeegee speed is fast, and this enables the easy increase in the printing speed and the stable retainment of the satisfactory printing state. For example, if the solder paste printing is continuously performed, then the solder paste that has initially been supplied by a prescribed amount onto the printing mask becomes reduced. In this case, with regard to a relation between the amount of the solder paste and the filling pressure waveform, no change in waveform is observed when the amount is, for example, 400 g to 700 g. However, the pressure becomes slightly reduced when the amount is 300 g, and a significant pressure reduction is observed when the amount is 200 g. In order not to perform the printing in the state in which the significant pressure reduction is observed as a consequence of a shortage of solder paste as described above, it is possible to prevent the occurrence of defective printing by performing trouble detection by the pressure sensor, informing the operator of the trouble by means of the display section 60 of a monitor or the like and performing the squeegee driving conditions adjustment based on the squeegee driving condition adjustment information of the replenishment of the solder paste and so on.

Also in the fifth embodiment, similarly to the foregoing embodiments, if the printing is repetitively performed with the conventional construction, as shown in FIG. 26A, the solder paste 7 is protruded from both sides of the squeegee 12a as indicated by 7A. This solder paste 7A protruded therefrom does not naturally return, and the operator collects and puts back the paste at regular intervals of time or dispose of it. In contrast to this, by applying a pressure to the solder paste 7 with the pressure generating member 28 arranged, the solder paste 7 rolls around the pressure generating member 28 and comes to surround the pressurizing member 28. Therefore, even if the printing is repeated, as shown in FIG. 26B, a large amount of solder paste is not protruded dissimilar to the conventional case. Therefore, the work of the operator can be reduced, and the productivity can be improved. Moreover, according to the solder paste printing apparatus of the fifth embodiment, there is provided the solder paste printing apparatus in which the squeegee moves in the printing direction on the surface of the printing mask where the openings are formed so as to print and apply the solder paste supplied onto the surface on the surface of the printed board positioned on the back surface of the printing mask via the openings, the apparatus being characterized by being provided with: the pressurizing member that is provided in the vicinity of the edge of the squeegee and forms the narrow path between the member and the printing mask and the flow path between the member and the squeegee during printing, the pressure sensor that is provided within the range of printing on the back side of the printing mask, or the range of movement of the squeegee and detects the pressure of the solder paste applied via the opening for pressure detection formed in the printing mask; and the control means for controlling the driving conditions of the squeegee in correspondence with the detection result of the pressure sensor.

In this solder paste printing apparatus, the pressure of the solder paste that flows between the pressurizing member and the printing mask is increased by the movement of the squeegee during printing, and the solder paste flows more downward by the increased pressure and filled into the openings of the printing mask. The pressurizing member forms the narrow path between the member and the mask surface, and therefore, the solder paste that flows between the pressurizing member and the mask surface maintains a high pressure for a long time. Then, by detecting the pressure of the solder paste increased by the pressurizing member provided for this squeegee by means of the pressure sensor and then controlling the driving conditions of the squeegee by the control means in correspondence with the detection result of the pressure by the pressure sensor, the printing of the solder paste on the printed board can correctly be performed without causing the unfilled portion of the solder paste even if the squeegee speed is fast, and this enables the easy increase in the printing speed and the stable retainment of the satisfactory printing state.

Moreover, in the solder paste printing apparatus of the fifth embodiment, the control means can also execute control on the basis of the pressure waveform that represents the change with the lapse of time of the pressure of the solder paste detected by the pressure sensor.

In the solder paste printing apparatus described above, by controlling the squeegee driving conditions on the basis of the pressure waveform that represents the change with the lapse of time of the pressure of the solder paste detected by the pressure sensor, an instantaneous change in the pressure can be more precisely perceived, and this enables the execution of fine control and the retainment of more stabilized satisfactory printing state.

Moreover, in the solder paste printing apparatus of the fifth embodiment, the control means is provided with the database in which the pressure waveform of the solder paste is registered, and the squeegee driving conditions can also be controlled by comparing the pressure waveform detected by the pressure sensor with the solder paste pressure waveform, which becomes a criterion of decision registered in the database.

In the solder paste printing apparatus described above, by controlling the squeegee driving conditions through the comparison of the pressure waveform detected by the pressure sensor with the optimum pressure waveform registered in the database, the control can easily be achieved on the basis of the qualitative and quantitative differences of the pressure waveform, and therefore, the more proper adjustment of the squeegee driving conditions can be performed.

Furthermore, the solder paste printing apparatus of the fifth embodiment is provided with the squeegee up-and-down drive device for changing the relative position in the up-and-down direction of the squeegee with respect to the printing mask and is also able to adjust the relative position by driving the squeegee up-and-down drive device by the control means.

In the solder paste printing apparatus described above, by adjusting the relative position in the up-and-down direction of the squeegee with respect to the printing mask, the pressure of the solder paste pressurized by the squeegee can be increased or decreased, and the pressure of the solder paste can properly be controlled.

Moreover, the solder paste printing apparatus of the fifth embodiment is provided with the printing drive device that moves the squeegee in the printing direction and is also able to adjust the travel speed of the squeegee in the printing direction by driving the printing drive device by the control means.

In the solder paste printing apparatus described above, by adjusting the squeegee speed, that is, the squeegee travel speed in the printing direction, the pressure applied to the solder paste can be increased and decreased according to the magnitude of the travel speed, and the pressure of the solder paste can properly be controlled.

Moreover, the solder paste printing apparatus of the fifth embodiment is provided with the pressurizing member horizontal movement mechanism for changing the relative position of the pressurizing member with respect to the squeegee and is also able to adjust the relative position of the pressurizing member by driving the pressurizing member horizontal movement mechanism by the control means.

In the solder paste printing apparatus described above, by adjusting the relative position of the pressurizing member with respect to the squeegee, the fluid resistance when the solder paste subjected to convection passes through the flow path between the pressurizing member and the squeegee increases or decreases, and the pressure of the solder paste can properly be controlled.

Moreover, the solder paste printing apparatus of the fifth embodiment is provided with the pressurizing member vertical movement mechanism for changing the relative position of the pressurizing member with respect to the printing mask and is also able to adjust the relative position of the pressurizing member by driving the pressurizing member vertical movement mechanism by the control means.

In this solder paste printing apparatus, by adjusting the relative position of the pressurizing member with respect to the printing mask, the fluid pressure when the solder paste subjected to convection passes through the narrow path between the pressurizing member and the printing mask increases or decreases, and the pressure of the solder paste can properly be controlled.

Moreover, the solder paste printing apparatus of the fifth embodiment is provided with the pressure sensor arranged on this side of the printing start end of the circuit board and is also able to detect the solder paste pressure before the start of the printing of the circuit board.

In the solder paste printing apparatus described above, by providing the pressure sensor on this side of the printing start end of the circuit board and detecting the solder paste pressure before the start of the printing of the circuit board, the control of the squeegee driving conditions can be completed by the start of the pattern printing on the circuit board, and this enables the execution of the printing under the optimum driving conditions in real time.

Moreover, according to the solder paste printing method of the fifth embodiment for printing and applying the solder paste on the surface of the printing mask onto the printed board positioned on the back surface of the printing mask via the openings by moving the squeegee in the printing direction on the surface of the printing mask where the openings are formed, it is possible to increase the pressure of the solder paste that flows between the member and the printing mask by the pressurizing member provided in the vicinity of the edge portion of the squeegee, detect the increased pressure of the solder paste, and control the printing conditions of the squeegee by comparing the detected pressure with the preparatorily registered specified pressure.

According to the solder paste printing method described above, the pressure applied to the solder paste is detected, and the detection result of this pressure is compared with the preparatorily registered specified pressure. When the detection result of the pressure is different from the normal pressure, by executing control so that the driving conditions of the squeegee are changed and the desired pressure is achieved, the solder paste can correctly be printed on the printed board without causing the unfilled portion of the solder paste even if the squeegee speed is fast. This enables the easy increase in the printing speed and the stable retainment of the satisfactory printing state.

Moreover, according to the solder paste printing method of the fifth embodiment, it is also possible to measure the pressure of the solder paste before the start of the pattern printing of the circuit board and complete the control of the squeegee driving conditions before the start of the pattern printing.

According to the solder paste printing method described above, by measuring the pressure of the solder paste before the start of the pattern printing of the circuit board and completing the control of the squeegee driving conditions before the start of the pattern printing, the pattern can be printed in real time under the satisfactory driving conditions, and high-quality solder paste printing can promptly be achieved.

(Sixth Embodiment)

The sixth embodiment of the present invention is related to a screen printing method and a screen printing apparatus for printing a printing paste on a board via a screen and is more precisely intended to reduce the printing time.

A conventional issue will be first described before describing the sixth embodiment.

Figure 49:
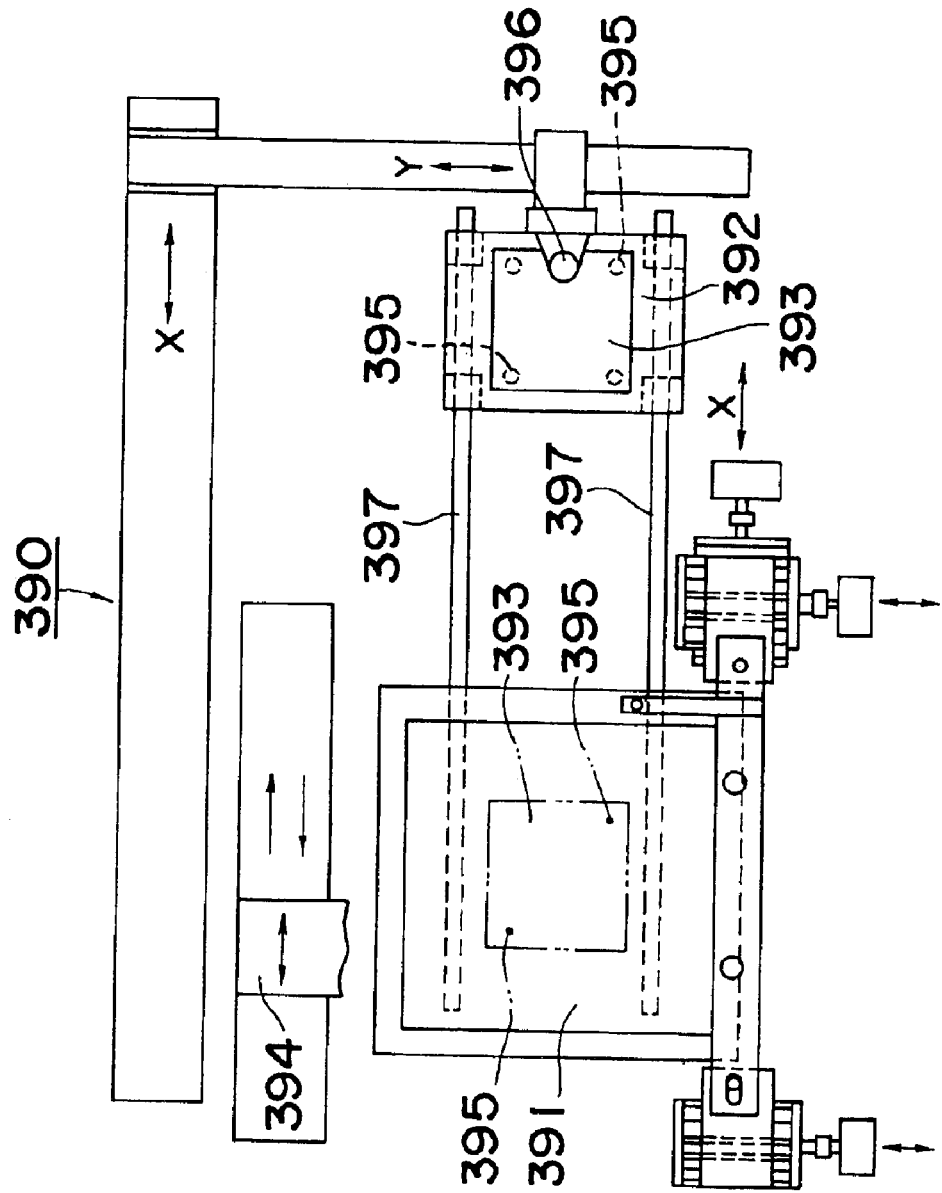
FIG. 49 is a partial plan view showing a conventional screen printing machine.

Referring to FIG. 49, conventionally, Japanese Patent No. 2850150 describes a screen printing machine 390, which fixes a printed board 393 on a stage 392 that can horizontally advance and retreat and vertically move with respect to a screen form plate 391 and prints a printing paste on the printed board 393 via the screen form plate 391 by a squeegee head, or a printing head 394.

In the screen printing machine 390, the positional alignment of the printed board 393 with the screen form plate 391 is performed by independently detecting positioning marks 395 respectively provided on the printed board 393 and the screen form plate 391 by means of a recognition camera 396 and moving the stage 392 and the screen form plate 391 in the horizontal and vertical directions, respectively, on the basis of the detection.

The loading and unloading of the printed board 393 on the stage 392 are performed by a loader and an unloader (which are not shown), respectively. The loader and the unloader are driven by a common-use driving mechanism (not shown) mounted on the stage 392.

That is, the loader is operated by the driving of the driving mechanism by being connected to the driving mechanism of the stage 392 horizontally moved to the right-hand end of a rail 397 in FIG. 49 when the printed board 393 is loaded. The unloader is operated by the driving of the driving mechanism by being connected to the driving mechanism of the stage 392 horizontally moved to the left-hand end of the rail 397 in FIG. 49 when the printed board 393 is unloaded.

Figure 50:
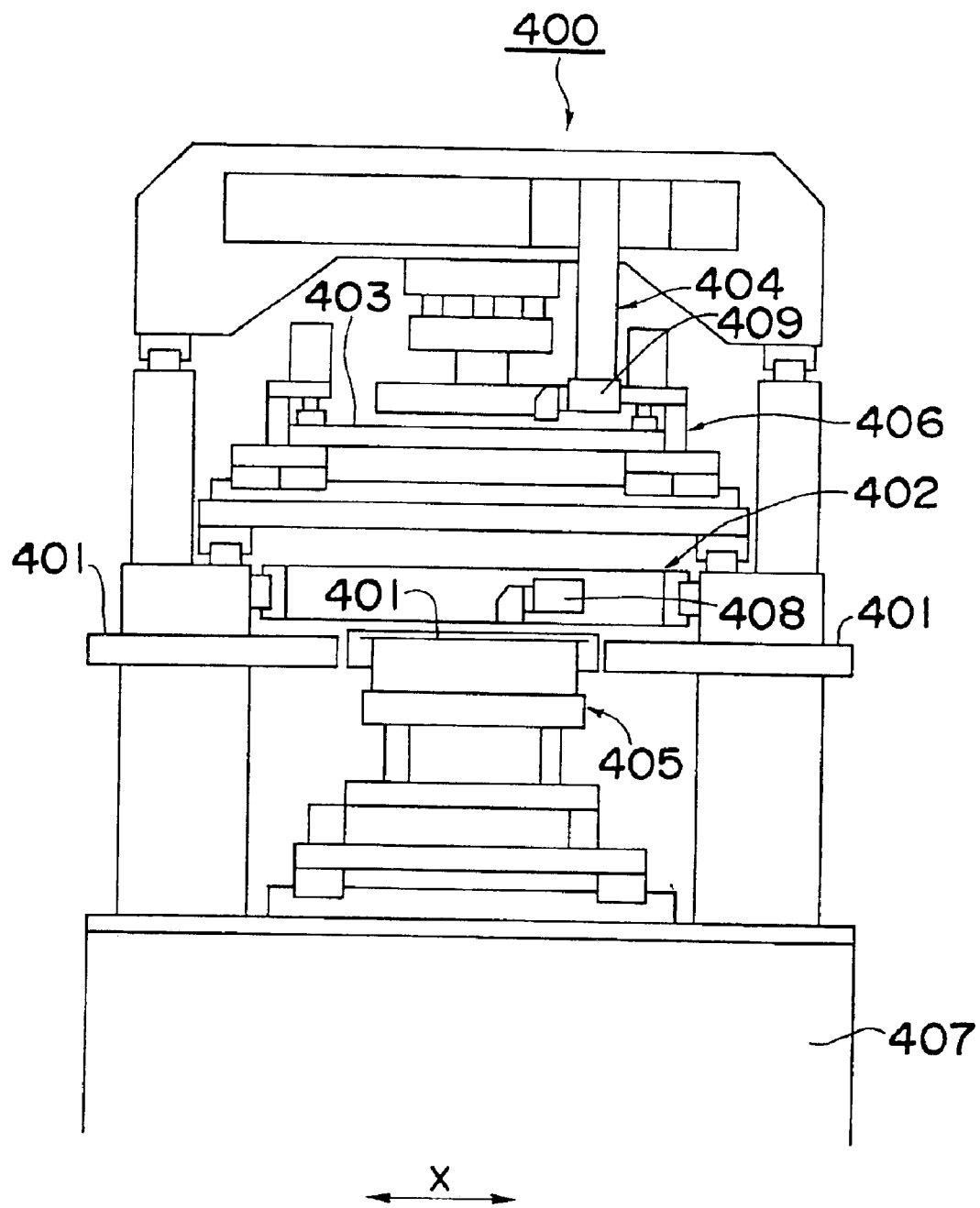
FIG. 50 is a front view showing another example of the conventional screen printing machine.

Referring to FIG. 50, Unexamined Japanese Patent Publication No. 10-44370 describes a screen printing machine 400, which is provided with a first imaging device 402 for imaging a position recognition mark (not shown) preparatorily attached to a board 401 and a second imaging device 404 for imaging a position recognition mark (not shown) preparatorily attached to a screen 403.

The screen printing machine 400 performs the positional alignment of the board 401 with the screen 403 by moving a board support table 405 and a screen support device 406 each by a required amount in the horizontal or vertical direction on the basis of the deviation of the positional information obtained by the imaging devices.

The first imaging device 402 is provided between the board support table 405 placed on a base 407 and the screen support device 406 that supports the screen 403 and images the positional recognition mark of the board 401 placed on the board support table 405 by means of a camera 408.

The second imaging device 404 is provided above the screen support device 406 and images the positional recognition mark of the screen 403 supported by the screen support device 406 by means of a camera 409.

Figure 51:
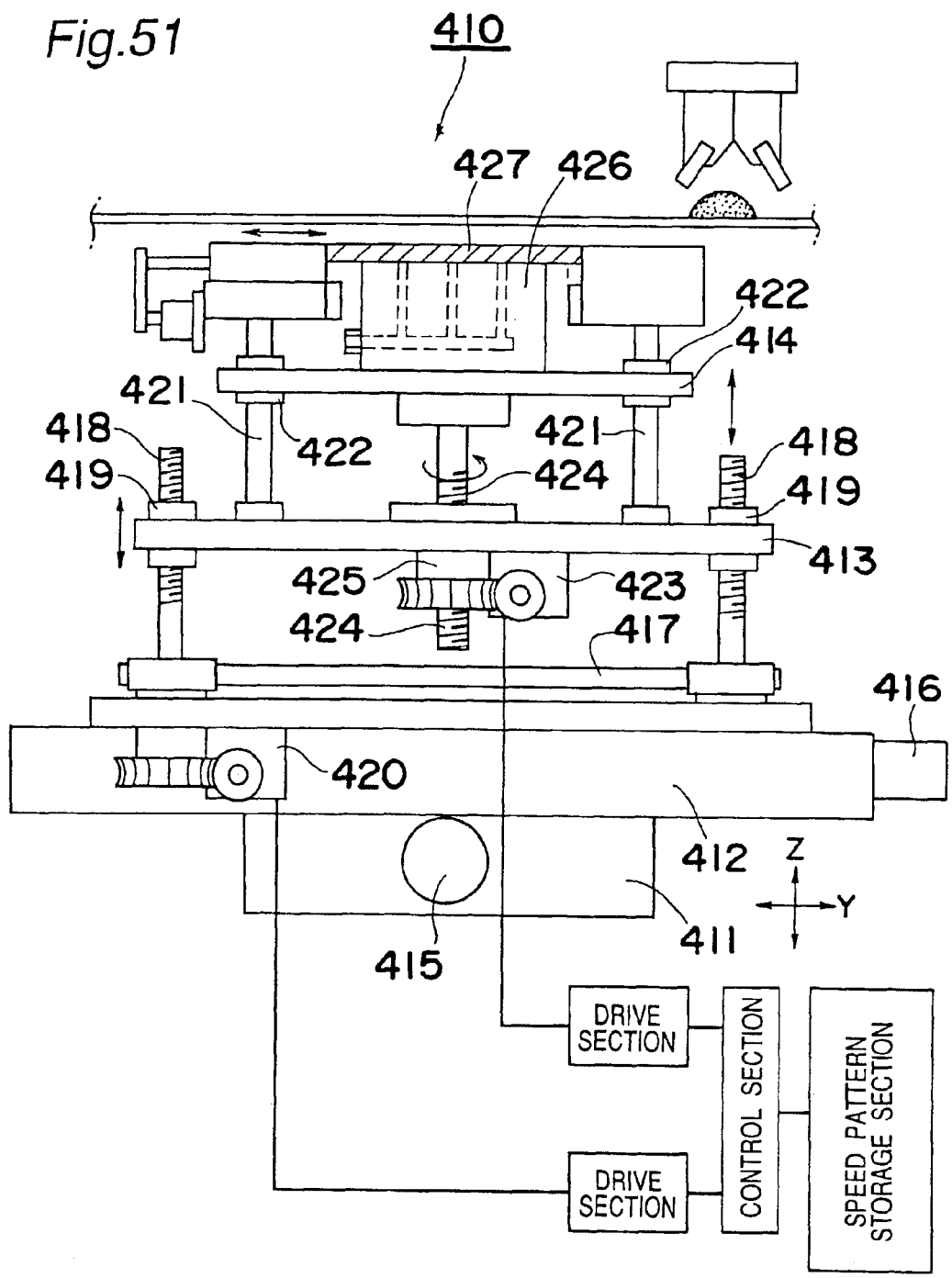
FIG. 51 is a front view showing a yet another example of the conventional screen printing apparatus.

Furthermore, referring to FIG. 51, Unexamined Japanese Patent Publication No. 7-329276 describes a screen printing apparatus 410, which supports a Y-table 412 movably in the lateral direction in FIG. 51 on an X-table 411 provided movably in the direction perpendicular to the sheet plane of FIG. 51 on a base (not shown) and supports first and second elevation plates 413 and 414 on the Y-table 412 while being able to move up and down in the vertical direction in FIG. 51.

The X-table 411 is moved by an X-motor 415. The Y-table 412 is moved by a Y-motor 416.

The first elevation plate 413 is supported in the vertical direction while being able to move up and down in is FIG. 51 by meshing a nut 419 with a pair of feed screws 418 interlocked via a timing belt 417. The first elevation plate 413 is moved up and down in the vertical direction in FIG. 51 with respect to the Y-table 412 along the feed screw 418 by a screwing action generated between the feed screw 418 and the nut 419 according to the rotation of the feed screw 418 in accordance with the rotation of a first motor 420.

The second elevation plate 414 is supported while being able to move up and down via bearings 422 by a pair of elevation guides 421 provided upright on the first elevation plate 413. The second elevation plate 414 is moved up and down in the vertical direction in FIG. 51 with respect to the first elevation plate 413 along the elevation guide 421 by a screwing action generated between a feed screw 424 and a nut 425 according to the rotation of the feed screw 424 in accordance with the rotation of a second motor 423. A suction block 426 is provided on the second elevation plate 414, and a printed board 427 is sucked onto the suction block 426.

In the screen printing machine 390 shown in FIG. 49 described in the Japanese Patent No. 2850150, the loader and the unloader are driven by the common-use drive mechanism mounted on the stage 392, and the loading and unloading of the printed board 393 to and from the stage 392 are performed separately at the right-hand end portion and the left-hand end portion of the rail 397 in FIG. 49. Therefore, the trouble of the contact of the printed board 393 to be loaded with the printed board 393 to be unloaded does not occur.

However, there has been an issue that much time is required for connecting the driving mechanism of the stage 392 to the loader or the unloader or release the connection, and the time required for replacing the printed board 393 is increased. There has also been another issue that the installation area in the horizontal plane of the device is large since the stage 392 moves between the loader and the screen 391 and the position recognizing section of the recognition camera 396 is located between the loader and the screen 391, resulting in difficulties in compacting the device.

Moreover, in the screen printing machine 400 described in Unexamined Japanese Patent Publication No. 1044370 shown in FIG. 50, the position recognition marks of the board 401 and the screen 403 are respectively imaged by the separate imaging devices arranged in the upper and lower portions of FIG. 50. Accordingly, there is no need for moving the board 401 into, for example, a position where the board does not overlap the screen 403 vertically when the board 401 is imaged. Therefore, the installation area in the horizontal plane of the device can be reduced.

However, there has been an issue that, if a slight deviation of the optical axis exists in the reference position of each imaging device, the deviation becomes an extremely serious issue in improving the detection accuracy, and the accurate detection position cannot be obtained. Moreover, there is the operation of moving the board and the screen in the vertical direction from the mark detection position in the practical positional alignment even if the marks are accurately detected by the imaging devices, and therefore, the positional alignment cannot accurately be performed when the axis slightly deviates from the vertical direction. Furthermore, there has been an issue that the working hours have become long since time is required for making the imaging device advance and retreat.

Furthermore, in the screen printing apparatus 410 of Unexamined Japanese Patent Publication No. 7-329276 shown in FIG. 51, the mechanism for moving up and down the first elevation plate 413 and the mechanism for moving up and down the second elevation plate 414 are separate mechanisms, and the suction block 426 of the printed board 427, the second elevation plate 414, and its elevation mechanism are placed on the first elevation plate 413.

For the above reasons, there has been an issue that the inertia in the elevation operation is increased as a consequence of the increased weight, and hunting (oscillation) significantly appears. There has been an issue that, if the hunting significantly appears, it is required to wait until the hunting disappears, and the time required to the completion of the printing becomes long. There has also been an issue that errors due to the two elevation mechanisms are multiplied, leading to a low positional alignment accuracy.

The object of the sixth embodiment of the present invention is to provide a screen printing method and a screen printing apparatus capable of reducing the time required for the replacement of the board and the recognition of the reference position marks by the recognition cameras and so on, thus reducing the printing time, obtaining high positional alignment accuracy, performing stable printing even when the printing speed is increased for time reduction, achieving high-quality solder paste printing with high productivity, and further compacting the apparatus.

Figure 42:
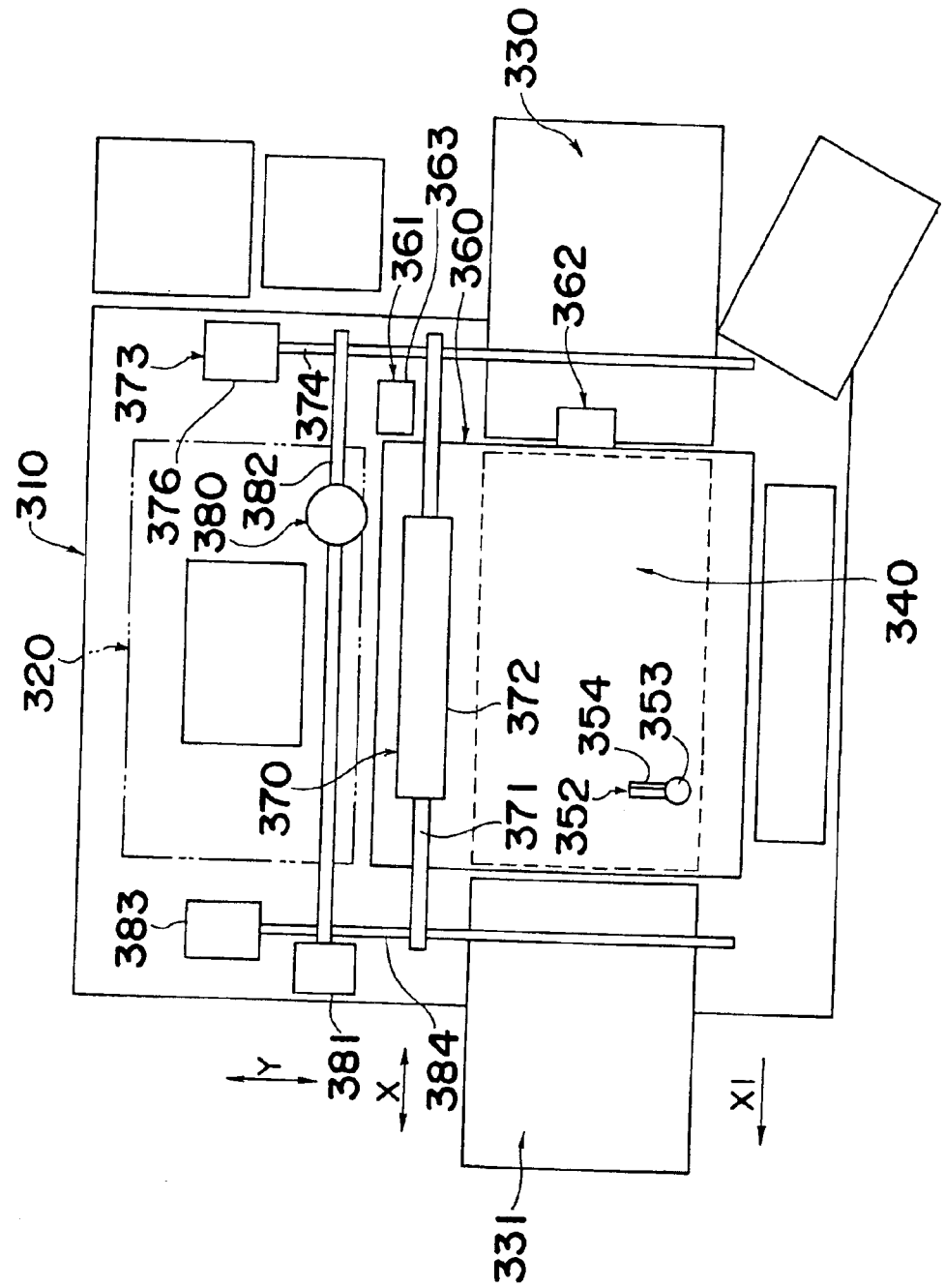
FIG. 42 is a schematic plan view showing a screen printing apparatus according to a sixth embodiment of the present invention.
Figure 43:
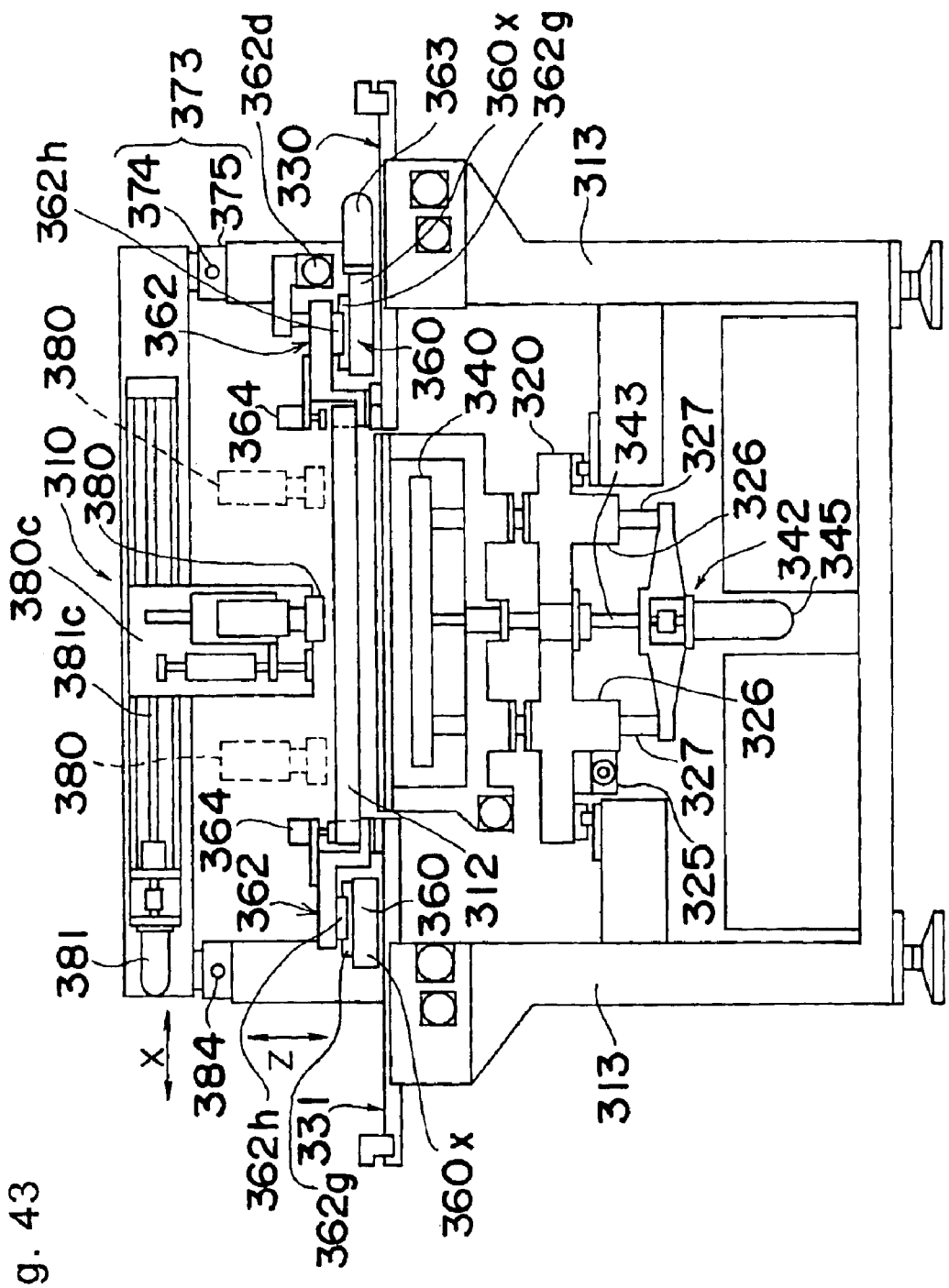
FIG. 43 is a view of the inside of the screen printing apparatus of FIG. 42, viewed from the front.
Figure 44:
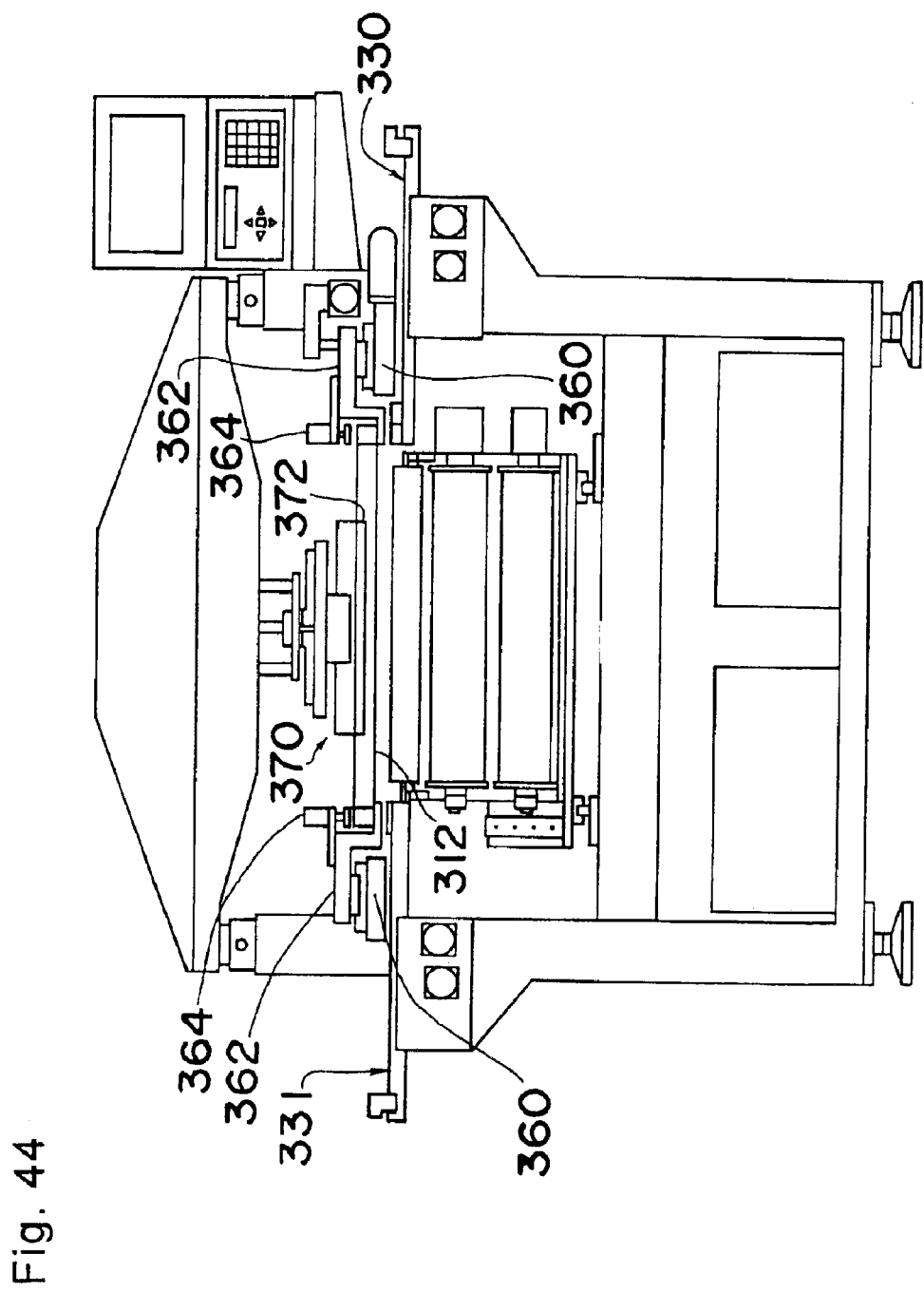
FIG. 44 is a front view of a state in which the cover of the screen printing apparatus of FIG. 42 is open.
Figure 45:
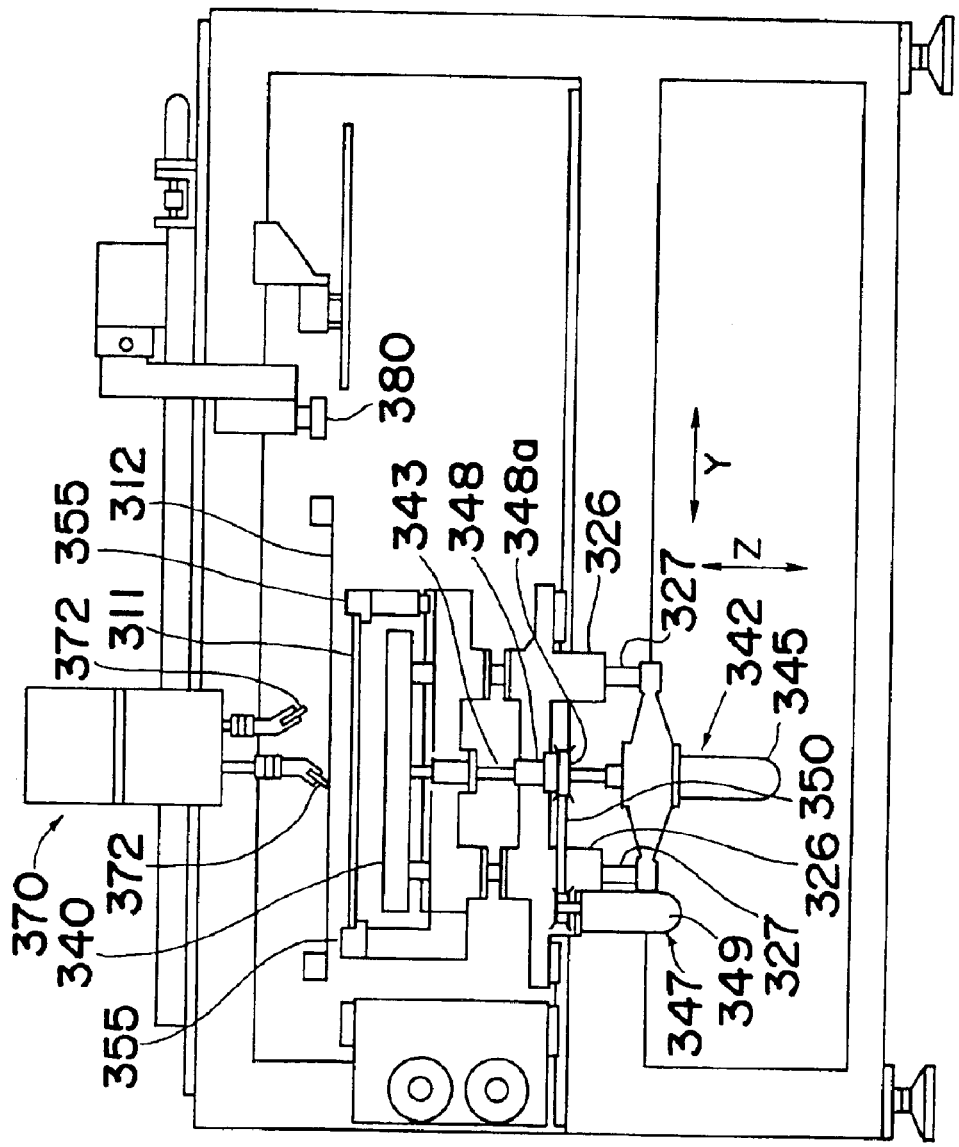
FIG. 45 is a right side view of the screen printing apparatus of FIG. 42.
Figure 46:
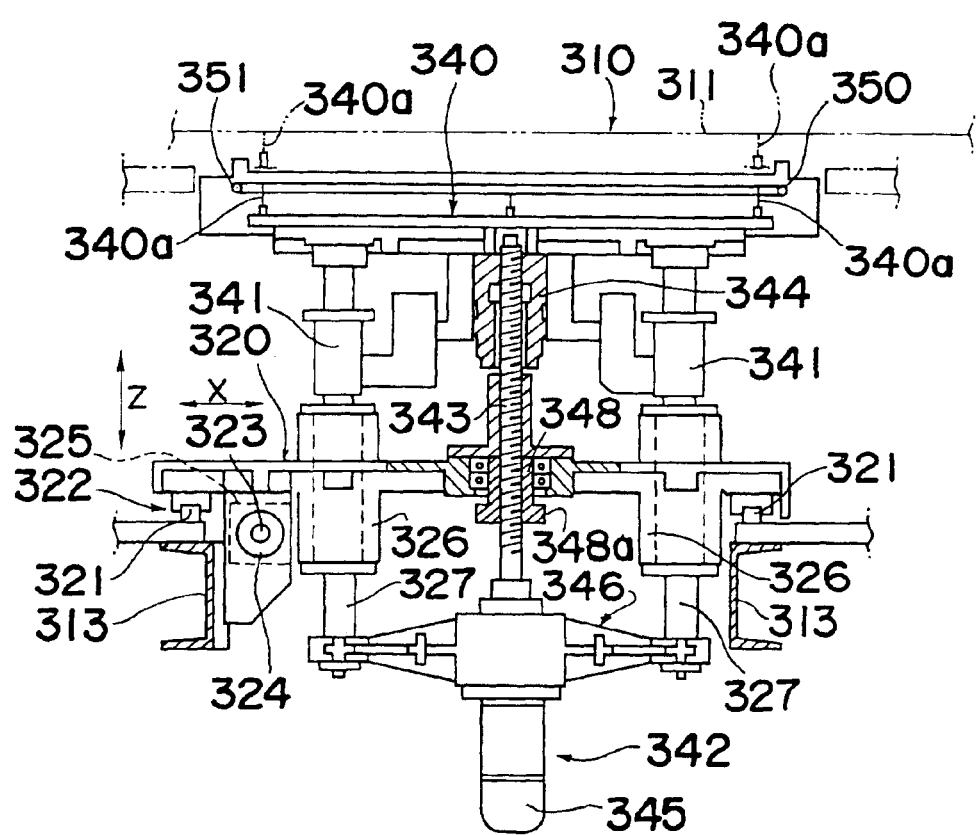
FIG. 46 is a front view showing the table section horizontal movement mechanism, the support base elevation mechanism, and the movable frame elevation mechanism of the screen printing apparatus of FIG. 42.
Figure 47A:
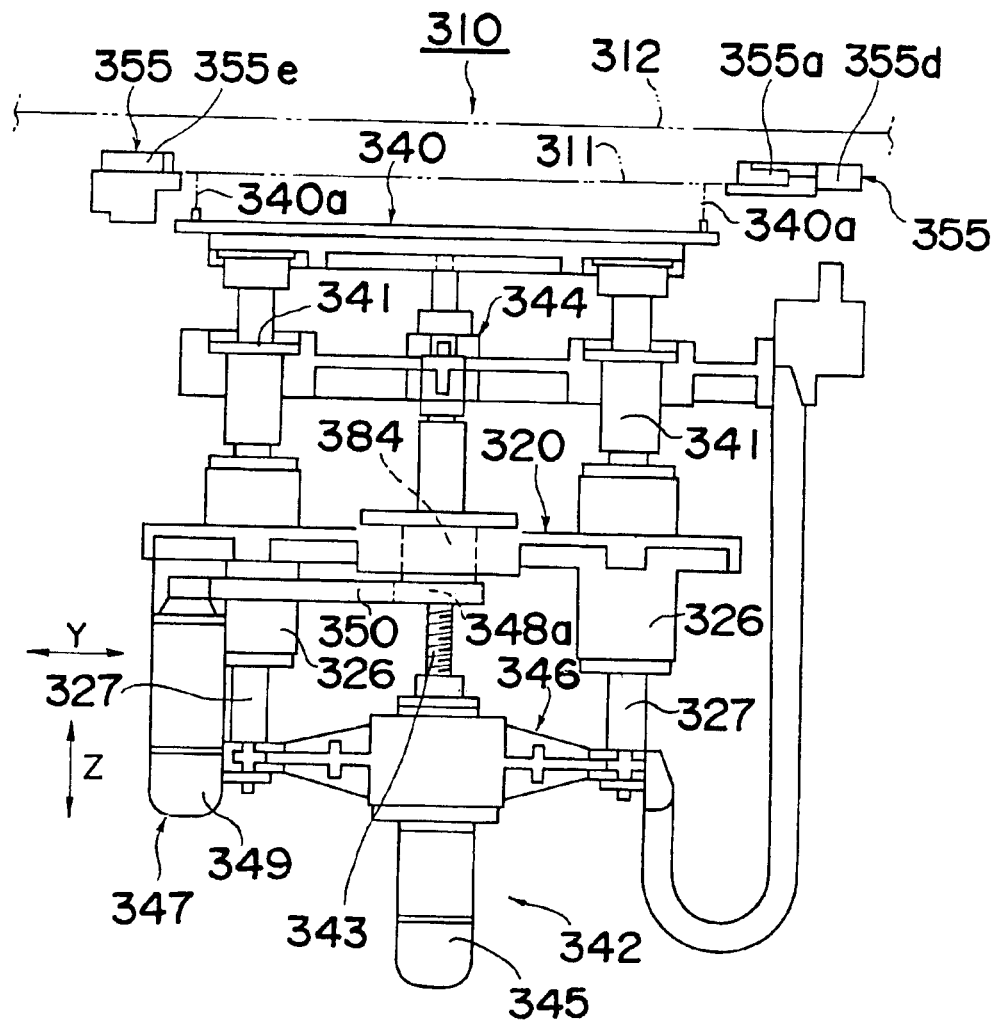
FIG. 47A is a right side view of FIG. 46.

FIG. 42 is a schematic plan view showing the solder paste printing, i.e., the screen printing apparatus of the sixth embodiment of the present invention. FIG. 43 is a view of the inside of the screen printing apparatus viewed from the front. FIG. 44 is a front view of the screen printing apparatus with its cover open. FIG. 45 is a right side view of the screen printing apparatus. FIG. 46 is a front view showing the table section horizontal movement mechanism, the support base elevation mechanism, and the movable frame elevation mechanism of the screen printing apparatus of FIG. 42. FIG. 47A is a right side view of FIG. 46.

Referring to FIG. 42 through FIG. 47B, the screen printing apparatus 310 of the sixth embodiment of the present invention prints a printing paste (not shown) as described in, for example, the foregoing embodiment by means of a squeegee head, i.e., a printing head section 370 via a printing mask, i.e., a screen 312 supported by a screen table section 360 on a board 311 supported by a support base 340. The support base 340 is supported roughly in the vertical direction (direction of an arrow Z in FIG. 46) while being able to be moved up and down by a movable frame 346 that can move up and down roughly in the vertical direction (direction of the arrow Z in FIG. 46) with respect to the table section 320.

The table section 320 is supported by an apparatus frame 313 while being able to move in the horizontal direction via a table section guide 321. The table section 320 is horizontally moved by a table section horizontal movement mechanism 322 in a direction (direction of an arrow Y of FIG. 42, a direction perpendicular to the sheet plane of FIG. 46) roughly perpendicular to a board loading and unloading direction X1 (direction of an arrow X1 in the direction of an arrow X in FIG. 42) to the support base 340. It is to be noted that the horizon mentioned within this specification and the scope of the claims is not always limited to the direction along the horizontal line but includes a direction inclined by a specified angle with respect to the horizontal line, and the direction may alternatively be referred to as a sidewise direction.

Figure 47B:
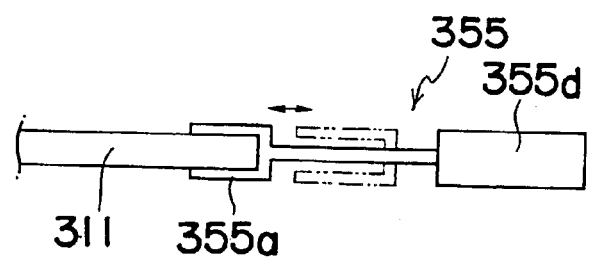
FIG. 47B is an explanatory view of the board regulation mechanism of FIG. 47A.

Referring to FIG. 46, FIG. 47A, and FIG. 47B, the table section horizontal movement mechanism 322 includes a ball thread mechanism constructed of a ball thread shaft 323 that has an outer peripheral surface on which a ball thread is formed and a ball thread nut 324 that is provided on the lower surface of the table section 320 and is meshed with the ball thread shaft 323, and a table section horizontal movement motor 325 for forwardly and reversely rotating the ball thread shaft 323 of the ball thread mechanism.

The table section horizontal movement mechanism 322 forwardly and reversely rotates the ball thread shaft 323 of the ball thread mechanism by means of the table section horizontal movement motor 325, thereby generating a screwing action between the ball thread shaft 323 and the ball thread nut 324 and making the table section 320 horizontally advance and retreat in the direction of the arrow Y along the table section guide 321.

Referring to FIG. 42 and FIG. 43, a board loader 330 is provided proximately to the right-hand side of the table section 320 in FIG. 42 with interposition of a minimum gap necessary for the transfer of the board 311 between the loader and the support bases 340. The board loader 330 loads the board 311 before being printed (hereinafter referred to as a pre-printing board 311) in the board loading and unloading direction X1 onto the support base 340.

A board unloader 331 is provided proximately to the left-hand side of the table section 320 in FIG. 42 with interposition of a minimum gap necessary for the transfer of the board 311 between the unloader and the support bases 340. The board unloader 331 unloads the board 311 after being printed (hereinafter referred to as an already-printed board 311) located on the support base 340 in the board loading and unloading direction X1.

Figure 58:
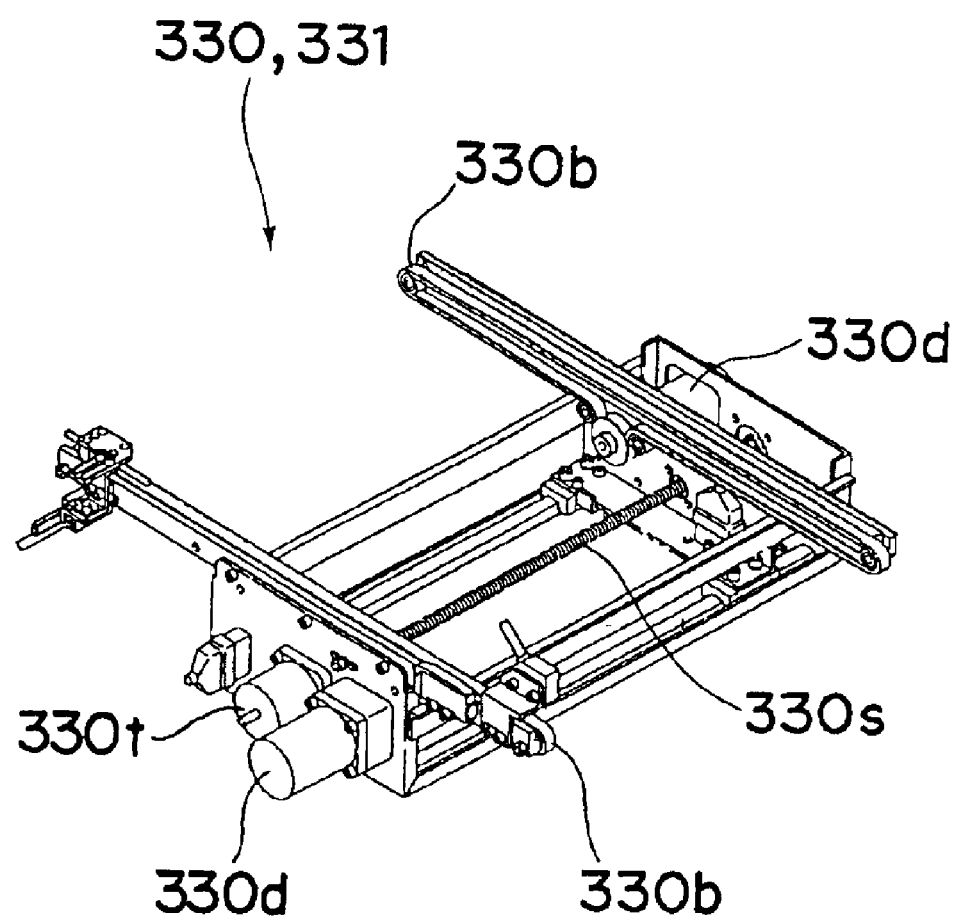
FIG. 58 is a perspective view of the board loader or the board unloader of the screen printing apparatus of the sixth embodiment.

The board loader 330 and the board unloader 331 are constructed of an identical structure, and therefore, the detail of the board loader 330 is shown as a representative in FIG. 58. The board loader 330 is constructed of a pair of conveyance belts 330b for conveying both sides of the board 311 and a pair of drive motors 330d for driving the pair of conveyance belts 330b so as to forwardly and reversely rotate the belts in synchronism. By driving the pair of drive motors 330d so as to synchronously rotate the motors under the control of a control unit 399, the pair of conveyance belts 330b is synchronously driven to move the board 311 in a specified direction. Reference numeral 330t denotes a widthwise adjustment drive motor for varying the interval between the pair of conveyance belts 330b, and 330s denotes a drive shaft for moving either one of the pair of conveyance belts 330b in a direction in which the belt moves close to or apart from the other one by the forward and reverse rotation drive of the widthwise adjustment drive motor 330t. The board unloader 331 has a construction similar to that of the board loader 330.

As shown in FIG. 46, FIG. 47A, and FIG. 47B, the support base 340 is supported so as to be able to move up and down in the direction of the arrow Z via four support base elevation guides 341 by four guide shafts 327 that are inserted so as to be able to move up and down in the direction of the arrow Z in the four guide shafts 326 of the table section 320. The support base 340 can be moved up and down in the direction of the arrow Z along the four guide shafts 327 via four support base elevation guides 341 by a support base elevation mechanism 342.

The support base elevation mechanism 342 is provided with: a ball thread mechanism constructed of a ball thread shaft 343 on the peripheral surface of which a ball thread is formed and a ball thread nut 344 that is provided on the support base 340 and meshed with the ball thread shaft 343; and a support base elevation motor 345 for forwardly and reversely rotating the ball thread shaft 343 of the ball thread mechanism, the mechanism and the motor being provided on the movable frame 346.

The support base elevation mechanism 342 forwardly and reversely rotates the ball thread shaft 343 of the ball thread mechanism by means of the support base elevation motor 345, thereby generating a screwing action between the ball thread shaft 343 and the ball thread nut 344 and moving up and down the support base 340 fixed to the support base elevation guides 341 in the direction of the arrow Z along the guide shafts 327 with respect to the movable frame 346.

The support base elevation mechanism 342 supports by the support base 340 the board 311 loaded into the specified board support position on the support base 340 by the board loader 330 and a board conveyance mechanism 351 described later by moving up the support base 340 in the direction of the arrow Z with respect to the movable frame 346.

The movable frame 346 has both right-hand and left-hand end portions shown in FIG. 46 fixed to the lower end portions of the guide shafts 327 in FIG. 46. The movable frame 346 is moved up and down in the direction of the arrow Z between a specified position of height where the printing on the board 311 located on the support base 340 is performed (hereinafter referred to as a raised position) and a specified position of height where the loading and unloading of the board 311 on the support base 340 are performed (hereinafter referred to as a lowered position) in accordance with the vertical movement in the direction of the arrow Z of the guide shafts 327 with respect to the elevation guides 326 by a movable frame elevation mechanism 347.

As shown in FIG. 47A, the movable frame elevation mechanism 347 is provided with: a ball thread mechanism constructed of a ball thread shaft 343 commonly used for the support base elevation mechanism 342 and a ball thread nut 348 that is meshed with the ball thread shaft 343 and rotatably supported by the table section 320; and a movable frame elevation motor 349 for forwardly and reversely rotating the ball thread nut 348 of the ball thread mechanism, the mechanism and the motor being provided on the table section 320.

The movable frame elevation motor 349 forwardly and reversely rotates the ball thread nut 348 of the ball thread mechanism via a timing pulley 348a fixed to the ball thread nut 348 and a timing belt 350 wound around the timing pulley 348a.

The movable frame elevation mechanism 347 forwardly and reversely rotates the ball thread nut 348 of the ball thread mechanism by means of the movable frame elevation motor 349, thereby generating a screwing action between the ball thread shaft 343 and the ball thread nut 348. By this operation, the movable frame elevation mechanism 347 moves up and down the ball thread shaft 343 in the direction of the arrow Z with respect to the table section 320 and moves up and down the movable frame 346 in the direction of the arrow Z between the raised position and the lowered position together with the guide shafts 327 with respect to the table section 320.

As described hereinabove, each of the ball thread shaft 343 and the guide shafts 327 of the ball thread mechanism is commonly used by the support base elevation mechanism 342 and the movable frame elevation mechanism 347.

That is, the ball thread shaft 343 generates a screwing action between the shaft and the ball thread nut 344 of the support base elevation mechanism 342 by being rotated forwardly and reversely in accordance with the operation of the support base elevation motor 345, thus moving the support base 340 up and down along the guide shafts 327 via the support base elevation guides 341.

The ball thread shaft 343 generates a screwing action between the shaft and the ball thread nut 348 by the forward and reverse rotation of the ball thread nut 348 of the movable frame elevation mechanism 347 in accordance with the operation of the movable frame elevation motor 349, thus moving the movable frame 346 up and down together with the guide shafts 327.

The support base 340 supports the board 311 on a plurality of support pins 340a that are projecting in specified board support positions on the upper surface in FIG. 46 in accordance with the elevating operation of the support base elevation mechanism 342.

Referring to FIG. 42 through FIG. 47B, the printed board 311 supported on the support pins 340a of the support base 340 is loaded onto the support base 340 by the board loader 330, thereafter conveyed on the support base 340 by the board conveyance mechanism 351, stopped at a specified board support position by a board stopper 352 and positioned thereat by a board regulation mechanism 355.

Figure 59:
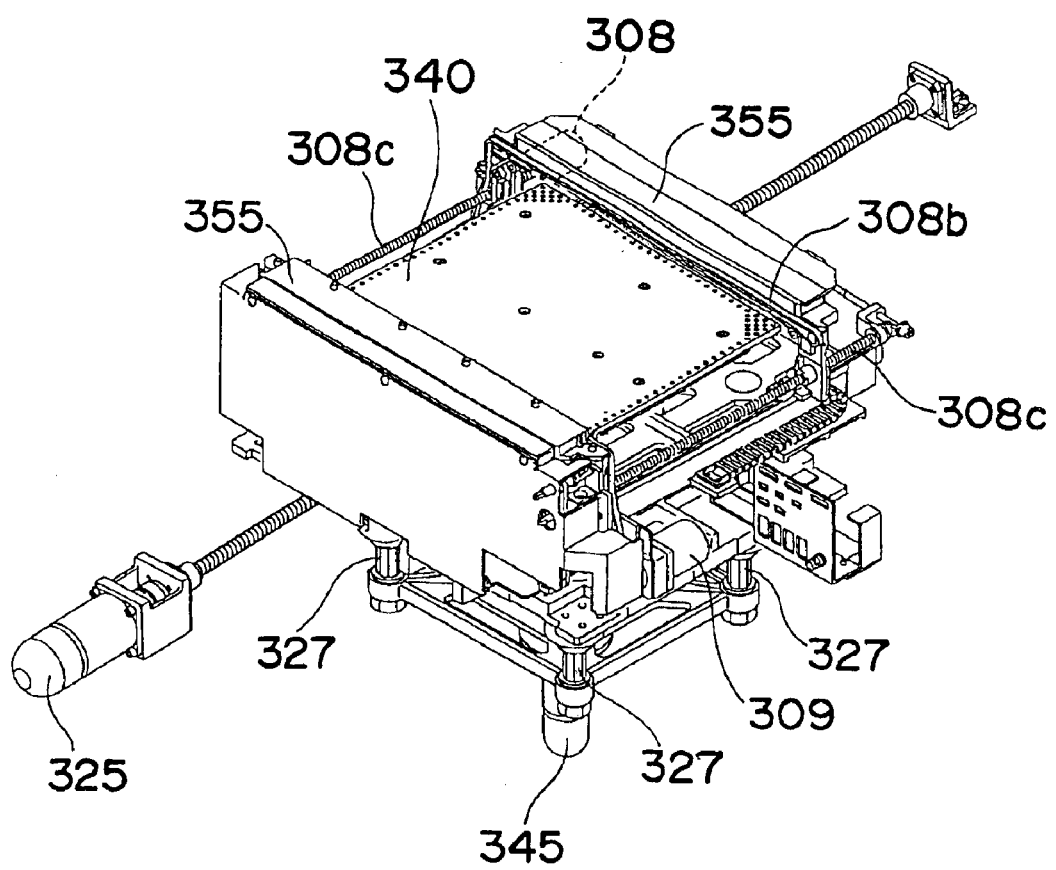
FIG. 59 is a perspective view of the board regulation mechanism and so on of the screen printing apparatus of the sixth embodiment.

The board conveyance mechanism 351 is constructed of a belt conveyer and provided above the table section 320 of the apparatus frame 313. As shown in FIG. 59, the belt conveyer of the board conveyance mechanism 351 is constructed of a pair of conveyance belts 308b for conveying both sides of the board 311 and a pair of drive motors 308 for driving the pair of conveyance belts 308b so as to forwardly and reversely rotate the belts in synchronism. By driving the pair of drive motors 308 so as to synchronously rotate the motors under the control of the control unit 399, the pair of conveyance belts 308b is synchronously driven to move the board 311 in a specified direction. Reference numeral 309 denotes a widthwise adjustment drive motor for varying the interval between the pair of conveyance belts 308b, and 308c denotes a drive shaft for moving either one of the pair of conveyance belts 308b in a direction in which the belt moves close to or apart from the other one by the forward and reverse rotation drive of the widthwise adjustment drive motor 309. The board conveyance mechanism 351 conveys the board 311 loaded on the support base 340 by the board loader 330 to a specified board support position.

Figure 57:
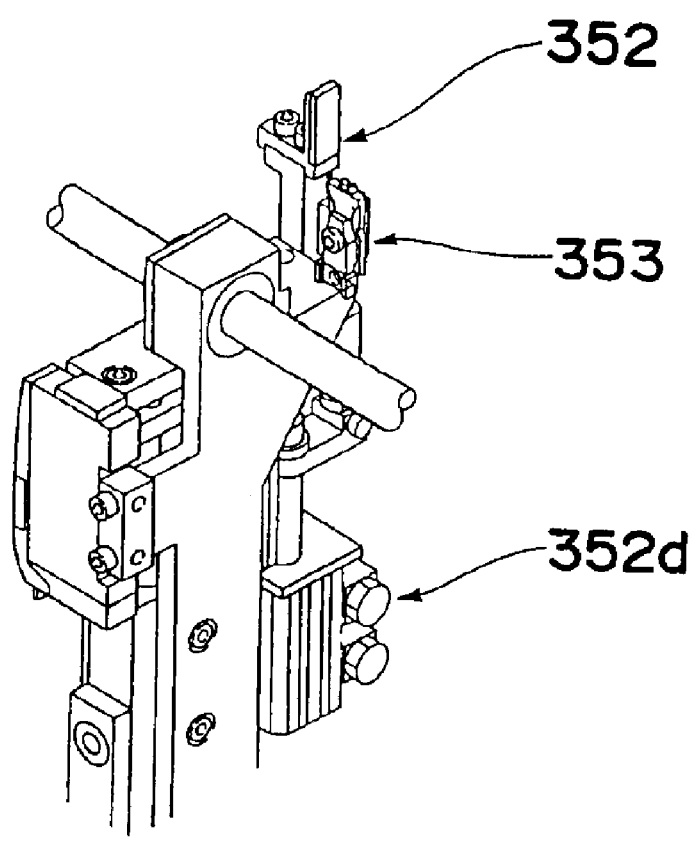
FIG. 57 is a perspective view of the board arrival detection sensor and so on of the screen printing apparatus of the sixth embodiment.

As shown in FIG. 57, the board stopper 352 is provided so as to be able to advance and retreat by the driving of a drive device 352d of an air cylinder for the board stopper or the like into the board support position of the support base 340 and stops the board 311 in the board support position by being engaged with the fore end portion of the board 311 conveyed by the board conveyance mechanism 351 in a state in which the stopper advances.

As shown in FIG. 57, a board detection sensor 353 for detecting the board 311 is provided for the board stopper 352 and detects the presence or absence of the board 311 in the board support position of the support base 340.

As shown in FIG. 57, a cushioning member 354 is provided on the surface that belongs to the board stopper 352 and is engaged with the board 311. The cushioning member 354 attenuates the inertial force of the board 311 to be loaded and stops the vibration of the board 311 in an extremely short time. (within, for example, 0.1 seconds).

As shown in FIG. 47A and FIG. 47B, the board regulation mechanism 355 has: a regulating member 355a that has a roughly C-figured leading end and is provided so as to be able to advance and retreat in the direction of the arrow Y in the board support position of the support base 340; and an air cylinder 355d for making the regulating member 355a advance and retreat between a position regulating position (position indicated by the solid lines in FIG. 47B) for performing the positional regulation of the board 311 by inserting the right-hand end portion of the board 311 into the leading end of the regulating member 355a in FIG. 47A, pressurizing the board 311 in the leftward direction and pressurizing the left-hand end portion of the board 311 against a fixed portion 355e and a retreated position (indicated by the chain lines in FIG. 47B) where the cylinder is retreated in the rightward direction so as not to come in contact with the board 311. The board regulation mechanism 355 positions the board 311 stopped by the board stopper 352 on the support base 340 by pressurizing the board against a specified side by making the regulating member 355a advance onto the support base 340.

Figure 56:
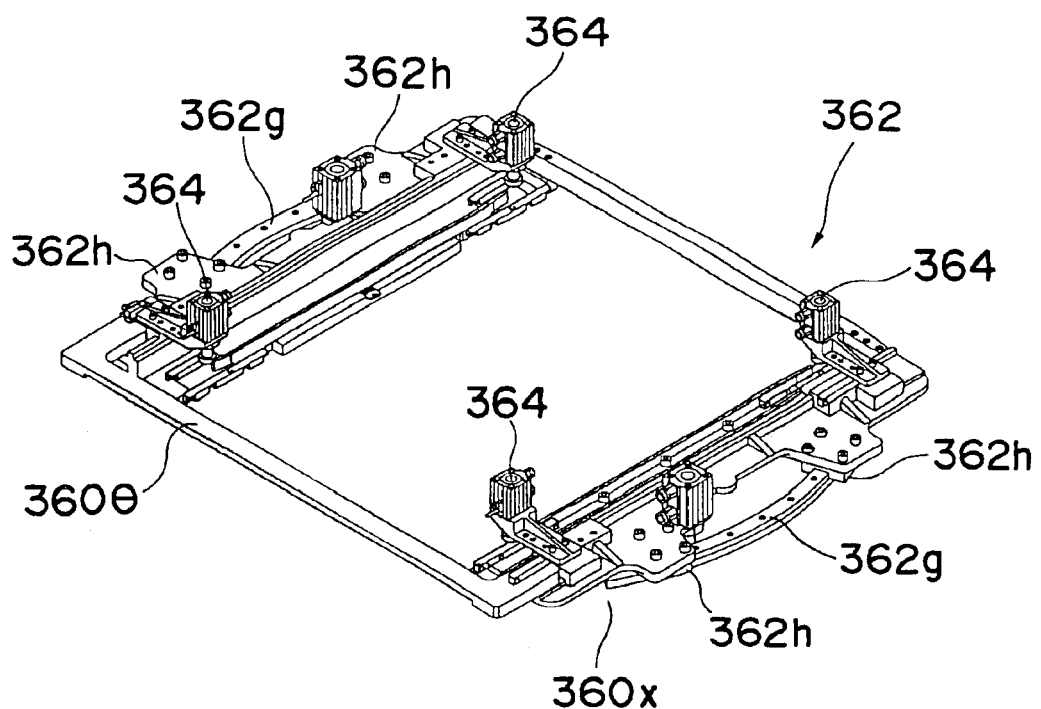
FIG. 56 is a perspective view of the screen table section rotation mechanism of the screen printing apparatus of the sixth embodiment.

As shown in FIG. 42, the screen table section 360 is arranged above the support base 340 of the apparatus frame 313 and holds the screen 312 by means of at least four clamps 364 to hold the screen in a roughly horizontal state. The screen table section 360 is made to horizontally advance and retreat in the direction of the arrow X by the screen table section horizontal movement mechanism 361 and rotated forwardly and reversely by a screen table section rotation mechanism 362 in a horizontal plane roughly parallel to the board 311 supported on the support base 340. That is, as shown in FIG. 43 and FIG. 56, in the screen table section rotation mechanism 362, a θ-table 360θ having a pair of sliders 362h that slides on a pair of curved guide rails 362g fixed on an X-table 360X that can move in the X-direction on the apparatus frame 313 is arranged, and a θ-table rotating drive device 362d of a motor for rotatively driving the θ-table 360θ or the like is provided. At least four clamps 364 are arranged on the θ-table 360θ, and the screen 312 is gripped by at least four clamps 364 on the θ-table 360θ. Therefore, by driving the θ-table rotating drive device 362d of the screen table section rotation mechanism 362 so as to rotate the θ-table rotating drive device forwardly and reversely under the control of the control unit 399, a pair of sliders 362h and 362h located on both sides of the θ-table 360θ advance and retreat along the curved guide rails 362g located on both sides of the X-table 360X. By this operation, the θ-table 360θ can rotate forwardly and reversely with respect to the X-table 360X within a specified angular range around the center axis of the support base 340.

Referring to FIG. 42 and FIG. 43, the screen table section horizontal movement mechanism 361 is provided with: a ball thread mechanism (not shown) constructed of a ball thread shaft (not shown) on the outer peripheral surface of which a ball thread is formed and a ball thread nut (not shown) that is provided on the screen table section 360, and meshed with the ball thread shaft; and a screen table section horizontal movement motor 363 for forwardly and reversely rotating the ball thread shaft of the ball thread mechanism. The screen table section horizontal movement mechanism 361 generates a screwing action between the ball thread shaft and the ball thread nut by forwardly and reversely rotating the ball thread shaft of the ball thread mechanism by means of the screen table section horizontal movement motor 363, thereby making the X-table 360X on which the θ-table 360θ, that is gripping the screen 312 in the screen table section 360 is placed, horizontally advance and retreat in the direction of the arrow X with respect to the apparatus frame 313.

Referring to FIG. 42 through FIG. 45, the printing head section 370 is arranged above the screen table section 360 in the apparatus frame 313, and provided with a printing head frame 371 and a printing squeegee 372. The printing head section 370 is made to horizontally advance and retreat in the direction of the arrow Y by a printing head section horizontal movement mechanism 373.

Figure 55:
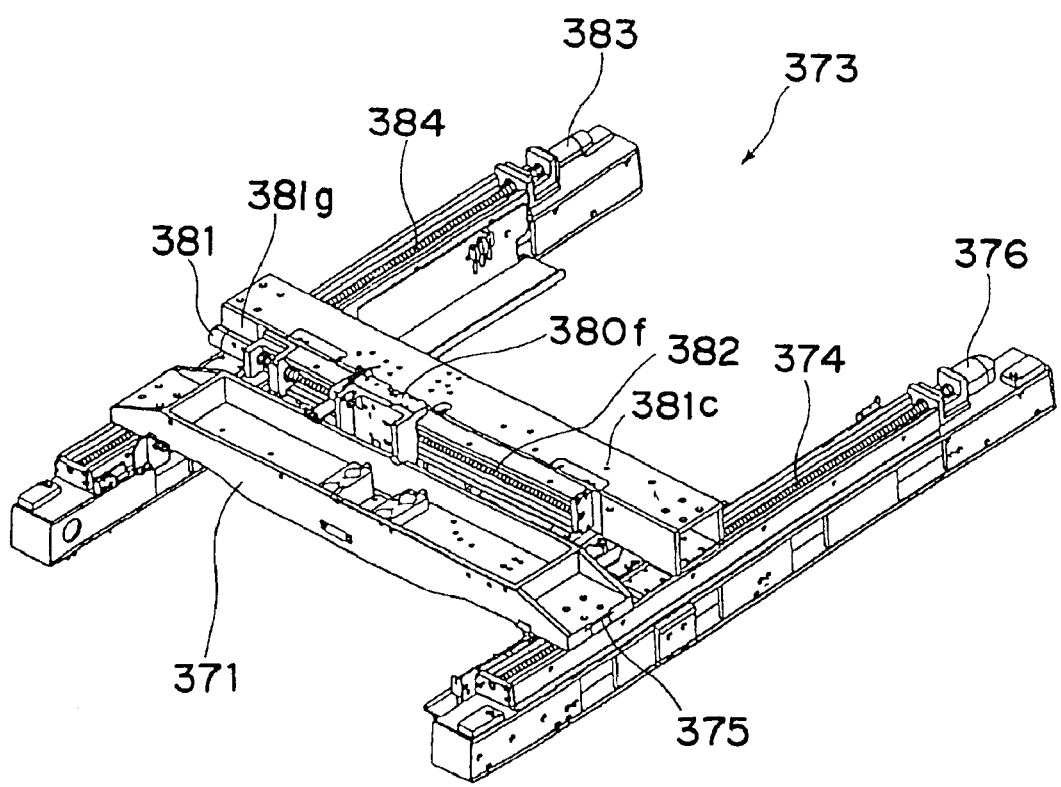
FIG. 55 is an exploded perspective view of the printing head section horizontal movement mechanism of the screen printing apparatus of the sixth embodiment.

As shown in detail in FIG. 55, the printing head section horizontal movement mechanism 373 is provided with: a ball thread shaft mechanism constructed of a ball thread shaft 374 on the outer peripheral surface of which a ball thread is formed and a ball thread nut 375 that is provided on the printing head frame 371 and meshed with the ball thread shaft 374; and a printing head section horizontal movement motor 376 for forwardly and reversely rotating the ball thread shaft 374 of the ball thread mechanism.

The printing head section horizontal movement mechanism 373 generates a screwing action between the ball thread shaft 374 and the ball thread nut 375 by forwardly and reversely rotating the ball thread shaft 374 of the ball thread mechanism by means of the printing head section horizontal movement motor 376, thereby making the printing head frame 371 and the printing head section 370 horizontally advance and retreat in the direction of the arrow Y.

Figure 52:
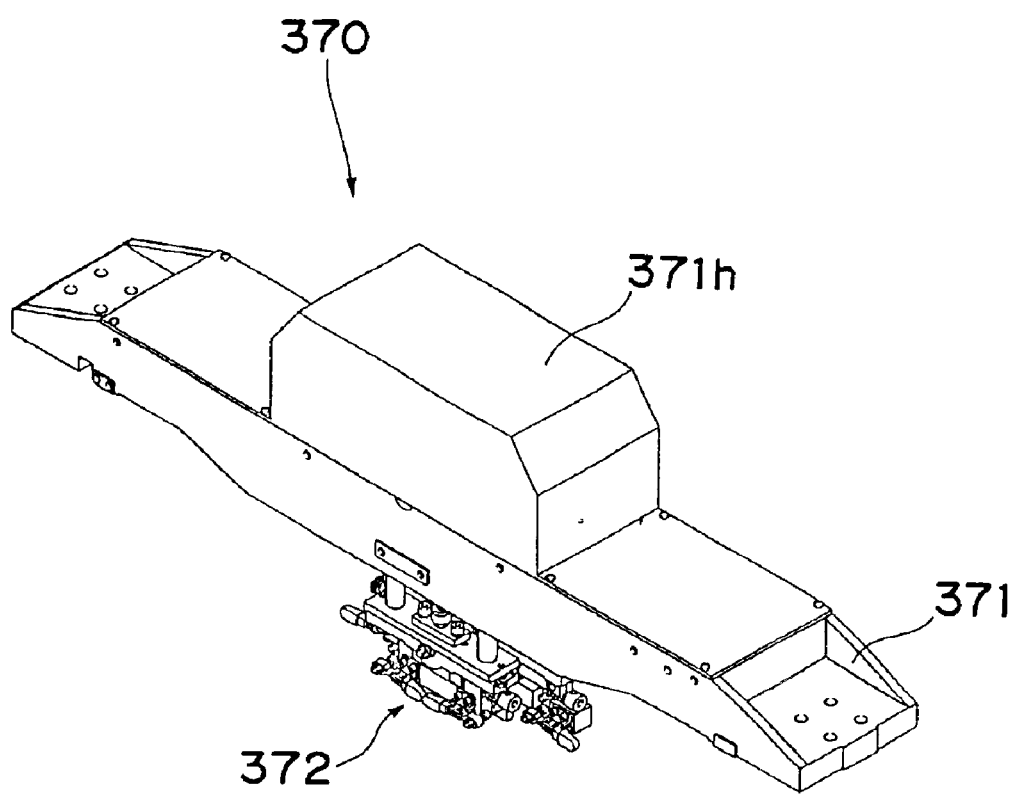
FIG. 52 is a perspective view of the squeegee, head, i.e., the printing head section of the screen printing apparatus of the sixth embodiment.
Figure 53:
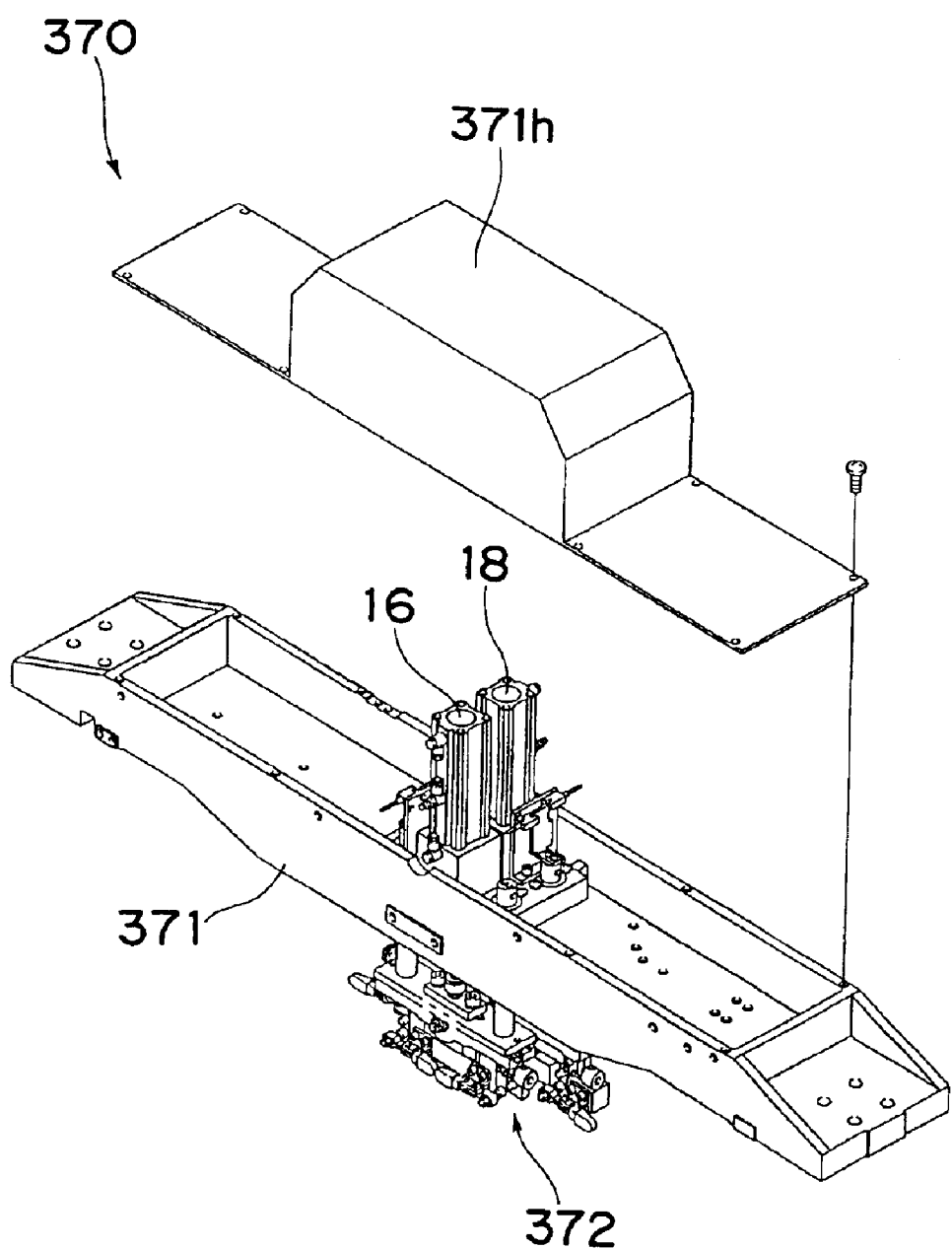
FIG. 53 is an exploded perspective view of the printing head section of FIG. 52.

As also shown in FIG. 52 and FIG. 53, the printing head section 370 prints a printing paste on the board 311 via the screen 312 by squeegeeing the printing paste by means of the printing squeegee 372 on the screen 312 supported by the screen table section 360 in accordance with the horizontal movement in the direction of the arrow Y of the printing head section horizontal movement mechanism 373. The printing squeegee 372 corresponds to the squeegees 12a and 12b of the foregoing embodiments and is able to independently move up and down between the standby position where the lower end of the squeegee is located above the screen 312 by the up-and-down drive devices 16 and 18 that are arranged on the printing head frame 371 and covered with a head cover 371h and the operating position where the lower end of the squeegee is put in contact with the screen 312, similarly to the foregoing embodiments.

A recognition camera 380 is provided horizontally movably in the direction of the arrow X and in the direction of the arrow Y and is able to recognize the reference position marks (refer to, for example, 1005A and 1005B of the board 5 in FIGS. 32 and 1003A and 1003B of the screen 3 in FIG. 32 and FIG. 33) preparatorily given to the board 311 and the screen 312.

Figure 54:
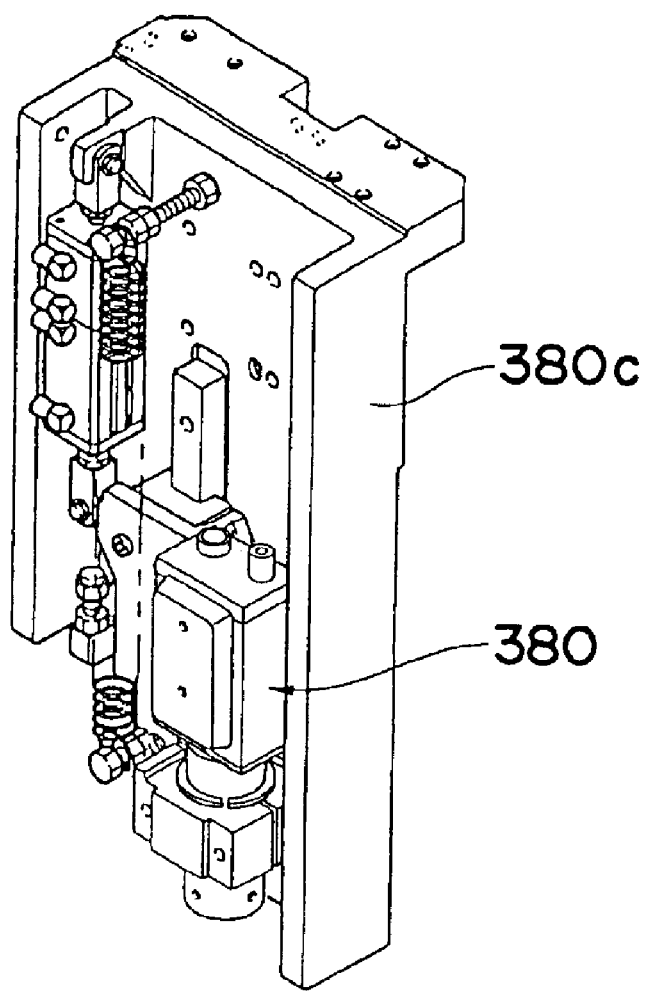
FIG. 54 is an exploded perspective view of the mounting section of the recognition camera of the screen printing apparatus of the sixth embodiment.

As shown in FIG. 55, the horizontal movement mechanism in the direction of the arrow X of the recognition camera 380 is provided with: a ball thread mechanism constructed of a camera X-shaft (i.e., X-direction rotary shaft) 382 that is provided on a recognition camera frame 381c and is a ball thread shaft and a ball thread nut that is provided on a movable bracket 380f of the recognition camera frame 381c and meshed with the camera X-shaft 382; and a camera X-shaft movement motor 381 for forwardly and reversely rotating the camera X-shaft 382 of the ball thread mechanism. Therefore, by a screwing action in accordance with the forward and reverse rotation of the camera X-shaft 382 by the X-shaft movement motor 381, the movable bracket 380f to which the ball thread nut meshed with the camera X-shaft 382 is fixed is moved to advance and retreat in the direction of the arrow X. A mounting bracket 380c to which the recognition camera 380 is fixed as shown in FIG. 54 is fixed to the movable bracket 380f.

As shown in FIG. 55, the horizontal movement mechanism in the direction of the arrow Y of the recognition camera 380 is provided with: a ball thread mechanism constructed of a camera Y-shaft (i.e., Y-direction rotary shaft) 384 that is a ball thread shaft and a ball thread nut 381g that is provided on the recognition camera frame 381c and meshed with the camera Y-shaft 384; and a camera Y-shaft movement motor 383 for forwardly and reversely rotating the camera Y-shaft 384 of the ball thread mechanism. Therefore, by a screwing action in accordance with the forward and reverse rotation of the camera Y-shaft 384 by the camera Y-shaft movement motor 383, the recognition camera frame 381c is moved to advance and retreat in the direction of the arrow Y.

That is, in a state in which the table section 320 is moved to horizontally advance and retreat into a specified position (position indicated by the two-dot chain lines in FIG. 42, hereinafter referred to as a recognition position) deviating from the position just below the screen 312 by the table section horizontal movement mechanism 322, the recognition camera 380 performs the recognition of the reference position mark (refer to 1005A and 1005B of the board 5 in FIG. 32) formed in at least one place or, for example, two places of the board 311 in accordance with the horizontal movement in the direction of the arrow X and the horizontal movement of the table section 320 in the direction of the arrow Y by the table section horizontal movement mechanism 322. That is, the camera moves to a position above each reference position mark (refer to 1005A and 1005B of the board 5 in FIG. 32) of the board 311, and thereafter once stops to perform the recognizing operation.

The recognition camera 380 also performs the recognition of the reference position mark (refer to 1003A and 1003B of the screen 3 in FIG. 32 and FIG. 33) formed in at least one place or, for example, two places of the screen 312 in accordance with the movement in the direction of the arrow X and in the direction of the arrow Y. That is, the camera moves to a position above each reference position mark (refer to 1003A and 1003B of the screen 3 in FIG. 32 and FIG. 33) of the screen 312, and thereafter once stops to perform the recognizing operation.

Figure 60:
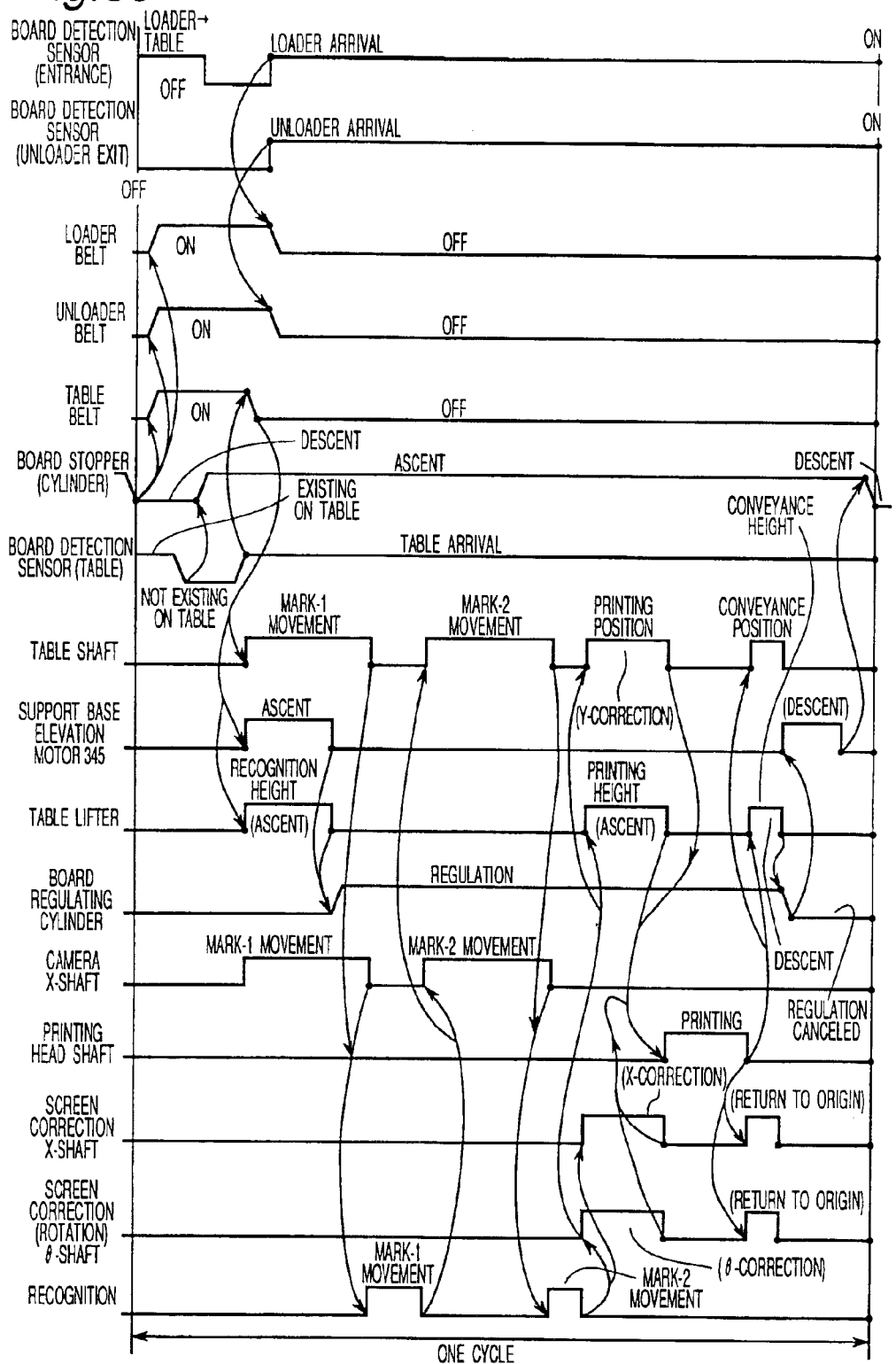
FIG. 60 is a timing chart of the respective drive devices of the screen printing apparatus of the sixth embodiment.
Figure 61:
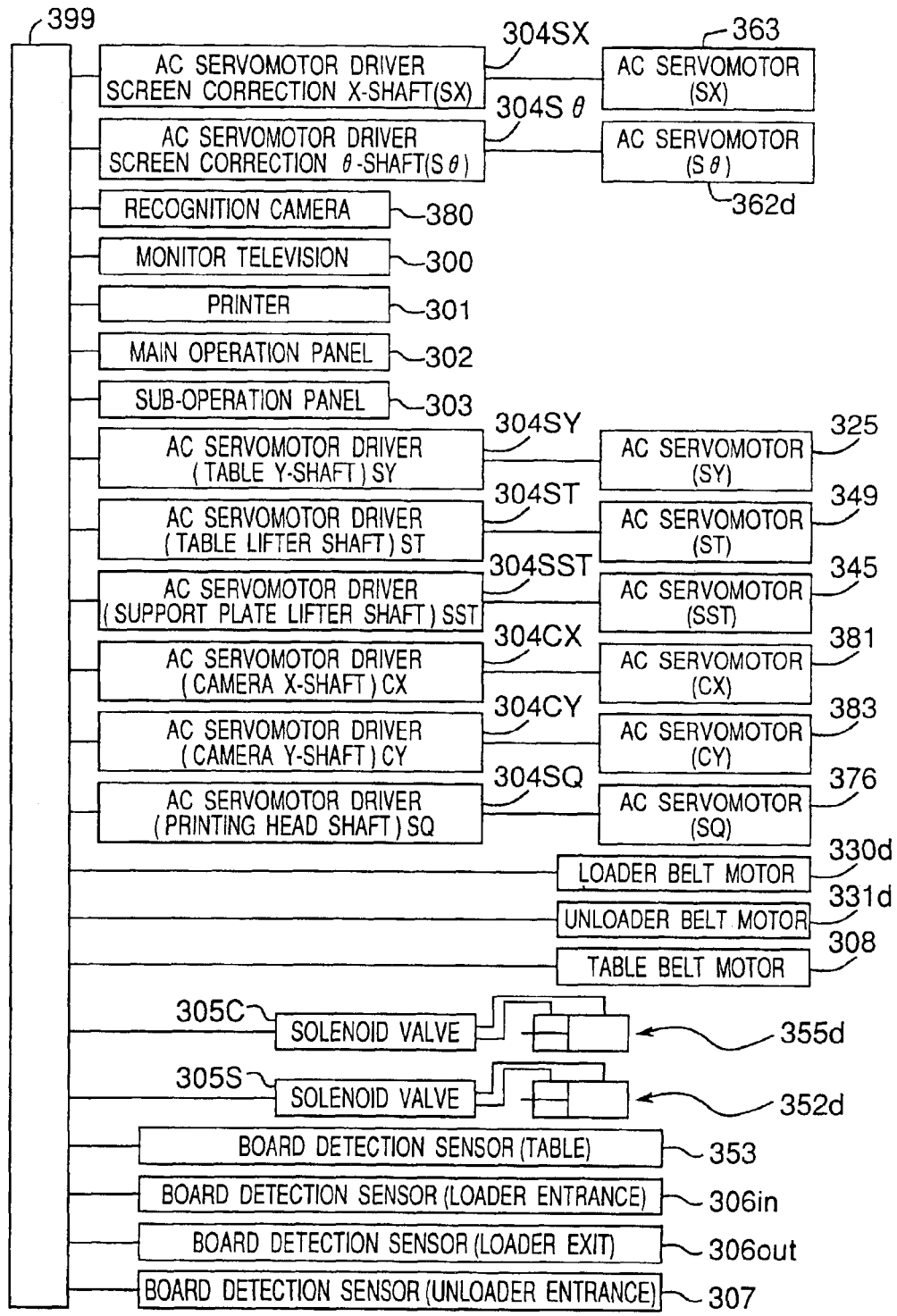
FIG. 61 is a block diagram showing a relation between the control unit and various drive devices of the screen printing apparatus of the sixth embodiment.

The aforementioned constituent elements are each controlled by the control unit (control means) 399 as shown in FIG. 60 and FIG. 61.

FIG. 60 is a timing chart showing the operation as a more concrete example. The board detection sensor (entrance) in FIG. 60 means the operation of a board detection sensor 306 in on the entrance side of the board loader 330. The board detection sensor (unloader exit) means the operation of a board detection sensor arranged on the exit or entrance (see FIG. 61) side of the unloader 331. The loader belt means the operation of a conveyance belt drive motor 330d of the board loader 330. The unloader belt means the operation of a pair of conveyance belt drive motors 331d of the board discharging loader (unloader) 331. The table belt means the operation of a pair of conveyance belt drive motors 308 of the board conveyance mechanism 351. A board stopper (cylinder) means the operation of a board stopper air cylinder 352d. The board detection sensor (table) means the operation of the board detection sensor 353. The table shaft means the operation of a table section horizontal movement motor 325 of the table section horizontal movement mechanism 322. The mark-1 movement of the table shaft means the operation of the table section horizontal movement motor 325 for movement to either one of the two positional alignment marks 1005A and 1005B of the printed board 5 in the table section. Two mark-2 movement of the table shaft means the operation of the table section horizontal movement motor 325 for movement to the other one of the two positional alignment marks 1005A and 1005B of the printed board 5 in the table section. The table lifter means the operation of the movable frame elevation motor 349 of the movable frame elevation mechanism 347. The board regulating cylinder means the operation of an air cylinder 355d of the board regulation mechanism 355. The camera X-shaft means the operation of the camera X-shaft movement motor 381. The camera X-shaft mark-1 movement means the operation of the camera X-shaft movement motor 381 for movement to either one of the two positional alignment marks 1005A and 1005B of the printed board 5 by means of the recognition camera 380. The camera X-shaft mark-2 movement means the operation of the camera X-shaft movement motor 381 for movement to the other one of the two positional alignment marks 1005A and 1005B of the printed board 5 by means of the recognition camera 380. The printing head shaft means the operation of the motor for moving the squeegee, i.e., the operation of the printing head section horizontal movement motor 376 of the printing head section horizontal movement mechanism 373. The screen correction X-shaft means the operation of the screen table section horizontal movement motor 363 of the screen table section horizontal movement mechanism 361. The screen correction (rotation) θ-shaft means the operation of the θ-table rotating drive device 362*d* of the screen table section rotation mechanism 362. The recognition means the recognition operation by the recognition camera 380. The mark-1 recognition means the recognition operation of either one of the two positional alignment marks 1005A and 1005B of the printed board 5 by the recognition camera 380. The mark-2 recognition means the recognition operation of the other one of the two positional alignment marks 1005A and 1005B of the printed board 5 by the recognition camera 380.

That is, the control unit 399 controls the board loader 330 and the board unloader 331 on the basis of a signal from the board detection sensor 353 provided for the board stopper 352. By this operation, the control unit 399 performs the loading of the board 311 onto the support base 340 by means of the board loader 330 and the unloading of the board 311 from the support base 340 by means of the board unloader 311, roughly in synchronism in the board loading and unloading direction X1.

The control unit 399 also performs roughly in synchronism the support of the board 311 on the support base 340 in accordance with the elevating operation of the support base 340 by the support base elevation mechanism 342, the positioning of the board 311 on the support base 340 by the board regulation mechanism 355, the upward movement of the movable frame 346 by the movable frame elevation mechanism 347, the horizontal movement of the table section 320 in the direction of the arrow Y by the table section horizontal movement mechanism 322, and the positioning of the board 311 in the recognition position by the upward movement of the movable frame 346 and the horizontal movement of the table section 320.

Furthermore, the control unit 399 finds the amount of positional correction for performing the relative positional alignment of the board 311 with the screen 312 on the basis of the positions of the reference position marks of the board 311 and the screen 312 recognized by the recognition camera 380. Then, the control unit 399 controls the table section horizontal movement mechanism 322, the screen table section horizontal movement mechanism 361, and the screen table section rotation mechanism 362 on the basis of the found amount of positional correction to perform the relative positional alignment of the board 311 with the screen 312.

In FIG. 61, the devices and the sensors connected to the control unit 399 are as follows. In FIG. 61, reference numeral 300 denotes a monitor television for displaying various operations, results of recognition, results of printing, and so on, 301 denotes a printer for outputting various data, 302 a main operation panel, 303 a sub-operation panel, and 304SY an AC servo motor driver for controlling the AC servo motor that is the table section horizontal movement motor 325 of the table section horizontal movement mechanism 322. Reference numeral 304ST denotes an AC servo motor driver for controlling the AC servo motor that is the movable frame elevation motor 349 of the movable frame elevation mechanism 347. Reference numeral 304SST denotes an AC servo motor driver for controlling the AC servo motor that is the support base elevation motor 345.

Reference numeral 304CX denotes an AC servo motor driver for controlling the AC servo motor that is the camera X-shaft movement motor 381. Reference numeral 304CY denotes an AC servo motor driver for controlling the AC servo motor that is the camera Y-shaft movement motor 383. Reference numeral 304SQ denotes an AC servo motor driver for controlling the AC servo motor that is the printing head section horizontal movement motor 376. Reference numeral 304SX denotes an AC servo motor driver for controlling the AC servo motor that is the screen table section horizontal movement motor 363. Reference numeral 304Sθ denotes an AC servo motor driver for controlling the AC servo motor that is the θ-table rotating drive device 362*d*. The AC servo motor drivers are connected to the control unit 399 and executes the driving control of the AC servo motors corresponding to the respective AC servo motor drivers via the respective AC servo motor drivers under the control of the control unit 399.

The control unit 399 is further connected to a pair of drive motors 330*d* of the board loader 330, a pair of drive motors 331*d* (a pair of drive motors corresponding to the pair of drive motors 330*d* of the board loader 330) of the board unloader 331, a pair of drive motors 308 of the board conveyance mechanism 351, an air cylinder 355*d* of the board regulation mechanism 355 via a solenoid valve 305*c* for controlling the air cylinder 355*d*, and a board stopper air cylinder 352*d* of the board stopper 352 via a solenoid valve 305*s* for controlling the board stopper air cylinder 352*d*.

The control unit 399 is further connected to the board detection sensor 353, the board detection sensor 306 in located on the entrance side of the board loader 330, the board detection sensor 306 out located on the exit side of the board loader 330, and the board detection sensor 307 located on the entrance side of the board unloader 331. The information detected by the sensors are inputted to the control unit 399, and the devices connected to the control unit 399 are appropriately driven to be controlled under the control of the control unit 399.

The operation of the sixth embodiment will be described next.

In the screen printing apparatus 310, the control unit 399 controls the board loader 330 and the board unloader 331 on the basis of the signal from the board detection sensor 353 in a state in which the movable frame 346 is positioned in the lowered position by the movable frame elevation mechanism 347. By this operation, the unloading of the already-printed board 311 on the support base 340 and the loading of the pre-printing board 311 onto the support base 340 are performed.

That is, the board unloader 331 unloads the already-printed board 311 on the support base 340 in the board loading and unloading direction X1. When the board detection sensor 353 comes to detect no board 311, the board loader 330 loads the pre-printing board 311 onto the support base 340 in the board loading and unloading direction X1.

Next, the control unit 399 operates the support base elevation mechanism 342, the board regulation mechanism 355, the movable frame elevation mechanism 347, and the table section horizontal movement mechanism 322 roughly in synchronism. By this operation, the pre-printing board 311 on the support base 340 is moved to the recognition position in a short time and then positioned.

That is, by moving up the support base 340 to which the pre-printing board 311 has been loaded with respect to the movable frame 346 by the support base elevation mechanism 342, the board 311 is supported to the support pins 340a of the support base 340, and the board regulation mechanism 355 positions the board 311 on the support base 340.

Furthermore, roughly in synchronization with the above operations, the movable frame elevation mechanism 347 moves up the movable frame 346 to the raised position, and the table section horizontal movement mechanism 322 moves the table section 320 so as to make the table section horizontally advance and retreat in the direction of the arrow Y. By this operation, the board 311 on the support base 340 is moved to the recognition position in a short time.

In the state in which the board 311 is located in the recognition position, the control unit 399 moves the recognition camera 380 so as to make the camera horizontally advance and retreat in the direction of the arrow X, and the table section 320 is moved so as to horizontally advance and retreat in the direction of the arrow Y by the table section horizontal movement mechanism 322. By this operation, the recognition camera 380 recognizes the reference position mark of the board 311 (when there is a plurality of reference position marks, the recognition camera. 380 and the table section 320 are respectively moved to recognize the respective reference position marks). The position of the recognized reference position mark is inputted as an electric signal from the recognition camera 380 to the control unit 399.

The control unit 399 moves the recognition camera 380 so as to make the camera horizontally advance and retreat in the direction of the arrow X and in the direction of the arrow Y, thereby making the recognition camera 380 recognize the reference position mark of the screen 312 (when there is a plurality of reference position marks, the recognition camera 380 is moved to recognize the respective reference position marks). The position of the recognized reference position mark is inputted as an electric signal from the recognition camera 380 to the control unit 399.

Then, the control unit 399 controls the table section horizontal movement mechanism 322, the screen table section horizontal movement mechanism 361, and the screen table section rotation mechanism 362 roughly in synchronism on the basis of the position of the reference position marks of the board 311 and the screen 312 recognized by the recognition camera 380, performing the relative positional alignment of the board 311 with the screen 312 in a short time.

That is, the table section horizontal movement mechanism 322 makes the table section 320 horizontally advance and retreat in the direction of the arrow Y. Moreover, the screen table section 360 that supports the screen 312 is moved by the screen table section horizontal movement mechanism 361 in the direction of the arrow X and forwardly and reversely rotated within the horizontal plane roughly parallel to the board 311 on the support base 340 by the screen table horizontal rotary mechanism 362. By this operation, the board 311 and the screen 312 are positioned relative to each other in a short time.

In this state, the control unit 399 prints the printing paste on the board 311 via the screen 312 by squeegeeing the printing paste by means of the printing squeegee 372 of the printing head section 370.

After the end of the printing, the control unit 399 moves the movable frame 346 down to the lowered position by means of the movable frame elevation mechanism 347 and controls again the board loader 330 and the board unloader 331 on the basis of the signal from the board detection sensor 353. By this operation, the already-printed board 311 on the support base 340 is unloaded in the board loading and unloading direction X1, and the pre-printing board 311 is loaded onto the support base 340 in the board loading and unloading direction X1.

Subsequently, the operations similar to those described above are repeated to successively perform the printing of the board 311.

Figure 48:
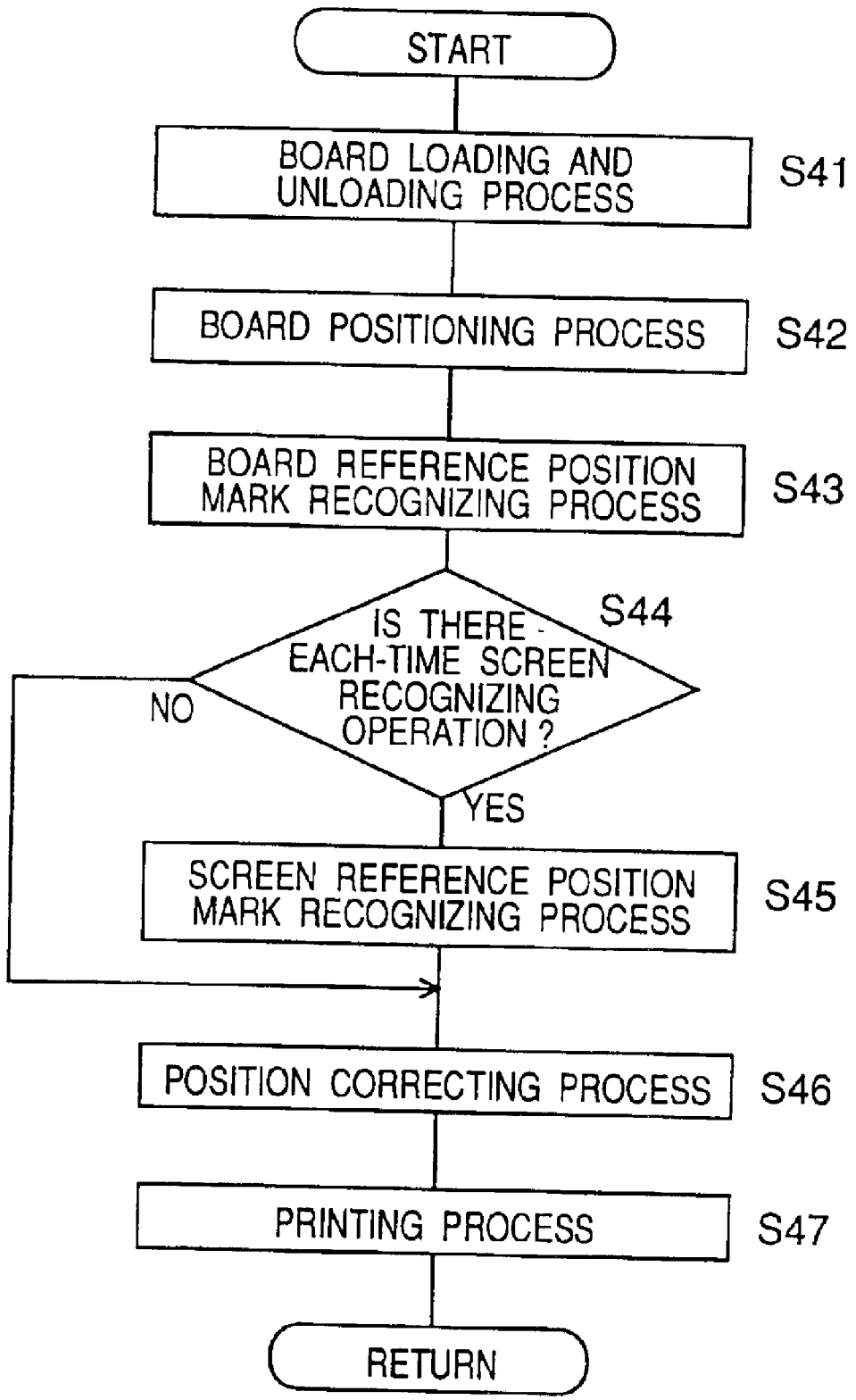
FIG. 48 is a flowchart showing the respective processes of the screen printing method of the sixth embodiment.

FIG. 48 is a flowchart showing the processes of the screen printing method.

The screen printing method by the screen printing apparatus 310 will be sequentially described below with reference to FIG. 48 step by step.

First of all, in a board loading and unloading process (step S41), the pre-printing board 311 is loaded onto the support base 340 in the board loading and unloading direction X1 by the board loader 330, and the already-printed board 311 on the support base 340 is unloaded in the board loading and unloading direction X1 by the board unloader 331 immediately before the loading of the pre-printing board 311 by the board loader 330.

Next, in a board positioning process (step S42), the support base 340 onto which the pre-printing board 311 has been loaded is moved up with respect to the movable frame 346 by the support base elevation mechanism 342 to support the board 311 on the support base 340, and the board 311 is positioned on the support base 340 by the board regulation mechanism 355. Furthermore, roughly in synchronization with these operations, the movable frame 346 is moved up by the movable frame elevation mechanism 347, and the table section 320 is made to horizontally advance and retreat in the direction of the arrow Y by the table section horizontal movement mechanism 322. By this operation, the board 311 on the support base 340 is positioned in a short time in the specified recognition position where the reference position mark recognition is performed by the recognition camera 380.

In a board reference position mark recognition process (step S43), in accordance with the horizontal movement of the recognition camera 380 in the direction of the arrow X and the horizontal movement of the table section 320 in the direction of the arrow Y by the table section horizontal movement mechanism 322, the reference position mark (refer to 1005A and 1005B) of the board 311 located in the recognition position is recognized by the recognition camera 380 (when there is a plurality of reference position marks, the recognition camera 380 and the table section 320 are each moved to make the recognition camera 380 recognize the respective reference position marks).

In a screen reference position mark recognition process (step S45), in accordance with the horizontal movement of the recognition camera 380 in the direction of the arrow X and in the direction of the arrow Y, the recognition camera 380 is made to recognize the reference position mark of the screen 312 (refer to 1003A and 1003B of the screen 3 in FIG. 32 and FIG. 33) (when there is a plurality of reference position marks, the recognition camera 380 and the table section 320 are each moved to make the recognition camera 380 recognize the respective reference position marks).

As shown in step S44, this screen reference position mark recognition process is not normally required to be executed every producing operation but required to be executed only in the first process if the screen is not detached. However, when there is a margin in the producing operation of the whole line, the process may be executed every time in order to secure the reliability of the every producing operation.

In the positional correction process (step. S46), the table section horizontal movement mechanism 322, the screen table section horizontal movement mechanism 361 and the screen table section rotation mechanism 362 are controlled by the control unit 399 on the basis of the position of each reference position mark recognized by the recognition camera 380, by which the relative positional alignment of the board 311 with the screen 312 is performed in a short time.

That is, the table section 320 is made to horizontally advance and retreat in the direction of the arrow Y by the table section horizontal movement mechanism 322. Moreover, the screen table section 360 that supports the screen 312 is moved in the direction of the arrow X by the screen table section horizontal movement mechanism 361 and rotated forwardly and reversely within a horizontal plane roughly parallel to the board 311 on the support base 340 by the screen table horizontal rotary mechanism 362. By this operation, the relative positional alignment of the board 311 with the screen 312 is performed in a short time.

In the printing process (step S47), the printing paste is printed on the board 311 via the screen 312 by squeegeeing the printing paste by the printing squeegee 372 of the printing head section 370.

After the end of the printing, the program flow returns again to the board loading and unloading process, and similar processes will subsequently be repeated.

According to the sixth embodiment described above, the control unit 399 controls the board loader 330 and the board unloader 331 on the basis of the signal from the board detection sensor 353 and performs the loading of the board 311 onto the support base 340 by the board loader 330 and the unloading of the board 311 from the support base 340 by the board unloader 331 in the board loading and unloading direction X1 roughly in synchronism.

Moreover, the control unit 399 performs roughly in synchronism the support of the board 311 on the support base 340 in accordance with the elevating operation of the support base 340 by the support base elevation mechanism 342, the positioning of the board 311 on the support base 340 by the board regulation mechanism 355, the upward movement of the movable frame 346 of the support base elevation mechanism 342 by the movable frame elevation mechanism 347, the horizontal movement of the table section 320 in the direction of the arrow Y by the table section horizontal movement mechanism 322, and the positioning of the board 311 in the recognition position where the reference position mark recognition is performed by the recognition camera 380 by the upward movement of the movable frame 346 of the support base elevation mechanism 342 and the horizontal movement of the table section 320.

Furthermore, the control unit 399 controls roughly in synchronism the table section horizontal movement mechanism 322, the screen table section horizontal movement mechanism 361, and the screen table section rotation mechanism 362 on the basis of the positions of the reference position marks of the board 311 and the screen 312 recognized by the recognition camera 380, thereby performing the relative positional alignment of the board 311 with the screen 312.

Therefore, the times required for the replacement of the board 311 and the recognition of the reference position mark by the recognition camera 380 can be remarkably reduced. By this operation, the printing time can be remarkably reduced.

Moreover, the ball thread shaft 343 and the guide shafts 327 of the ball thread mechanism are commonly used by the support base elevation mechanism 342 and the movable frame elevation mechanism 347.

That is, the ball thread shaft 343 generates a screwing action between the shaft and the ball thread nut 344 of the support base elevation mechanism 342 by being forwardly and reversely rotated in accordance with the operation of the support base elevation motor 345, thereby moving up and down the support base 340 along the guide shafts 327 via the support base elevation guides 341 with respect to the movable frame 346.

Moreover, the ball thread shaft 343 generates a screwing action between the shaft and the ball thread nut 348 with respect to the table section 320 by the forward and reverse rotation of the ball thread nut 348 of the movable frame elevation mechanism 347 in accordance with the operation of the movable frame elevation motor 349, thereby moving up and down the movable frame 346 together with the guide shaft 327.

Therefore, the weight of the portion to be moved up and down can be reduced, and it is impossible to cause the increase in the inertia as a consequence of the increase in weight dissimilar to the prior art screen printing apparatus 3110 described in Unexamined Japanese Patent Publication No. 7-329276 shown in FIG. 42 and FIG. 51, and there is caused no such issue that the hunting in accordance with the vertical movement of the support base 340 and the movable frame 346 appears significantly. With this arrangement, there is no need for waiting until, for example, the hunting disappears, and the time required for the completion of the printing can be remarkably reduced. Moreover, the travel speed can be increased by the reduction in weight of the elevation device.

Furthermore, a board stopper 352 is provided on the support base 340 so as to be able to advance and retreat, and the board stopper 352 stops the board 311 at the specified board support position on the support base 340 by being engaged with the fore end portion of the pre-printing board 311 to be loaded onto the support base 340 by the board loader 330. Furthermore, the board detection sensor 353 for detecting the presence or absence of the board 311 on the support base 340 is provided for the board stopper 352. The control unit 399 controls the board loader 330 and the board unloader 331 on the basis of the board detection signal from the board detection sensor 353.

Therefore, it is enabled to reliably prevent the contact between the loaded pre-printing board 311 and the already-printed board 311 to be unloaded when replacing the board 311 and to roughly synchronize the loading with the unloading of the board 311.

According to the present invention as described above, the board is loaded onto the support base in the specified board loading and unloading direction by the board loading device, and the board on the support base is unloaded in the board loading and unloading direction by the board unloading device roughly in synchronization with the loading of the board by the board loading device.

Then, by moving up the support base onto which the board has been loaded with respect to the movable frame by the support base elevation device, the board is supported on the support base and positioned on the support base by the board regulation device. Further, in synchronization with these operations, by moving up the movable frame by the movable frame elevation device with respect to the table section and making the table section horizontally advance and retreat in the direction roughly perpendicular to the board loading and unloading direction by the table section horizontal movement device, the board on the support base is positioned in the specified position.

Then, in accordance with the horizontal movement of the recognition camera in the board loading and unloading direction and the horizontal movement of the table section in the direction roughly perpendicular to the board loading and unloading direction by the table section horizontal movement device, the reference position mark preparatorily given to the board is recognized by the recognition camera.

Then, in accordance with the horizontal movement of the recognition camera in the board loading and unloading direction and in the direction roughly perpendicular to the board loading and unloading direction, the reference position mark preparatorily given to the screen is recognized by the recognition camera.

The relative positional alignment of the board with the screen is performed on the basis of the position of each reference position mark recognized by the recognition camera by making the table section horizontally advance and retreat in the direction roughly perpendicular to the board loading and unloading direction by means of the table section horizontal movement device, moving the screen table section that supports the screen in the board loading and unloading direction by means of the screen table section horizontal movement device, and forwardly and reversely rotating the screen table section in the horizontal plane roughly parallel to the board on the support base by means of the screen table section rotation device.

Then, the printing paste is printed on the board via the screen supported by the screen table section by means of the printing head section 370 arranged above the screen table section.

Therefore, the times required for the replacement of the board and the recognition of the reference position mark by means of the recognition camera can be reduced. With this arrangement, the printing time can be reduced.

According to the present invention, the control means performs the loading of the board onto the support base by the board loading device and the unloading of the board from the support base by the board unloading device roughly in synchronism in the specified board loading and unloading direction.

Moreover, the control means performs roughly in synchronism the support of the board on the support base in accordance with the elevating operation of the support base by the support base elevation device, the positioning of the board on the support base by the board regulation device, the vertical movement of the movable frame by the movable frame elevation device, the horizontal movement of the table section roughly perpendicular to the board loading and unloading direction by the table section horizontal movement device, and the positioning of the board in the specified position where the reference position mark recognition is performed by the recognition camera in accordance with the vertical movement of the movable frame and the horizontal movement of the table section.

Furthermore, the control means controls the table section horizontal movement device, the screen table section horizontal movement device, and the screen table section rotation device on the basis of the positions of the reference position marks of the board and the screen recognized by the recognition camera, thereby performing the relative positional alignment of the board with the screen.

Therefore, the times required for the replacement of the board and the recognition of the reference position mark by the recognition camera can be reduced. By this operation, the printing time can be reduced.

The support base is supported by the guide shafts fixed to the movable frame so as to be able to move up and down. The support base elevation device is provided with: the ball thread mechanism constructed of the ball thread shaft having the peripheral surface on which the ball thread is formed and the ball thread nut that is provided on the support base and meshed with the ball thread shaft; and the support base elevation motor for forwardly and reversely rotating the ball thread shaft of the ball thread mechanism, the mechanism and the motor being provided on the movable frame. Furthermore, the movable frame elevation device is provided with: the ball thread mechanism constructed of the ball thread shaft commonly used for the support base elevation device and the ball thread nut that is meshed with the ball thread shaft and rotatably supported by the table section; and the movable frame elevation motor for forwardly and reversely rotating the ball thread nut of the ball thread mechanism, the mechanism and the motor being provided on the table section. The ball thread shaft and the guide shafts of the ball thread mechanism are commonly used by the support base elevation device and the movable frame elevation device.

Therefore, the weight of the portion to be moved up and down can be reduced, and the hunting in accordance with the vertical movement of the support base and the movable frame can be restricted to the minimum. With this arrangement, there is no need for waiting until, for example, the hunting disappears, and the time required for the completion of the printing can be remarkably reduced.

Moreover, the board stopper is provided on the support base so as to be able to advance and retreat, and the board stopper stops the board in the specified position on the support base by being engaged with the fore end portion of the board 311 to be loaded onto the support base by the board loading device. Furthermore, the board detection sensor for detecting the presence or absence of the board on the support base is provided for the board stopper. The control means controls the board loading device and the board unloading device on the basis of the board detection signal from the board detection sensor.

Therefore, it is enabled to reduce the times required for the replacement of the board and the recognition of the reference position mark by the recognition camera and reliably prevent the contact between the loading board and the board 311 to be unloaded when replacing the board. With this arrangement, the printing time can be reduced.

Moreover, the cushioning member may be provided on the surface that belongs to the board stopper and is engaged with the board. With this arrangement, the inertial force of the loading board can be attenuated, and the vibration of the board can be stopped in an extremely short time.

According to the screen printing method of the present invention, the board is first loaded in the specified board loading and unloading direction by the board loading device onto the support base upward and downward movably supported by the movable frame that can move up and down with respect to the table section in the board loading and unloading operation. Moreover, roughly in synchronization with the loading of the board by the board loading device, the board on the support base is unloaded in the board loading and unloading direction by the board unloading device.

Next, in the board positioning operation, the board is supported on the support base by moving up the support base onto which the board has been loaded by the support base elevation device with respect to the movable frame and positioned on the support base by the board regulation device. Furthermore, roughly in synchronization with these operation, the movable frame is moved up with respect to the table section by the movable frame elevation device, and the table section is made to horizontally advance and retreat in the direction roughly perpendicular to the board loading and unloading direction by the table section horizontal movement device. By this operation, the board on the support base is positioned in the specified position.

In the board reference position mark recognition operation, the reference position mark preparatorily given to the board is recognized by the recognition camera in accordance with the horizontal movement of the recognition camera in the board loading and unloading direction and the horizontal movement of the table section in the direction roughly perpendicular to the board loading and unloading direction by the table section horizontal movement device.

In the screen reference position mark recognition operation, the reference position mark preparatorily given to the screen is recognized by the recognition camera in accordance with the horizontal movement of the recognition camera in the board loading and unloading direction and in the direction roughly perpendicular to the board loading and unloading direction. This screen reference position mark recognition operation is not always required to be performed every printing paste printing operation on the board and is allowed to be performed before the printing paste printing operation on the specified number of boards.

In the positional correction operation, the table section is moved to horizontally advance and retreat in the direction roughly perpendicular to the board loading and unloading direction by the table section horizontal movement device on the basis of the position of each reference position mark recognized by the recognition camera. Moreover, the screen table section that supports the screen is moved in the board loading and unloading direction by the screen table horizontal movement device and forwardly and reversely rotated in the horizontal plane roughly parallel to the board on the support base by the screen table section rotation device. By this operation, the relative positional alignment of the board with the screen is performed.

In the printing operation, the printing paste is printed on the board via the screen supported by the screen table section by the printing head section arranged above the screen table section.

In the screen printing apparatus of the present invention, the control means performs roughly in synchronism the loading of the board onto the support base by the board loading device and the unloading of the board from the support base by the board unloading device in the specified board loading and unloading direction.

Moreover, the control means performs roughly in synchronism the support of the board on the support base in accordance with the elevating operation of the support base by the support base elevation device, the positioning of the board on the support base by the board regulation device, the upward movement of the movable frame by the movable frame elevation device, the horizontal movement of the table section in the direction roughly perpendicular to the board loading and unloading direction by the table section horizontal movement device, and the positioning of the board in the specified position where the reference position mark recognition is performed by the recognition camera by the upward movement of the movable frame and the horizontal movement of the table section.

Furthermore, the control means controls roughly in synchronism the table section horizontal movement device, the screen table section horizontal movement device, and the screen table section rotation device on the basis of the positions of the respective reference position marks of the board and the screen recognized by the recognition camera, thereby performing the relative positional alignment of the board with the screen.

In the screen printing apparatus of the present invention, the support base elevation device generates a screwing action between the ball thread shaft and the ball thread nut that belongs to the ball thread mechanism and is meshed with the ball thread shaft by forwardly and reversely rotating the ball thread shaft of the ball thread mechanism by means of the support base elevation motor. By this operation, the support base elevation device moves up and down the support base along the guide shafts fixed to the movable frame with respect to the movable frame.

Moreover, the movable frame elevation device generates a screwing action between the ball thread nut and the ball thread shaft commonly used for the support base elevation device by forwardly and reversely rotating the ball thread nut of the ball thread mechanism rotatably supported by the table section by means of the movable frame elevation motor. By this operation, the movable frame is moved up and down by the movable frame elevation device with respect to the table section.

In other words, the ball thread shaft of the ball thread mechanism generates a screwing action between the shaft and the ball thread nut of the ball thread mechanism by being forwardly and reversely rotated by the support base elevation motor of the support base elevation device, thereby moving up and down the support base along the guide shafts with respect to the movable frame.

Moreover, the ball thread shaft of the ball thread mechanism generates a screwing action between the shaft and the ball thread nut by the forward and reverse rotation of the ball thread nut of the ball thread mechanism by the movable frame elevation motor of the movable frame elevation device, by which the shaft is moved up and down with respect to the table section, and the movable frame is moved up and down together with the guide shaft.

In the screen printing apparatus of the present invention, the board stopper provided on the support base so as to be able to advance and retreat stops the board in the specified position on the support base by being engaged with the fore end portion of the loading board onto the support base by the board loading device. The board detection sensor provided for the board stopper detects the presence or absence of a board on the support base. The control means controls the board loading device and the board unloading device on the basis of the board detection signal from the board detection sensor.

In the screen printing apparatus of the present invention, the board stopper provided on the support base so as to be able to advance and retreat stops the board in the specified position on the support base by being engaged with the fore end portion of the board loading onto the support base by the board loading device. In this stage, the board stopper is engaged with the fore end portion of the board via the cushioning member provided on the surface of engagement with the board.

(Seventh Embodiment)

The seventh embodiment of the present invention is related to a printing screen cleaning method and device and a wiping member backup member, subjected to, for example, temporarily mounting and mounting of an electronic component by printing a printing paste such as a solder paste, an insulating paste, or the like on a circuit board provided with a wiring pattern, and utilized for the manufacturing of an electronic circuit board or in a similar case.

Before explaining the seventh embodiment, a conventional issue will be described first.

The screen printing is suitable for the printing of a solder paste or an insulating paste on a circuit board in manufacturing an electronic circuit board as described above. With the increasing wiring density and component mounting density of electronic circuit boards, the printing paste printing pattern is also made fine. This causes the defective mounting and defective insulation of components even with a slight shortage of the amount of printing and becomes a reason for the short-circuit and excessive insulation between wiring patterns even with a slight surplus in the amount of printing and a slight displacement of the printing position. Therefore, high-accuracy printing is required.

Figure 73A:
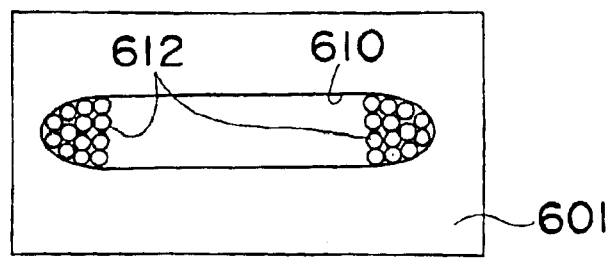
FIG. 73A, FIG. 73B, FIG. 73C, FIG. 73D, and FIG. 73E are sectional views showing the method of FIG. 72 executed in five working processes step by step.
Figure 73B:
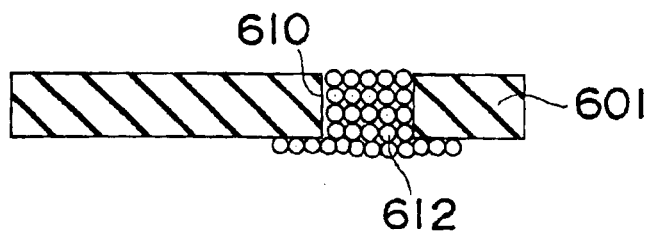

However, the printing paste supply holes formed in a specified pattern through a printing screen are also made fine in accordance with the printing pattern, and the mask separation of the printing paste is getting worse and worse. As shown in FIG. 73A and FIG. 73B, the printing paste tends to remain stuck to the inside of the printing paste supply holes 610 of a printing screen 601 and lodge in the end portions of an elongated pattern and so on.

Depending on cases, the printing paste sometimes lodges in the entire printing paste supply hole. As described above, the printing paste 612 that stays and lodges in the printing paste supply hole 610 turns around and adheres to the lower surface of the printing screen 601. The printing paste 612 oozes out of the specified printing pattern in the next printing stage or becomes printed on a portion other than the specified pattern, for which the aforementioned issue cannot completely be solved.

Figure 72:
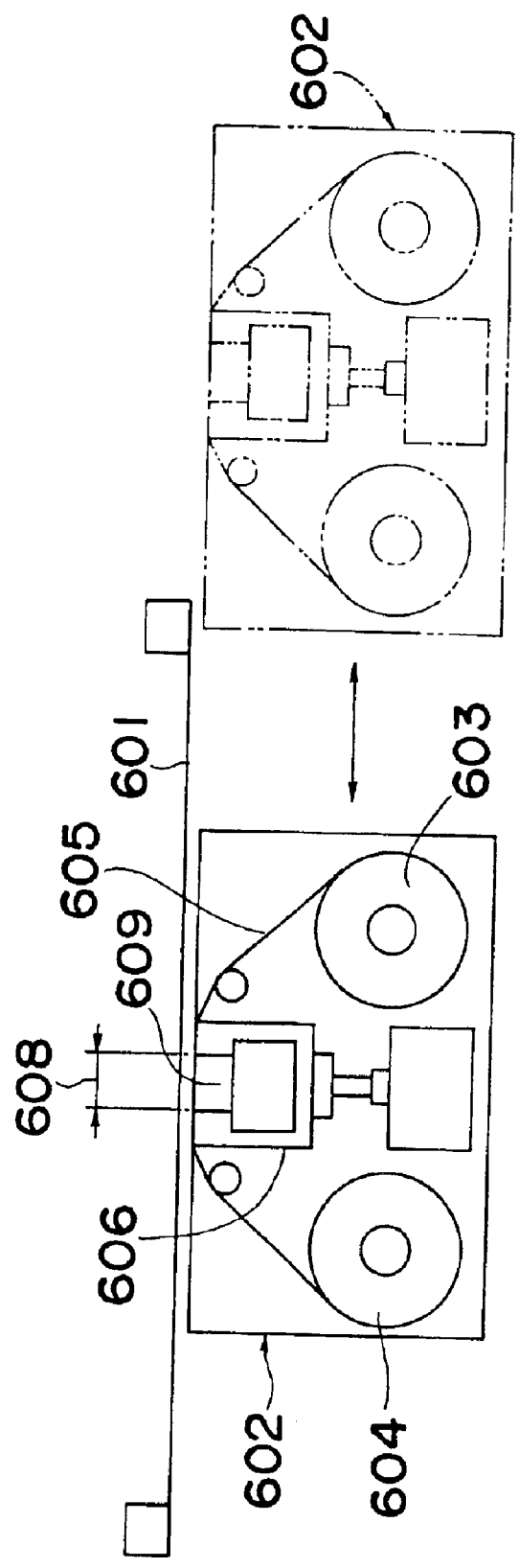
FIG. 72 is a side view showing a device for putting into practice the cleaning method of the foregoing proposed.

Accordingly, the present applicant has already proposed a cleaning device as shown in FIG. 72, which is provided with a cleaning head 602 for cleaning the printing screen 601 from the lower surface after the screen is used for printing. The cleaning head 602 is provided with a sheet-shaped wiping member 605 that is unwound from a supply section 603 and wound around a winding section 604, and a backup member 606 that backs up this wiping material 605 partway from under and presses the member against the printing screen 601, putting the member in sliding contact with the printing screen 601 with the movement of the cleaning head 602. On the backup surface of the backup member 606 is provided a suction port(s) 609 in a suction region 608 perpendicular to the sliding direction.

Figure 73C:
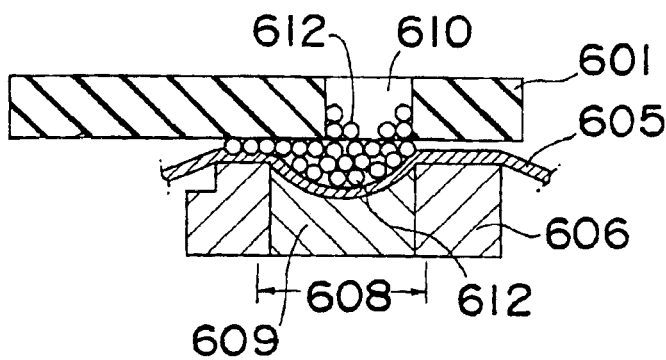

With this arrangement, the cleaning head 602 can improve the effect of cleaning the printing screen 601 by sucking the lodging printing paste 612 to the wiping member 605 side to make the paste adhere to the member by the suction via the wiping member 605 through the suction port 609 as shown in FIG. 73C in addition to the wiping by sliding the wiping member 605 on the printing screen 601. This arrangement is effective for eliminating the issues described above.

Figure 73D:
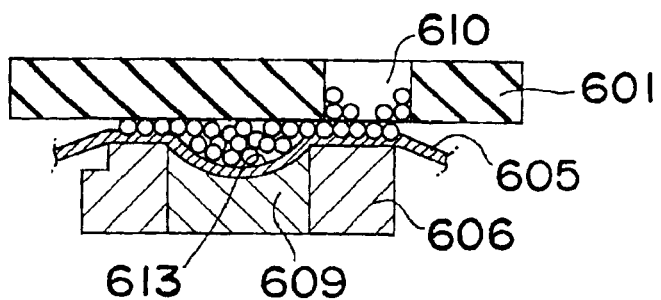
Figure 73E:
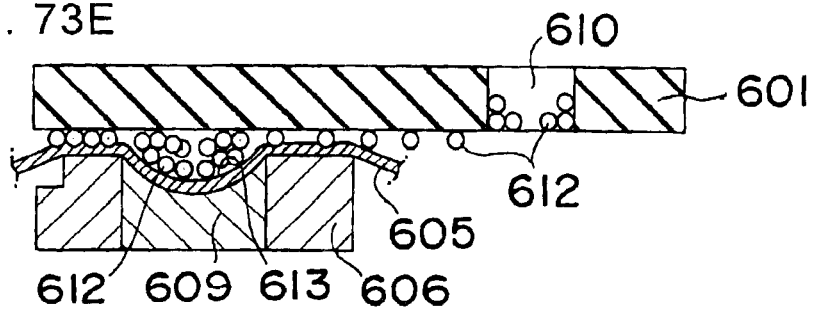

Although the present inventor and others have put the above-mentioned previously proposed technology into practical use, there is still a concern about the elimination of the defective printing as described hereinabove. The present inventors are carrying out further examination into the above-mentioned matter and attempting to improve the same. According to the aforementioned previous proposal, as shown in FIG. 73C, even when the suction region 608 of the backup member 606 passes under the printing paste supply hole 610 of the printing screen 601 to suck the printing paste 612 that has stayed and lodged in the printing paste supply hole 610, make the paste once adhere to the wiping member 605 side, and accommodate and keep the paste in a pocket portion 613 drawn in to the suction port 609, the printing paste 612 that has been once accommodated and kept in the pocket portion 613 is left in spots in portions on the lower surface of the printing screen 601 along which the backup member 606 and the wiping member 605 are passing as shown in FIG. 73E after the establishment of a positional relation such that the sliding portion of the wiping member 605 passes through the printing paste supply hole 610 and then faces the surface of the printing screen 601 by the operation of the backup member 606 as shown in FIG. 73D.

It is estimated that the printing paste 612 has a much smaller adhesion power to the printing screen 601 made of a metal than its adhesion power to the wiping member 605 made of paper or the like and the printing paste 612 once stuck to and kept by the wiping member 605 is to be carried away while being slid relative to the printing screen 601 side. However, a friction between the printing paste 612 and the printing screen 601 is not zero. Consequently, the printing paste 612 gradually shifts backward between the printing screen 601 and the wiping member 605 due to the friction between the paste and the printing screen 601 when the printing paste 612 slides between the wiping member 605 and the printing screen 601, and sometimes eventually falls off the wiping member 605 and remains stuck to the lower surface of the printing screen 601, causing an issue.

Moreover, even by the aforementioned suction, the paste sometimes stays inside the printing paste supply holes 610 of the printing screen 601. This is presumably attributed to the fact that the pocket portion 613 formed by a pull into the suction port 609 by the wiping member 605 leaves a part of the printing paste 612 that has stayed or lodged in the printing paste supply hole 610 in the printing paste supply hole 610 due to the fact that the amount of the lodging paste exceeds the accommodation capacity of the pocket portion 613.

The object of the seventh embodiment of the present invention is to provide a printing screen cleaning method and device and a wiping member backup member, capable of sufficiently stably removing the printing paste that is stuck to the lower surface of the printing screen and stays in the printing paste supply holes and achieving high-quality solder paste printing with high productivity.

The printing screen cleaning method and device and the wiping member backup member of the seventh embodiment of the present invention will be described in detail below with the embodiments thereof referring to FIG. 62A through FIG. 66, for the perception of the present invention.

Figure 66:
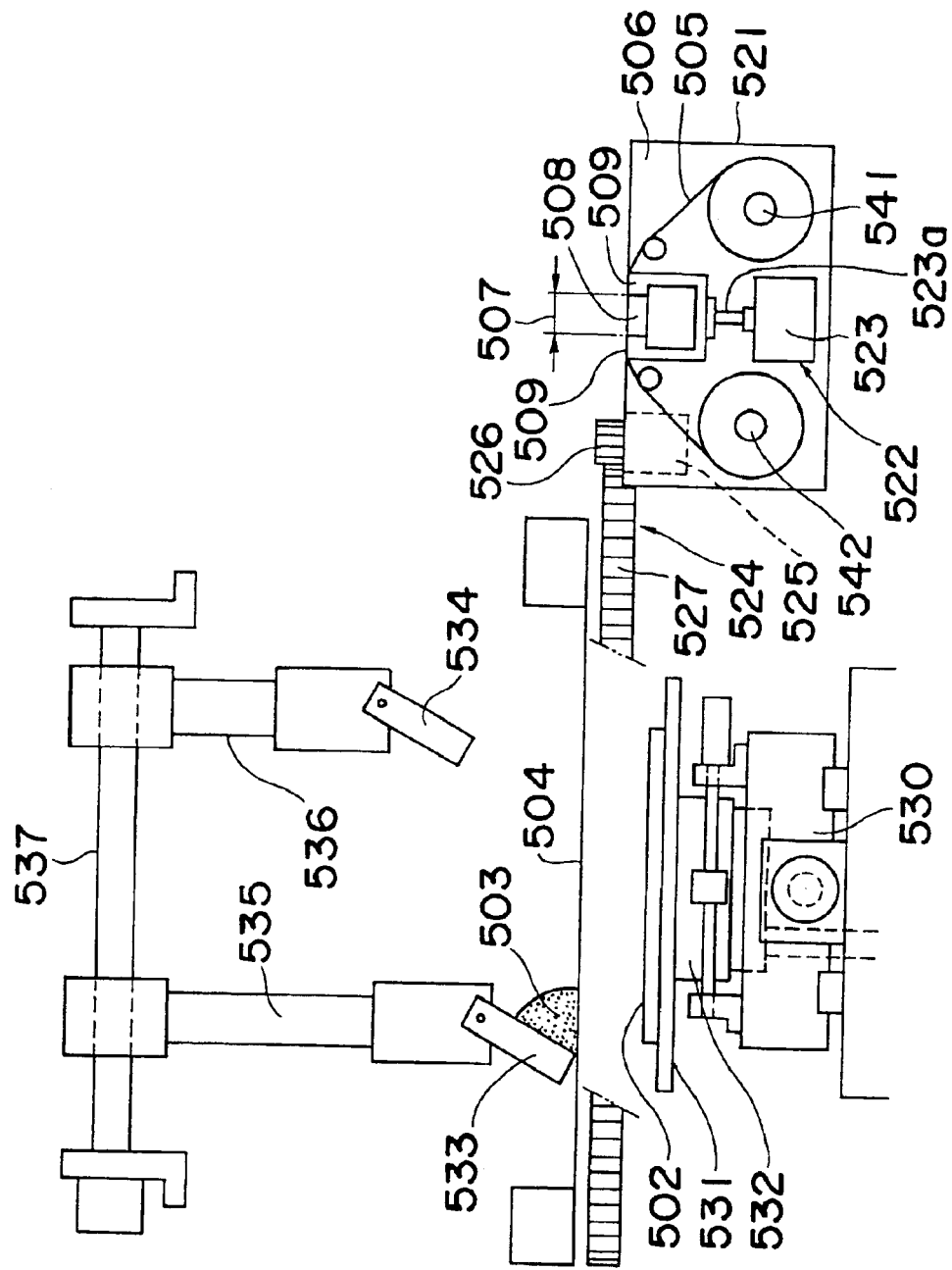
FIG. 66 is an overall schematic view of the cleaning device of the seventh embodiment and a screen printing apparatus provided with the device.

As shown in FIG. 62A through FIG. 62D, FIG. 63A, FIG. 63B, FIG. 64, and FIG. 66, the seventh embodiment is one example in which, by sliding a cleaning web 505 that is a wiping member made of paper on the lower surface of a printing screen 504 for supplying a solder paste 503 that serves as a printing paste for the mounting of an electronic component on a circuit board 502 as one example of an object to be printed that serves as a circuit-forming body through a hole 501 that serves as a printing paste supply section of a specified pattern while backing up the web by a backup member 506 so as to suck the printing paste 503 stuck to the lower surface via the wiping member through a suction port 508 provided in a suction region 507 for suction in a direction roughly perpendicular to the sliding direction while wiping the solder paste 503 off the lower surface, the solder paste 503 is stuck to the lower surface of the printing screen 504, and the solder paste 503 that lodges in the hole 501 is sucked to the cleaning web 505 side so as to be stuck to and kept by the web for the cleaning of the printing screen 504; and the example is applied to a screen printing apparatus as shown in FIG. 66.

In this screen printing apparatus, a circuit board 502 placed on a printing stage 531 is positioned and held in a specified position on a horizontal plane by a positioning mechanism 530, and thereafter, the printing stage 531 is moved up to a specified position by an elevation device 532 that utilizes an air cylinder or the like, by which the circuit board 502 is lifted up to the printing position of the printing screen 504 and subjected to screen printing. Above the screen 504, one or a plurality of squeegees 533 and 534 of varied sizes and different materials is supported so as to be able to be moved up and down by air cylinders 535 and 536. After the squeegee to be used is moved down and pressurized on the printing screen 504, the squeegee 533 or the squeegee 534 is moved in the direction in which it is inclined on the printing screen 504 by the rotative driving of a threaded shaft 537 of which the forward and reverse rotation is selected. The squeegee is made to advance while pressurizing the printing paste 503 supplied onto the screen 504 against the upper surface of the screen 504, thereby supplying the paste according to the shape of the pattern of the holes 501 on the circuit board 502 through the holes 501 provided in portions of the printing screen 504. Subsequently, the screen 504 is separated from the circuit board 502 by the upward movement of the printing screen 504 or the downward movement of the circuit board 502 or both of them, leaving the solder paste 503 supplied onto the circuit board 502, for the achievement of the printing.

Figure 62A:
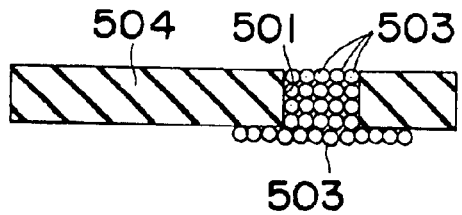
FIG. 62A, FIG. 62B, FIG. 62C, and FIG. 62D are sectional views showing a cleaning device for putting a cleaning method according to a seventh embodiment of the present invention into practice executed in five working processes step by step.
Figure 62B:
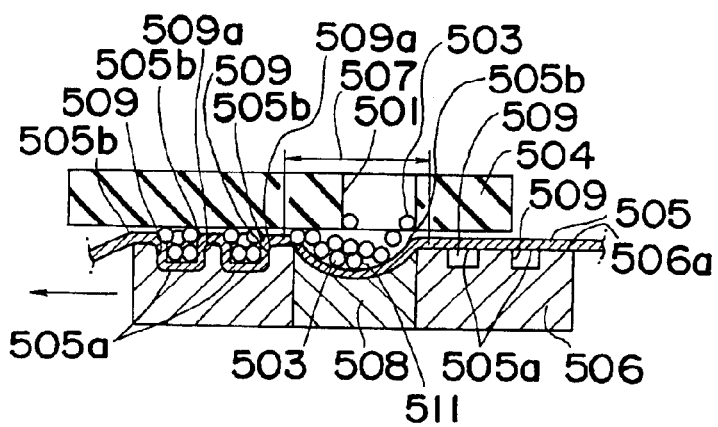

Even if the solder paste 503 stays by adhering to the lower surface of the screen 504 or lodging in the end portion in the lengthwise direction of the hole 501 as shown in FIG. 62A after the screen printing as described above, by wiping the paste by sliding the cleaning web 505 in the direction indicated by the arrow in FIG. 62B or in the direction opposite to the direction on the lower surface of the screen 504 with the cleaning web 505 backed up by the backup member 506 according to the aforementioned cleaning, and sucking the paste via the cleaning web 505 through the suction port 508 provided in the suction region 507 extended in the direction roughly perpendicular to the sliding direction, the solder paste 503 that is stuck to the lower surface of the screen 504 or stays in the hole 501 is sucked to the cleaning web 505 side so as to be stuck to and kept by the web. Therefore, more effective cleaning than in the case of only the wiping can be achieved, and the accuracy of printing of the solder paste 503 on the circuit board 502 is increased by that much.

However, the present invention is not limited to the one that has been described hereinabove and shown in the drawings and is effective when it is applied to a variety of screen printing apparatuses such that the printing is performed by supplying various sorts of printing pastes including, for example, an insulating paste intended for providing insulation of the circuit board 502 from electronic components to be mounted on the board other than the solder paste 503 on various sorts of objects to be printed through the printing paste supply section formed in accordance with the specified pattern of the screen 504, and the printing paste such as the solder paste 503 is left on the lower surface of the screen 504 and the like even by the aforementioned cleaning, exerting bad influence on the next printing. Moreover, the printing paste supply section is only required to be able to supply the printing paste onto the object to be printed according to the specified pattern, and various types such as a mesh section other than the hole 501 can be adopted so long as the printing paste is allowed to pass through it according to the specified pattern. The wiping member is only required to be made of a material that brings a wiping function into effect on the screen 504 with at least one of the adhesive property and the catching property of the printing paste made higher than that of the lower surface of the screen 504 or for a similar reason and has an air permeability such that the suction from the back surface takes effect on the surface side. Various sorts of sheet materials of unwoven cloth, cloth, and knitting can be used besides paper. The backup member 506, which is made of a metal in terms of durability and processability, is basically only required to bring a backup function into effect, and a nonmetal material of synthetic resin or the like can also be adopted.

In addition to the aforementioned effective cleaning, the cleaning method of the seventh embodiment has a further particular operation that, when a backup release section 505a where the backup is partially released by a groove 509 arranged parallel to the suction region 507 of the backup member 506 of the cleaning web 505 faces the solder paste 503 stuck to the lower surface of the screen 504 as shown in FIG. 62B, a portion that belongs to the cleaning web 505 and is supported by an opening edge 509a on the rear side in the sliding direction of the groove 509 in the backup release section 505a operates as a scraping edge 505b of the solder paste 503 so as to scrape the solder paste 503 stuck to the lower surface of the screen 504, and the backup release section 505a retreats into the groove 509 to form a pocket 511 for accommodating and keeping the scraped solder paste 503. Therefore, the amount of solder paste 503 removed and carried away from the screen 504 by the cleaning web 505 is increased to allow the cleaning effect to be further improved.

Figure 62C:
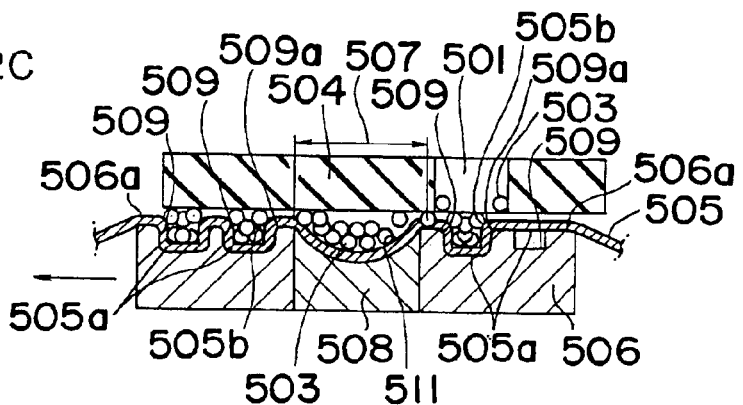

Here, in the state in which the cleaning by the backup release section 505a precedes the cleaning by the suction region 507 shown in FIG. 62B and FIG. 62C, there is produced the synergetic effect that the amount of solder paste 503 to be accommodated in the pocket 511 formed by pulling the cleaning web 505 into the suction port 508 through the cleaning in the suction region 507 is reduced by the amount of solder paste 503 removed through the cleaning by the backup release section 505a, and the amount of solder paste 503 that is staying and lodging in the hole 501 and is able to be sucked and accommodated is increased, for the improvement of the cleaning effect.

Figure 62D:
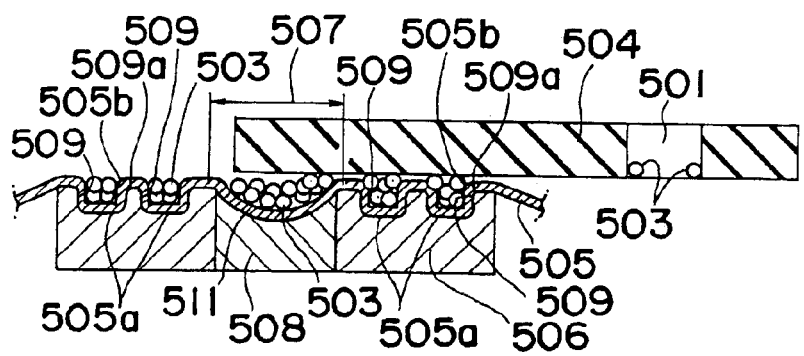

In the state in which the cleaning by the backup release section 505a succeeds the cleaning by the suction region 507 shown in FIG. 62D, there is produced the synergetic effect that the cleaning by suction is assisted by scraping and removing the solder paste 503, which is accommodated and kept in the pocket 511 formed by pulling the cleaning web 505 into the suction port 508 in the cleaning portion by the preceding suction region 507 and left behind on the lower surface of the screen 504 as shown in FIG. 62D, through the cleaning by the backup release section 505a as shown in FIG. 62D, for the improvement of the cleaning effect.

Although it is effective to achieve either one of these two cleaning states, the cleaning effect is doubled by concurrently using both the cleaning manners. Moreover, it is enabled to cope with them by providing the cleaning portion of the suction region 507 and the cleaning portion of the backup release section 505a by the required number in repetition in the sliding direction or providing a plurality of same cleaning portions arranged in accordance with the need. If two types of cleaning portions are arranged symmetrically about the center in the sliding direction, then the same cleaning effect can be obtained by the sliding in either one of the forward and reverse directions, and this arrangement is advantageous when performing cleaning by reciprocal sliding.

In order to achieve the cleaning method as described above, a cleaning device as shown in FIG. 66 is provided with a cleaning head 521, in which suction is performed via the cleaning web 505 through the suction port 508 provided in the suction region 507 in the direction roughly perpendicular to the sliding direction of a backup surface 506a for performing the backup while sliding the cleaning web 505 on the lower surface of the screen 504 with the web backed up by the backup member 506, and the cleaning head 521 is used with various sorts of backup members 506 shown in FIG. 63A through FIG. 65B selectively mounted.

The selected backup member 506 is supported so as to be able to move up and down by being mounted on the tip of an upwardly directed piston rod 523a of an air cylinder 523 that is one example of an elevation device 522 on the cleaning head 521, so that the backup member 506 is able to be pressurized against the screen 504 on the cleaning head 521 or release the pressurization. The cleaning head 521 is moved into or out of a position under the screen 504 from the standby position located beside the screen 504 and reciprocally moved under the screen 504 by a movement device 524. The movement device 524 is constructed of a driving gear 526 driven by being directly connected to a motor 525 arranged on the cleaning head 521 and a rack 527 to be meshed with this driving gear 526, as an example. By moving forwardly the cleaning head 521 to the screen 504 side or reversely to the standby position side by rotatively driving the driving gear 526 by selection between forward and reverse rotations. Depending on the timing of forward and reverse rotations, the cleaning head 521 can also be reciprocally moved by the required number of times under the screen 504.

The cleaning head 521 does not impede the printing operation of the solder paste 503 on the circuit board 502 by the screen 504 in the screen printing apparatus by standing by in the standby position during the printing operation. Every time the printing is performed once or every time the printing is performed a specified number of times or on each required occasion, the cleaning head 521 is moved under the screen 504 by moving up the backup member 506, the aforementioned operation of repetitively performing the cleaning and getting ready for the next printing is executed, guaranteeing the stable performance of high-accuracy printing for a long term.

The cleaning web 505 is extended between a supply section 541 and a winding section 542 along the backup surface 506a of the backup member 506, copes with the upward movement of the backup member 506 by the feed thereof from the supply section 541, and updates the cleaning region subjected to the cleaning while being backed up by the backup surface 506a by the feed from the supply section 541 and the winding in the winding section 542. This updating is preferably performed in a state in which the cleaning web 505 is separated from the screen 504 in terms of preventing the solder paste 503 that has been wiped to the cleaning web 505 side from being retransferred to the screen 504 side. For this purpose, it is proper to move down the backup member 506 for the release of the pressurization of the cleaning web 505 against the screen 504 or move the head into a position located out of the screen 504. It is to be noted that the slackening of the cleaning web 505 when the pressurization of the cleaning web 505 against the screen 504 is released by moving down the backup member 506 can be eliminated by the winding in the winding section 542. Moreover, the state in which the pressurization of the cleaning web 505 against the screen 504 is released means that the cleaning head 521 is able to move under the screen 504 without the cleaning operation and able to freely move by avoiding contact with the screen 504.

Every time the cleaning ends once, by winding the cleaning web 505 by the winding section 542 in accordance with the feed and supply of the cleaning web 505 from the supply section 541, the cleaning can be performed every time by the new cleaning web 505, and the aforementioned more effective cleaning function can stably be maintained.

Figure 63A:
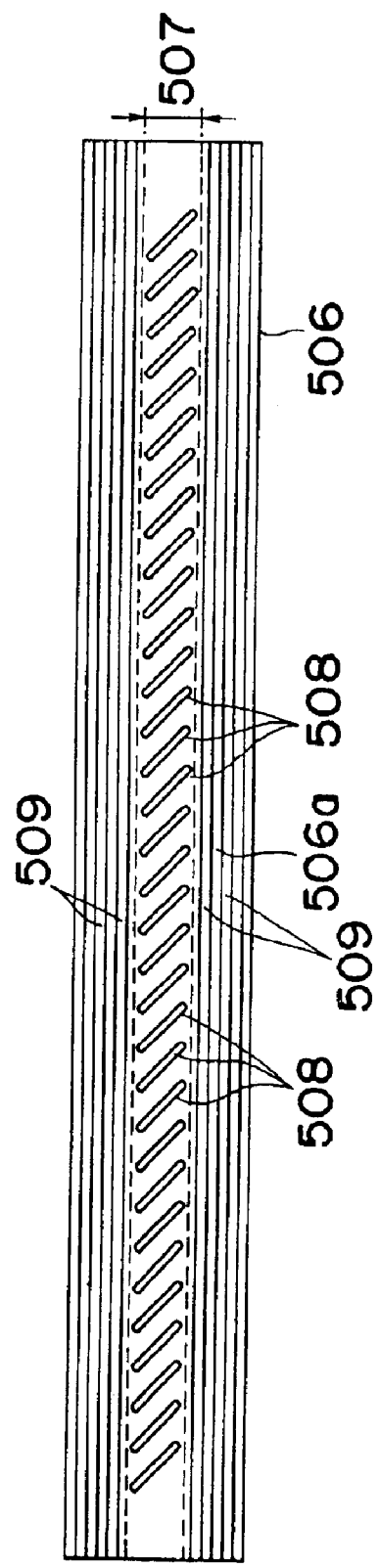
FIG. 63A and FIG. 63B are a plan view and an end view, respectively, of the backup member of the cleaning device of the seventh embodiment.

The suction ports 508 are provided in an array in a direction perpendicular to the sliding direction in the suction region 507 as shown in FIG. 63A and FIG. 65A. With this arrangement, the suction force is increased by reducing the individual suction ports 508 while securing the required amount of suction air depending on the total opening area, by which the suction efficiency is increased, guaranteeing the aforementioned cleaning function.

Furthermore, the suction ports 508 are formed in a slit-like form inclined in the sliding direction and formed so that the suction ports 508 overlap in the direction perpendicular to the sliding direction. With this arrangement, the suction via the cleaning web 505 is consistently effected on the screen 504 through any one of the suction ports 508 and is able to be continuously effected on the entire region of the lower surface of the screen 504 by the successive continuous change of the suction position.

In this case, the total aperture area of the suction ports 508 formed in an array is formed so that a value obtained by multiplying a flow rate Q of air that passes through the suction ports 508 by a velocity V of air is maximized. Moreover, the area can be formed so that a suction force F is maximized by multiplying the total aperture area A of the suction ports 508 by the square of the velocity V of air that passes through the suction ports 508.

In general, as an expression that expresses the power F of air blow, there is known the following expression (1):

$$Fa = \rho \times Q \times V/g = \rho \times A \times V^2/g \qquad (1)$$

the suction force F can also be similarly expressed by Fa=F, and the formation of the total aperture area of the suction ports 508 is determined in correspondence with this.

Figure 63B:
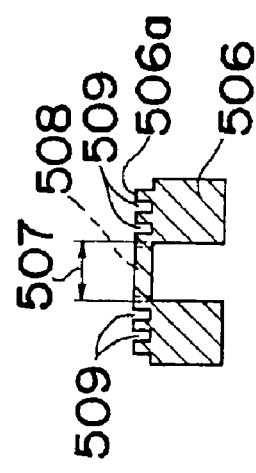

Describing the representative concrete example of the backup member 506 shown in FIG. 63A through FIG. 65B, the backup member 506 shown in FIG. 63A and FIG. 63B is adopted by the cleaning method shown in FIG. 62A through FIG. 62D, which shows a symmetrical shape type provided with two grooves 509 located on each of both sides of one suction region 507, producing the same cleaning effect during a reciprocal sliding motion. In this embodiment, by setting the thickness of the cleaning web 505 to 0.25 mm, the depth of the groove 509 to 2 mm, groove width to 3 mm, the length of one suction port 508 to 7 to 8 mm, suction port width to 3 mm, and the travel speed of the cleaning head 521 to 100 mm/sec which is double that of the conventional value of 40 to 50 mm/sec, the solder paste 503 stuck to the lower surface of the screen 504 through one sliding stroke has become nothing, and the amount of solder paste 503 staying inside the suction port 508 has become remarkably reduced. It is to be noted that the groove 509 is only required to form a scraping edge 505b at the cleaning web 505, and the edge is preferably at right angle with respect to the backup surface 506a. However, the groove edge is not limited to this, and an inclined surface is acceptable. It has discovered that a similar scraping edge 505b is formed as shown in the figure in other portions of the backup member 506 and effectively operating. The shape of the lower portion of the groove 509 is only required to be the one that does not impede the formation of a pocket 511 effective for the cleaning as a consequence of the entry of the cleaning web 505, and the shape thereof is not particularly specified.

Figure 64:
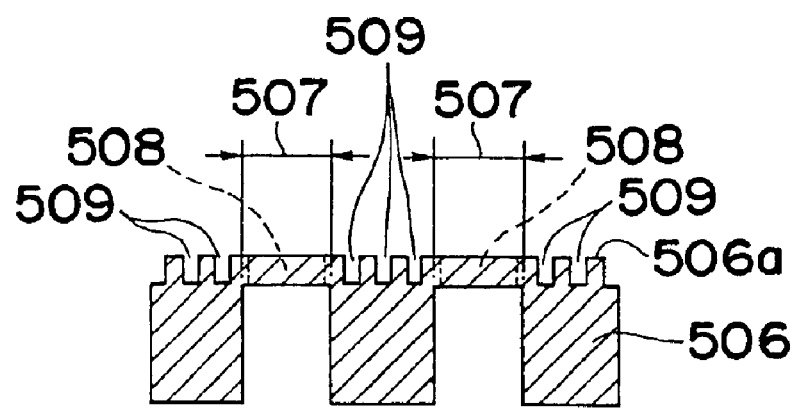
FIG. 64 is an end view showing another example of the backup member of the cleaning device of the seventh embodiment.

The backup material 506 of the embodiment shown in FIG. 64 has two suction regions 507 arranged parallel, and two grooves 509 are provided on each of both sides of the portion where these regions are arranged parallel and between these two suction regions 507. The cleaning effect is improved further than that of the embodiments of FIG. 63A and FIG. 63B by virtue of the increased number of suction regions 507 and grooves 509. This embodiment is also the symmetrical type and able to produce the same cleaning effect during the reciprocal sliding.

The backup member 506 of the embodiment shown in FIG. 65A and FIG. 65B has two suction regions 507 arranged parallel and is provided with two grooves 509 located on each of both sides of the portion where these regions are arranged. The cleaning effect is improved further than that of the embodiments of FIG. 63A and FIG. 63B by virtue of the increased number of suction regions 507. This arrangement is appropriate for removing the solder paste 503 located on the lower surface of the screen 504 and, in particular, more easily removes the printing paste 503 that is staying and lodging in the holes 501 of the screen 504. This embodiment is also the symmetrical type and able to produce the same cleaning effect during the reciprocal sliding.

In short, the present invention is effective when the numbers of the suction regions 507 and the grooves 509 provided and the order of arrangement in the sliding direction are set in various combinations.

(Eighth Embodiment)

According to the eighth embodiment shown in FIG. 67A through FIG. 71, as a modification example of the seventh embodiment, as shown in FIG. 67A through FIG. 67D, when performing the aforementioned proposed cleaning of the screen 504 by sucking the solder paste 503 that is stuck to the lower surface of the screen 504 or staying in the holes 501 toward the cleaning web 505 side to be adhered and kept to the web 505 through the processes of sliding the cleaning web 505 that serves as a wiping member on the lower surface of the printing screen 504 for supplying the solder paste 503 that serves as a printing paste on a circuit board that serves as an object to be printed through the holes 501 that serves as a printing paste supply section of a specified pattern with the cleaning web 505 backed up by the backup member 506 as shown in FIG. 67A through FIG. 67D and sucking the solder paste 503 stuck to the lower surface of the screen 504 via the cleaning web 505 through the suction port 508 provided through the backup member 506 while wiping the solder paste 503, the cleaning is performed by continuously sucking the paste by means of the plurality of suction ports 508 arranged in the sliding direction as shown in FIG. 67A through FIG. 69 and FIG. 70A. The plurality of suction ports 508 may satisfy the same conditions with an inclined arrangement as shown in FIG. 63A and FIG. 63B.

With this arrangement, in cleaning the screen 504 similarly to the aforementioned proposed case, a greater amount of stayed solder paste 503 is sucked by repetitively continuously performing the suction by the plurality of suction ports 508, by which a greater amount of paste is accommodated and kept in the plurality of pockets 511 formed by the entry of the cleaning web 505 into the plurality of suction ports 508. Therefore, the cleaning effect is further improved, and high-quality printing can be guaranteed while coping with a further increase in the cleaning speed.

Figure 67A:
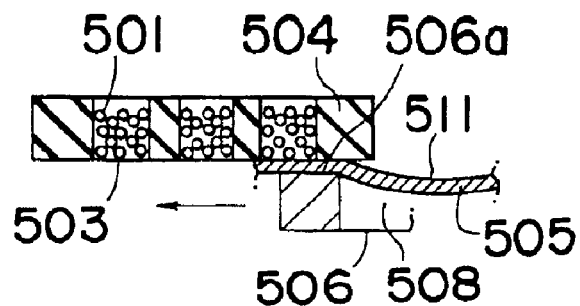
FIG. 67A, FIG. 67B, FIG. 67C, and FIG. 67D are sectional views showing a cleaning device for putting a cleaning method according to an eighth embodiment of the present invention into practice executed in four working processes step by step.
Figure 67B:
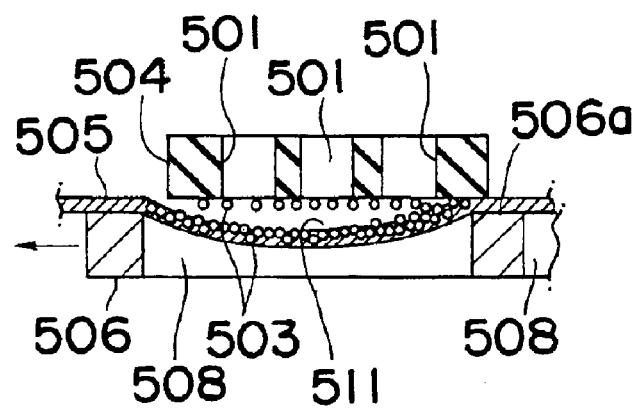
Figure 67C:
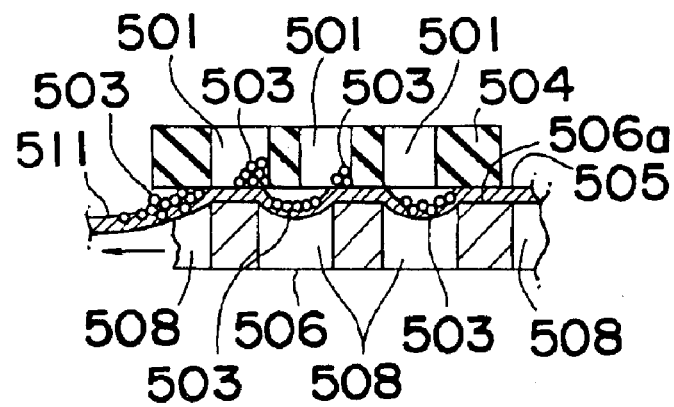
Figure 67D:
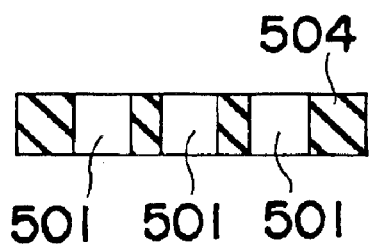
Figure 68:
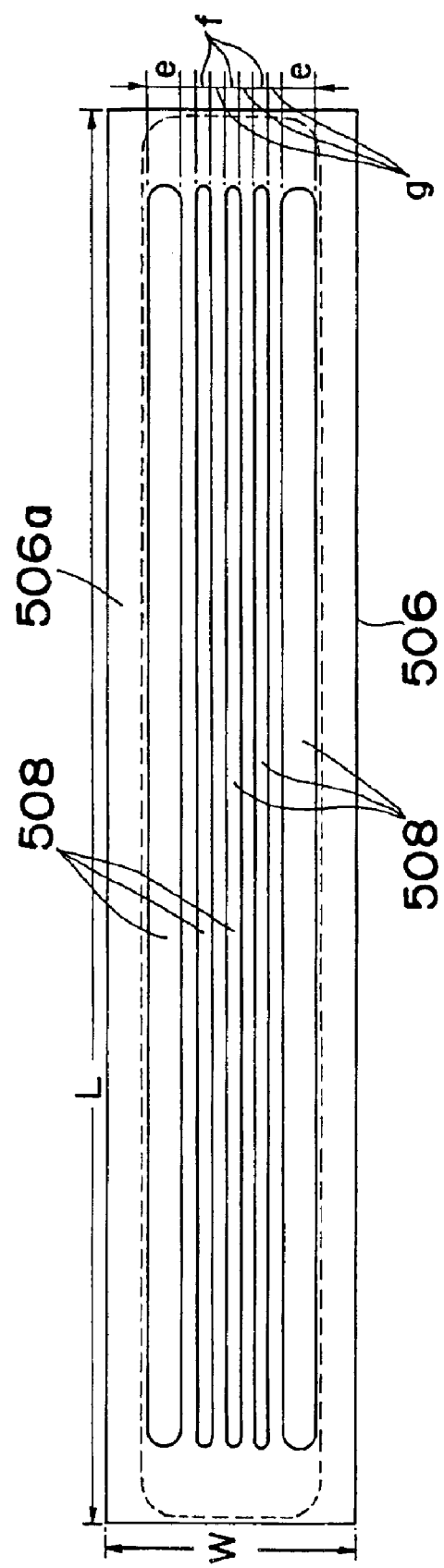
FIG. 68 is a plan view showing the backup member of the cleaning device of the eighth embodiment.

Such a method can be achieved by making use of the aforementioned features of this device merely by using the cleaning device of the printing screen of the eighth embodiment with the backup member 506 replaced by that of the eighth embodiment. In this case, if a plurality of suction ports 508 are provided in the suction region 507 in the direction roughly perpendicular to the sliding direction and the suction ports 508 are arranged parallel in the suction region 507 and the suction area thereof reduces sequentially in the sliding direction as shown in FIG. 67A, FIG. 68, and FIG. 70A, on the backup surface 506a of the backup member 506, then the suction, removal, and accommodation of the residual solder paste 503 by the plurality of suction ports 508 are achieved first at a great rate of removal by the suction ports 508 of large suction port areas, and subsequently the suction, removal, and accommodation of the residual solder paste 503 reduced in amount are achieved by the succeeding suction ports 508 whose suction area is reduced without occupying a large space. Then, a cleaning effect higher than when one suction port continuously cleans the paste can be produced.

Moreover, if a plurality of suction ports 508 are in proximity to each other arranged as in the embodiment shown in the figures, then the plurality of suction ports 508 can easily synergetically operate, and this arrangement is preferable in terms of space saving. Furthermore, by virtue of the provision of the plurality of suction ports 508 laterally symmetrically in the sliding direction like the embodiment shown in the figures, a stable cleaning effect of no difference between the forward sliding and the reverse sliding can be produced in performing the cleaning in the reciprocal sliding manner. When the suction area is reduced stepwise, the suction ports 508 located on both sides are larger, and those located inside are smaller as shown in the figures. Therefore, the cleaning is further performed with the suction area increased stepwise after the effective cleaning with the suction areas of the aforementioned dimensional relation, and therefore, the cleaning effect is further increased and stabilized.

The size in the sliding direction of the backup member 506 is restricted by the dimensional relation to the size of the entire device and the like. According to one working example, the width w in the sliding direction of the backup member 506 is 70 mm, the width e of the wide suction ports 508 located on both sides is 10 mm, the width f of the three narrow suction ports 508 is 4 mm, and the proximity interval g of the suction ports 508 is 4 mm. It is to be noted that the length L of the backup member 506, which is varied depending on the size of circuit board that is the object to be printed, is 390 mm according to one example.

When a vacuum source is set to a rated flow rate of 1.2 $m^3$/min and a rated static pressure of 2000 mmAg on the conditions of this working example, FIG. 62A through FIG. 62D and FIG. 71 show the cleaning effects at various cleaning speeds in cleaning the screen 504 in which the holes 501 for mounting the leads of a QFP type semiconductor element of a rectangle of about 1 mm×2 mm are arranged which is estimated in terms of the retention rate of the solder paste 503 after the cleaning of the holes 501 when the solder paste 503 staying in the entire region of the holes 501 is removed by the cleaning in comparison with the case of the comparative example that has only one suction port of a width of 10 mm. In the working example, the solder paste 503 had a small residue of a fraction of that of the comparative example, and the residue of the solder paste 503 was able to be suppressed to an amount slightly exceeding the residue in the case of the comparative example in which the printing speed is 100 mm/sec even during a high-speed cleaning of 300 mm/sec. The residual rate of the solder paste 503 was calculated on the assumption that the aperture area of the holes 501 was C, the area of removal of the solder paste 503 after the cleaning was A, and the area of residue of the solder paste 503 after the cleaning was B, according to the expression that residual rate (%)=(A/C)×100.

It is to be noted that the three or more suction ports 508 arranged in the sliding direction may be set so that the widthwise size gradually changes in the sliding direction, and the style of change may be set in a variety of ways. Furthermore, the preceding suction port 508 can cope more with the high-speed cleaning as the width thereof is greater. When a suction port 508 of a small width precedes, a sufficient cleaning effect cannot be obtained, hardly coping with the high-speed printing. Also, in the eighth embodiment shown in FIG. 67A through FIG. 69 and FIG. 70A, it is effective to concurrently use the groove 509 of the embodiment shown in FIG. 62A through FIG. 66, and such a example is shown in FIG. 70B.

As is apparent from the above description according to the present invention, in addition to the cleaning effect by suction according to the previous proposal, by producing the cleaning effects of the printing paste scraping edge function and the function of is accommodating and keeping the solder paste that has been scraped off in the pocket by the backup release section, the cleaning effect is further improved, and high-performance printing can be guaranteed.

Moreover, in addition to the cleaning effect by suction of the previous proposal, by accommodating and keeping a greater amount of solder paste in the plurality of pockets formed by the entry of the cleaning web into the suction ports as a result of the plural pockets while sucking an increased amount of residual solder paste through the repetitive continuous suction by the plurality of suction ports, the cleaning effect can be improved, and high-performance printing can be guaranteed coping with the further increase in the cleaning speed.

The printing screen cleaning method of the present invention has one feature that, in cleaning the printing screen by sucking the printing paste that is stuck to the lower surface of the printing screen and staying in the printing paste supply section to the wiping member side to stick and keep the paste by sucking the paste via the wiping member through the suction port provided in the suction region extended in the direction roughly perpendicular to the sliding direction while wiping the printing paste stuck to the lower surface of the printing screen by sliding the sheet-shaped wiping member on the lower surface of the printing screen for supplying the solder paste to the object to be printed through the printing paste supply section of the specified pattern with the wiping member backed up by the backup member, the cleaning is performed by sliding the wiping member on the printing screen in the state in which the backup of the wiping member is partially released by the groove parallel to the suction region of the backup member.

According to the construction described above, in addition to the cleaning of the printing screen similarly to the aforementioned previously proposed case in which the printing paste that is stuck to the lower surface of the printing screen and staying in the printing paste supply section is stuck and kept by suction to the wiping member side by wiping the paste by sliding the wiping member on the lower surface of the printing screen with the wiping member backed up by the backup member and sucking the paste via the wiping member through the suction port provided in the suction region extended in the direction roughly perpendicular to the sliding direction, when the portion which belongs to the wiping member and in which the backup is partially released by the groove parallel to the suction region of the backup member faces the solder paste stuck to the lower surface of the printing screen, the portion that belongs to the wiping member and is supported by the opening edge on the rear side in the sliding direction of the groove in the backup release section operates as the solder paste scraping edge to scrape off the solder paste stuck to the lower surface of the printing screen, and while scraping off the backup release section retreats inside the groove so as to form a pocket to accommodate and keep the solder paste scraped off. Therefore, the amount of printing paste removed and carried away from the printing screen by the wiping member is increased to allow the cleaning effect to be further improved.

In this case, in the state in which the cleaning in the backup release section precedes the cleaning by the suction region, there is produced the synergetic effect that the amount of solder-paste to be accommodated in the pocket formed by pulling the wiping member into the suction port through the cleaning in the suction region is reduced by the amount of solder paste removed through the cleaning by the backup release section, and the amount of solder paste that is staying and lodging in the printing paste supply section and is able to be sucked and accommodated is increased, for the improvement of the cleaning effect. Moreover, in the state in which the cleaning by the backup release section succeeds the cleaning by the suction region, there is produced the synergetic effect that the cleaning by suction is assisted by scraping and removing the solder paste, which is accommodated and kept in the pocket formed by pulling the wiping member into the suction port in the cleaning portion by the preceding suction region and left behind on the lower surface of the printing screen, through the cleaning by the backup release section, for the improvement of the cleaning effect.

Although it is effective to achieve either one of these two cleaning states, the cleaning effect is doubled by concurrently using both the cleaning manners. Moreover, it is enabled to cope with them by providing the cleaning portion by suction and the cleaning portion by the backup release section by the required number in repetition in the sliding direction or providing a plurality of same cleaning portions arranged in accordance with the need. If two types of cleaning portions are arranged symmetrically about the center in the sliding direction, then the same cleaning effect can be obtained by the sliding in either one of the forward and reverse directions, and this arrangement is advantageous when performing cleaning by reciprocal sliding.

The above cleaning method can be achieved by a cleaning device of the printing screen for supplying printing paste onto the object to be printed through the printing paste supply section of the specified pattern and the device being provided with the cleaning head for sucking the paste via the wiping member through the suction port provided in the suction region extended in the direction roughly perpendicular to the sliding direction of the backup surface for performing this backup while sliding the wiping member on the lower surface of the screen with the wiping member backed up by the backup member, and provided with the groove that is parallel to the suction region and provided on the backup surface of the backup member and partially releases the backup of the wiping member.

If this device is provided with: the elevation device for pressurizing the backup member against the printing screen on the cleaning head and releasing the pressurization; and the movement device for moving the cleaning head into or out of a position under the printing screen from the standby position beside the printing screen under the printing screen and reciprocally moving the head, then the aforementioned operation of repetitively performing the cleaning and getting ready for the next printing is executed through the movement under the screen every time the printing is performed once or every time the printing is performed a specified number of times or on each required occasion by putting the cleaning head in the standby position so as not to impede the printing of the printing paste onto the object to be printed by the printing screen in the screen printing apparatus, enabling the stable performance of high-accuracy printing to be guaranteed for a long term.

Furthermore, if the above-mentioned device is provided with the supply section for feeding and supplying the wiping member and the unwinding section for unwinding the wiping member, then the cleaning can be performed with a new wiping member every time by unwinding the wiping member by the unwinding section in accordance with the feed and supply of the wiping member from the supply section every time the cleaning ends once, enabling the aforementioned characteristic cleaning function to be stably maintained.

If the suction ports are arranged in an array in the direction roughly perpendicular to the sliding direction in each device, the suction force is increased by reducing the size of individual suction port to increase the suction efficiency while securing the required amount of total suction air in terms of the total opening area, and the cleaning function by suction can be improved.

The aforementioned method and device employs the backup member, which is provided with the backup surface for backing up the wiping member to bring the member in contact with the printing screen, the suction region that has the suction port on the backup surface and is provided in the direction roughly perpendicular to the sliding direction, and the groove extended parallel to this suction region.

As concrete representative examples, there are enumerated the backup member characterized by the provision of the backup surface for backing up the wiping member to make the member slide on the printing screen, the suction region that has the suction port on the backup surface and is provided in the direction roughly perpendicular to the sliding direction and one or a plurality of grooves that are provided on one side of this suction region and extended parallel to the suction region;

the backup member characterized by the provision of the backup surface for backing up the wiping member to make the member slide on the printing screen, the suction region that has the suction port on the backup surface and is provided in the direction roughly perpendicular to the sliding direction, and one or a plurality of grooves that are provided on each of both sides of this suction region and extended parallel to the suction region;

the backup member characterized by the provision of the backup surface for backing up the wiping member to make the member slide on the printing screen, the two suction regions that have the suction port on the backup surface and are provided in the direction roughly perpendicular to the sliding direction and one or a plurality of grooves that are provided on each of both sides of the portion where these two suction regions are extended and arranged parallel to the suction regions; and the backup member characterized by the provision of the backup surface for backing up the wiping member to make the member slide on the printing screen, the two suction regions that have the suction port on the backup surface and is provided in the direction roughly perpendicular to the sliding direction and one or a plurality of grooves that are provided in positions located adjacently on each of both sides of the portion where these two suction regions are arranged, provided between the two suction regions and arranged parallel to the suction regions.

The above-mentioned members are each suitable in terms of the suction efficiency since the suction ports are provided in an array in the direction perpendicular to the sliding direction.

The printing screen cleaning method of the present invention has another feature that, based on a printing screen cleaning method for cleaning the printing screen by sucking the printing paste that is stuck to the lower surface of the printing screen and staying in the printing paste supply section to the wiping member side to stick and keep the paste by sucking the paste via the wiping member through the suction port provided for the backup member while wiping the printing paste stuck to the lower surface by sliding the wiping member on the lower surface of the printing screen for supplying the solder paste to the object to be printed through the printing paste supply section of the specified pattern with the wiping member backed up by the backup member, the cleaning is performed by continuously sucking the paste by the suction ports arranged parallel in the sliding direction.

According to the construction described above, in the cleaning of the printing screen similarly to the aforementioned previously proposed case in which the printing paste that is stuck to the lower surface of the printing screen and staying in the printing paste supply section is stuck and kept by suction to the wiping member side by wiping the paste by sliding the wiping member on the lower surface of the printing screen with the wiping member backed up by the backup member and sucking the paste via the wiping member through the suction port provided in the direction roughly perpendicular to the sliding direction, by accommodating and keeping a greater amount of solder paste in the plurality of pocket portions formed by the entry of the wiping member into the suction ports as a result of the plural pocket portions while sucking an increased amount of residual solder paste through the repetitive continuous suction by the plurality of suction ports as a result of the repetition, the cleaning effect can be improved, and high-performance printing can be guaranteed coping with the further increase in the cleaning speed.

As a printing screen cleaning device for achieving this method, it is sufficient to provide a device provided with the cleaning head for supplying the printing paste onto the object to be printed through the printing paste supply section of the specified pattern and sucking the paste via the wiping member through the suction port provided on the backup surface for performing the backup while sliding the wiping member on the lower surface of the printing screen with the wiping member backed up by the backup member, the backup surface having a plurality of suction ports arranged side by side in the sliding direction, and the plurality of suction ports performing continuous suction.

In this case, if a plurality of suction ports are provided in the suction region in the direction roughly perpendicular to the sliding direction and the suction ports, which are arranged parallel to the suction region and the suction area of which reduces stepwise on the backup surface of the backup member, then the suction, removal, and accommodation of the residual solder paste by the plurality of suction ports are achieved first at a great rate of removal by the suction ports of large suction port areas, and subsequently the suction, removal, and accommodation of the residual solder paste reduced in amount are achieved by the succeeding suction ports whose suction area is reduced without occupying a large space. Then, a higher cleaning effect can be produced.

The plurality of suction ports easily synergetically operate since the plurality of suction ports are arranged in proximity to each other, and this arrangement is suitable in terms of space saving.

If a plurality of suction ports are provided laterally symmetrically in the sliding direction, a stable cleaning effect of no difference between the forward sliding and the reverse sliding can be produced in performing the cleaning in the reciprocal sliding manner. When the suction area is reduced stepwise, the suction ports located on both sides are larger, and those located inside are smaller. Therefore, the cleaning is further performed with the suction area increased stepwise after the effective cleaning with the suction areas of the aforementioned dimensional relation, and therefore, the cleaning effect is further increased and stabilized.

For the wiping member backup member used for the aforementioned one method and the device for materializing the method, there is employed one constructed of the backup surface for backing up the wiping member and sliding the member on the printing screen and the suction region provided with the suction ports on this backup surface in the direction roughly perpendicular to the sliding direction, the plurality of suction ports being arranged parallel to the suction region and arranged side by side in the sliding direction.

As the representative examples of the member, there are enumerated the wiping member backup member of which the plurality of suction ports have suction areas reducing stepwise in the sliding direction;

the wiping member backup member of which the plurality of suction ports are arranged in proximity to each other; and the wiping member backup member of which the plurality of suction ports are arranged laterally symmetrically in the sliding direction.

By appropriately combining arbitrary embodiments of the aforementioned various embodiments, the effects owned by each of the embodiments can be produced.

It is to be noted that the sixth through eighth embodiments can also be applied to the solder paste printing method and apparatus that has the pressurizing member of the first through fifth embodiments and to a solder paste printing method and apparatus that has no pressurizing member.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A screen printing method for printing a printing paste on a board supported by a support base via a screen supported by a screen table section by means of a printing head section, comprising:

positioning the board on the support base in a specified position by supporting and positioning the board on the support base with the support base with the board loaded moved up and down with respect to a movable frame capable of moved up and down with respect to a table section, moving up the movable frame with respect to the table section roughly in synchronization with these operations, and horizontally moving the table section in a direction roughly perpendicular to a board loading and unloading direction;

making a recognition camera recognize a reference position mark preparatorily given to the board in accordance with a horizontal movement of the recognition camera in the board loading and unloading direction and a horizontal movement of the table section in a direction roughly perpendicular to the board loading and unloading direction; and performing relative positional alignment of the board with the screen by horizontally moving the table section in a direction roughly perpendicular to the board loading and unloading direction on a basis of a position of the reference position mark recognized by the recognition camera, moving the screen table section that supports the screen in the board loading and unloading direction, and rotating the screen table section within a horizontal plane roughly parallel to the board on the support base.

2. A screen printing method as claimed in claim 1, wherein the board on which the printing paste is not printed is loaded in the board loading and unloading direction onto the support base supported vertically movably by the movable frame vertically movable with respect to the table section, and the board on which the printing paste has already been printed is unloaded in the board loading and unloading direction roughly in synchronization with the board loading operation.

3. A screen printing method as claimed in claim 2, wherein the recognition camera further recognizes the reference position mark preparatorily given to the screen in accordance with the horizontal movement of the recognition camera in the board loading and unloading direction and in the direction roughly perpendicular to the board loading and unloading direction.

4. A screen printing method as claimed in claim 1, wherein the recognition camera further recognizes the reference position mark preparatorily given to the screen in accordance with the horizontal movement of the recognition camera in the board loading and unloading direction and in the direction roughly perpendicular to the board loading and unloading direction.

5. A screen printing apparatus for printing a printing paste on a board supported by a support base via a screen supported by a screen table section by means of a printing head section, comprising:

the screen table section that is horizontally movably supported by a device frame;

a table section horizontal movement device for horizontally moving a table section in the direction roughly perpendicular to the board loading and unloading direction;

a movable frame that is vertically movably supported by the table section;

the support base vertically movably supported by the movable frame;

a screen table section that is arranged above the support base and supports the screen;

a printing head section that is arranged above the screen table section and prints the printing paste on the board via the screen supported by the screen table section;

a board loading device that loads the board, on which the printing paste is not printed, onto the support base in the board loading and unloading direction;

a board unloading device that unloads the board, on which the printing paste has already been printed, on the support base in the board loading and unloading direction;

a movable frame elevation device that is provided in the table section and moves up and down the movable frame with respect to the table section;

a support base elevation device that is provided on the movable frame and moves up and down the support base with respect to the movable frame;

a board regulation device that positions the board on the support base;

a screen table section horizontal movement device that horizontally moves the screen table section in the board loading and unloading direction;

a screen table section rotation device that rotates the screen table section in the horizontal plane roughly parallel to the board supported on the support base;

a recognition camera that is provided horizontally movably in the board loading and unloading direction and in the direction roughly perpendicular to the board loading and unloading direction and is able to recognize a reference position marks preparatorily given to the board and the screen; and a control means for controlling said devices and the recognition camera, the control means executing roughly in synchronism the loading of the board onto the support base by the board loading device and the unloading of the board from the support base by the board unloading device in the board loading and unloading direction, the control means executing roughly in synchronism the support of the board on the support base in accordance with the elevating operation of the support base by the support base elevation device, positioning of the board on the support base by the board regulation device, upward movement of the movable frame by the movable frame elevation device, horizontal movement of the table section in the direction roughly perpendicular to the board loading and unloading direction by the table section horizontal movement device, and positioning of the board to a specified position where the reference position mark recognition is performed by the recognition camera in accordance with the upward movement of the movable frame and the horizontal movement of the table section, and the control means executing the relative positional alignment of the board with the screen by controlling roughly in synchronism the table section horizontal movement device, the screen table section horizontal movement device, and the screen table section rotation device on a basis of the positions of the respective reference position marks of the board and the screen recognized by the recognition camera.

6. A screen printing apparatus as claimed in claim 5, wherein the support base is vertically movably supported on a guide shaft fixed to the movable frame, the support base elevation device has on the movable frame a ball thread mechanism constructed of a ball thread shaft that has an outer peripheral surface on which a ball thread is formed and a ball thread nut that is provided on the support base and meshed with the ball thread shaft and a support base elevation motor that rotates the ball thread shaft of the ball thread mechanism, and the movable frame elevation device further has in the table section a ball thread mechanism constructed of a ball thread shaft commonly used for the support base elevation device and a ball thread nut that is meshed with the ball thread shaft and rotatably supported by the table section and a movable frame elevation motor that rotates the ball thread nut of the ball thread mechanism.

7. A screen printing apparatus as claimed in claim 6, comprising:

a board stopper that is provided on the support base while being able to advance and retreat and stops the board in a specified position on the support base by being engaged with a fore end portion of the board loaded onto the support base by the board loading device; and a board detection sensor that is provided for the board stopper and detects presence or absence of a board on the support base, the control means controlling the board loading device and the board unloading device on a basis of a board detection signal from the board detection sensor.

8. A screen printing apparatus as claimed in claim 5, comprising:

a board stopper that is provided on the support base while being able to advance and retreat and stops the board in a specified position on the support base by being engaged with a fore end portion of the board loaded onto the support base by the board loading device; and a board detection sensor that is provided for the board stopper and detects presence or absence of a board on the support base, the control means controlling the board loading device and the board unloading device on a basis of a board detection signal from the board detection sensor.

9. A screen printing apparatus as claimed in claim 8, wherein a cushioning member is provided on an engagement surface that belongs to the board stopper and is engaged with the board.

* * * * *